United States Patent
Kim et al.

(10) Patent No.: US 9,461,261 B2
(45) Date of Patent: Oct. 4, 2016

(54) ORGANIC COMPOUNDS AND ORGANIC LIGHT-EMITTING DEVICES INCLUDING THE SAME

(71) Applicant: SAMSUNG DISPLAY CO., LTD., Yongin, Gyeonggi-Do (KR)

(72) Inventors: Young-Kook Kim, Yongin (KR); Kwang-Hyun Kim, Yongin (KR); Eun-Young Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 279 days.

(21) Appl. No.: 14/190,070

(22) Filed: Feb. 25, 2014

(65) Prior Publication Data
US 2015/0090963 A1    Apr. 2, 2015

(30) Foreign Application Priority Data

Oct. 2, 2013 (KR) .................. 10-2013-0118121

(51) Int. Cl.
*H01L 51/00* (2006.01)
*H01L 51/50* (2006.01)

(52) U.S. Cl.
CPC ....... *H01L 51/5056* (2013.01); *H01L 51/0072* (2013.01); *H01L 51/0054* (2013.01); *H01L 51/0059* (2013.01); *H01L 51/5072* (2013.01)

(58) Field of Classification Search
None
See application file for complete search history.

(56) References Cited

U.S. PATENT DOCUMENTS

| 2003/0165715 A1 | 9/2003 | Yoon et al. |
| 2007/0200490 A1 | 8/2007 | Kawamura et al. |
| 2009/0149649 A1 | 6/2009 | Shin et al. |
| 2012/0193612 A1 | 8/2012 | Chun et al. |
| 2014/0361268 A1* | 12/2014 | Hwang ............. C07D 401/14 257/40 |

FOREIGN PATENT DOCUMENTS

| KR | 2003-0067773 A | 8/2003 |
| KR | 10-2007-0023676 A | 2/2007 |
| KR | 10-2009-0059849 A | 6/2009 |
| KR | 10-2010-0007617 A | 1/2010 |
| KR | 10-2010-0118690 A | 11/2010 |
| KR | 10-2012-0073144 A | 7/2012 |
| KR | 10-2013-0007511 A | 1/2013 |
| WO | WO 2010/126270 A1 | 11/2010 |

OTHER PUBLICATIONS

2009 Fall Assembly and Symposium, symposium; Oct. 8-9, 2009, Gwanju Institute of Science and Technology, Oryong Hall, vol. 34, No. 2; URL: http://www.sigmaaldrich.com/catalog/search?interface=All&term=4H- Benzo%5Bdef%5Dcarbazole&lang=ko&region=KR&focus=product&N=0+220003048+219853163+2I9853286&mode=match%20partialmax, 1 page.

* cited by examiner

*Primary Examiner* — J. L. Yang
(74) *Attorney, Agent, or Firm* — Lewis Roca Rothgerber Christie LLP

(57) ABSTRACT

An organic compound represented by Formula 1 is disclosed. An organic light-emitting device including the organic compound is also disclosed.

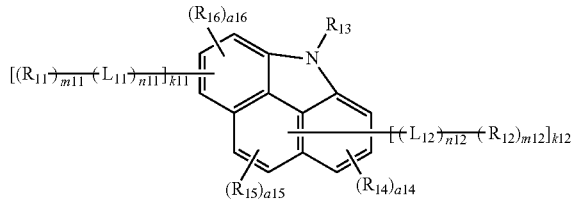

Formula 1

20 Claims, 1 Drawing Sheet

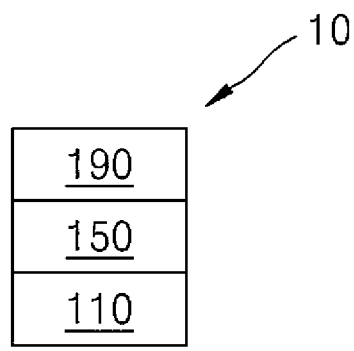

ORGANIC COMPOUNDS AND ORGANIC LIGHT-EMITTING DEVICES INCLUDING THE SAME

CROSS-REFERENCE TO RELATED APPLICATION

This application claims priority to and the benefit of Korean Patent Application No. 10-2013-0118121, filed on Oct. 2, 2013, in the Korean Intellectual Property Office, the entire content of which is incorporated herein by reference.

BACKGROUND

1. Field

One or more aspects according to embodiments of the present disclosure relate to organic compounds and organic light-emitting devices including the same.

2. Description of the Related Art

Organic light emitting devices are self-emission devices that have wide viewing angles, high contrast ratios, and short response times, and have excellent brightness, driving voltage, and response speed characteristics, and that produce full-color images.

An organic light-emitting device may include a first electrode on a substrate, and a hole transport region, an emission layer, an electron transport region, and a second electrode on the first electrode in that order. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons transition from an excited state to a ground state, thereby generating light.

SUMMARY

One or more aspects according to embodiments of the present disclosure relate to organic compounds and organic light-emitting devices including the same.

An embodiment of the present disclosure provides an organic compound represented by Formula 1 below:

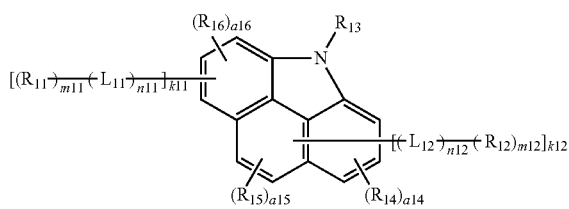

Formula 1 wherein Formula 1:

$L_{11}$ and $L_{12}$ are each independently selected from:

a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, and a substituted or unsubstituted non-aromatic condensed polycyclic group, where:

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, and the substituted non-aromatic condensed polycyclic group is selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group; and a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

n11 and n12 are each independently an integer of 0 to 3;

$R_{11}$ and $R_{12}$ are each independently a substituted or unsubstituted benzimidazole, where at least one substituent of the substituted benzimidazole is selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, and —Si(Q$_1$)(Q$_2$)(Q$_3$), a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, and a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, non-aromatic condensed polycyclic group, and —Si($Q_{11}$)($Q_{21}$)($Q_{31}$);

m11 and m12 are each independently an integer of 1 to 3;

k11 and k12 are each independently an integer of 0 to 4, and the sum of k11 and k12 is 1 or more;

$R_{13}$ to $R_{16}$ are each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $_2$-$C_{60}$ alkynyl group, a $C_1$-$C_{60}$ alkoxy group, and —Si($Q_4$)($Q_5$)($Q_6$);

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group; and a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ haloalkyl group, a $C_2$-$C_{60}$ alkenyl group, a $C_2$-$C_{60}$ alkynyl group, a $C_1$-$C_{60}$ alkoxy group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, and —Si($Q_{41}$)($Q_{51}$)($Q_{61}$), where $Q_1$ to $Q_6$, $Q_{11}$, $Q_{21}$, $Q_{31}$, $Q_{41}$, $Q_{51}$, and $Q_{61}$ are each independently selected from a $C_1$-$C_{60}$ alkyl group, a $C_6$-$C_{60}$ aryl group, and a $C_1$-$C_{60}$ heteroaryl group; and a14 to a16 are each independently an integer of 0 to 3.

According to another embodiment of the present disclosure, an organic light-emitting device includes: a first electrode; a second electrode facing the first electrode; and an organic layer between the first electrode and the second electrode and including an emission layer, where the organic layer includes at least one of the organic compounds described above.

BRIEF DESCRIPTION OF THE DRAWINGS

These and/or other aspects will become apparent and more readily appreciated by reference to the following description when considered together with the accompanying drawing, which is a schematic cross-sectional view of an organic light-emitting device according to an embodiment of the present disclosure.

DETAILED DESCRIPTION

Reference will now be made to certain embodiments, examples of which are illustrated in the accompanying drawing, where like reference numerals refer to like elements throughout. As those skilled in the art would recognize, the described embodiments may be embodied in many different forms and may have different forms and should not be construed as being limited to the descriptions set forth herein. Accordingly, the embodiments are described below, by referring to the FIGURES, merely to explain aspects of the present description. Expressions such as "at least one of," when preceding a list of elements, modify the entire list of elements and do not modify the individual elements of the list. Further, the use of "may" when describing embodiments of the present disclosure refers to "one or more embodiments of the present disclosure." Also, in the context of the present application, when a first element is referred to as being "on" a second element, it can be directly on the second element or be indirectly on the second element with one or more intervening elements therebetween.

According to an embodiment of the present disclosure, an organic compound is represented by Formula 1 below:

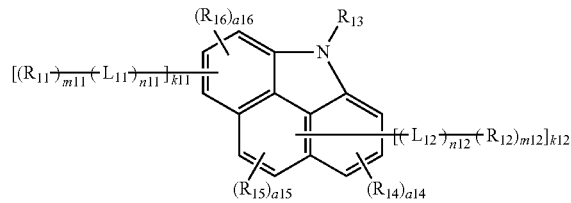

Formula 1

$L_{11}$ and $L_{12}$ in Formula 1 are each independently selected from:

a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, and a substituted or unsubstituted non-aromatic condensed polycyclic group, where:

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, and the substituted non-aromatic condensed polycyclic group is selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a C6-C60 arylthio group, a $C_1$-$C_{60}$ heteroaryl group, and a non-aromatic condensed polycyclic group; and a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group.

According to an embodiment of the present disclosure, $L_{11}$ and $L_{12}$ may be each independently selected from:

a phenylene, a pentalenylene, an indenylene, a naphthylene, an azulenylene, a heptalenylene, an indacenylene, an acenaphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, a pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzosilolylene; and a phenylene, a pentalenylene group, an indenylene, a naphthylene, an azulenylene, a heptalenylene, an indacenylene, an acenaphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, a pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, an isobenzothiazolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzoxilolylene, each substituted with at least one selected from a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a silolyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, a benzosilolyl group, an isobenzothiazolyl group, a benzooxazolyl group, an isobenzooxazolyl group, a triazolyl group, a tetrazole group, an oxadiazolyl group, a triazinyl group, a dibenzofuranyl group, a dibenzothienyl group, a benzocarbazolyl group, a dibenzocarbazolyl group, and a dibenzosilolyl group.

According to another embodiment of the present disclosure, $L_{11}$ and $L_{12}$ in Formula 1 may be each independently represented by one of Formulae 3-1 to 3-32 below:

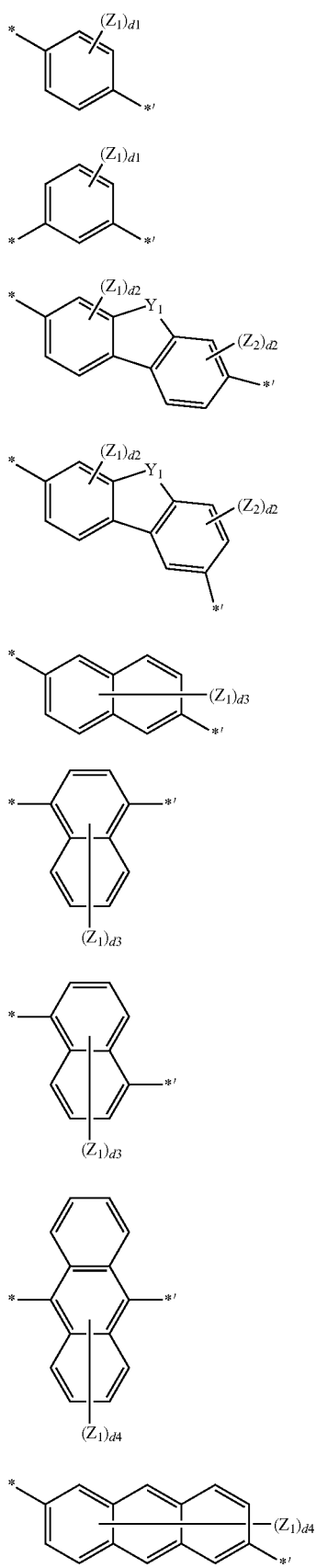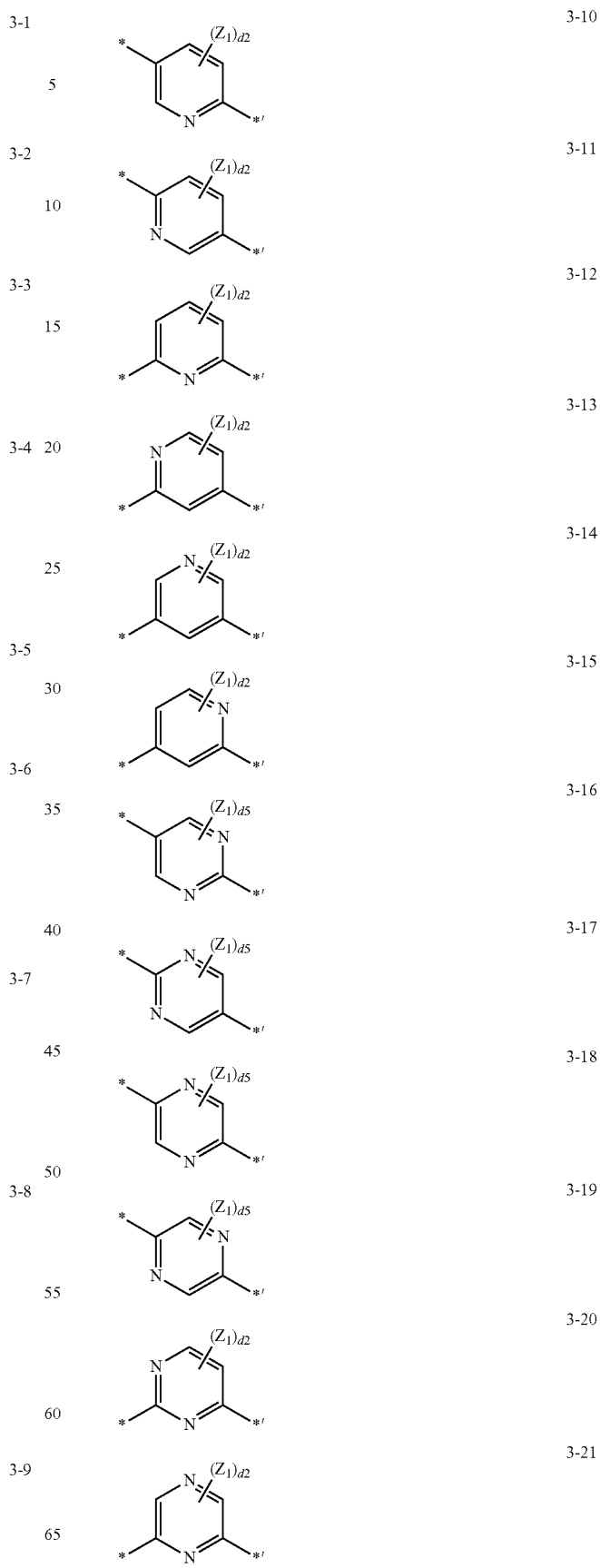

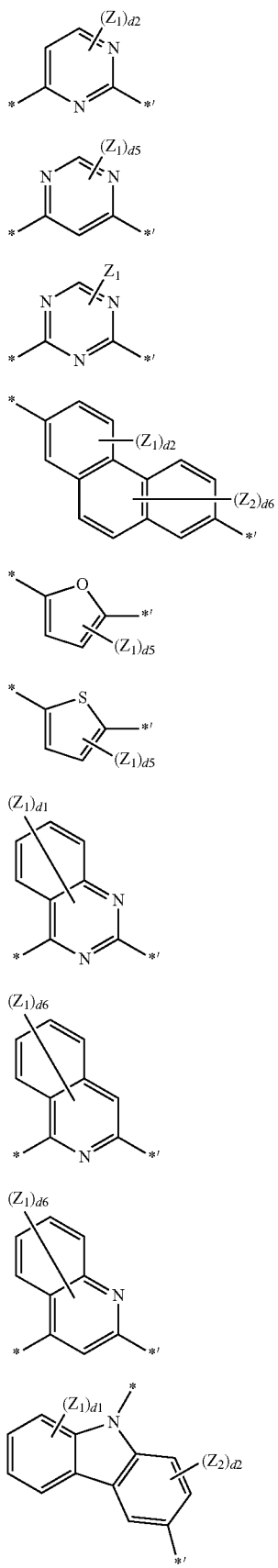

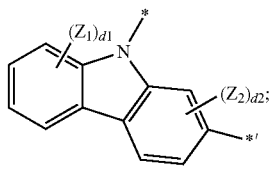

where in Formulae 3-1 to 3-32, $Y_1$ is selected from $C(Q_{31})(Q_{32})$, $N(Q_{33})$, an oxygen atom, a sulfur atom, and $Si(Q_{34})(Q_{35})$;

$Q_{31}$ to $Q_{35}$ are each independently selected from a hydrogen atom, a deuterium atom, a $C_1$-$C_{20}$ alkyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$Z_1$ and $Z_2$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, d1 is an integer selected from (e.g., an integer of) 1 to 4;
d2 is an integer selected from (e.g., an integer of) 1 to 3;
d3 is an integer selected from (e.g., an integer of) 1 to 6;
d4 is an integer selected from (e.g., an integer of) 1 to 8;
d5 is 1 or 2;
d6 is an integer selected from (e.g., of) 1 to 5; and * and *' each indicate a binding site to $R_{11}$, $R_{12}$ or benzocarbazole (e.g., 4H-benzo[def]carbazole) of Formula 1.

According to another embodiment of the present disclosure, $L_{11}$ and $L_{12}$ in Formula 1 may be each independently represented by one of Formulae 4-1 to 4-25 below:

4-1

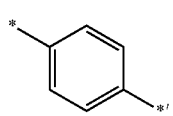

4-2

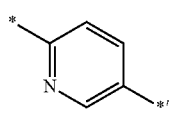

4-3

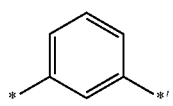

4-4

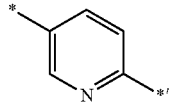

-continued
4-5 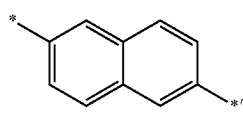
4-6 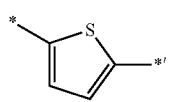
4-7 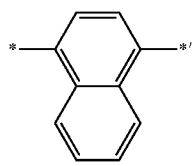
4-8 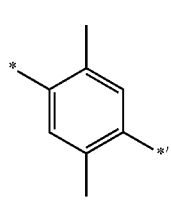
4-9 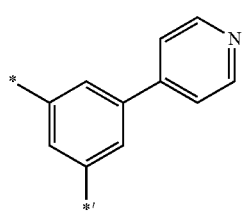
4-10 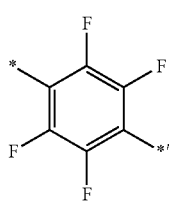
4-11 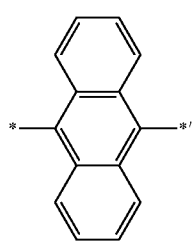
4-12 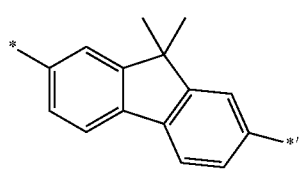
4-13 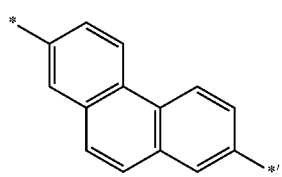
-continued
4-14 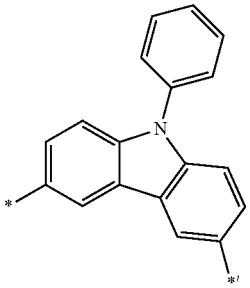
4-15 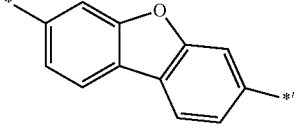
4-16 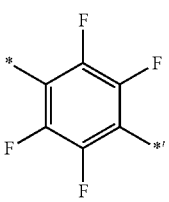
4-17 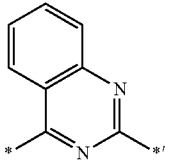
4-18 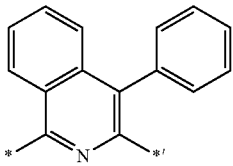
4-19 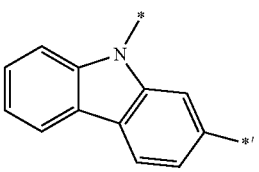
4-20 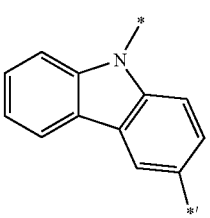
4-21

-continued

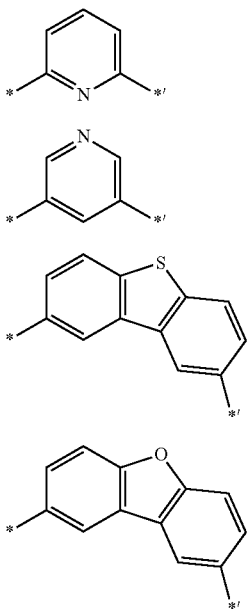

4-22

4-23

4-24

4-25 where * and *' each indicate a binding site to $R_{11}$, $R_{12}$ or benzocarbazole (e.g., 4H-benzo[def]carbazole) of Formula 1.

n11 in Formula 1 indicates the number of $L_{11}$ and may be selected from 0, 1, 2 and 3. For example, n11 may be 0 or 1, but is not limited thereto. When n11 in Formula 1 is 0, $-(L_{11})_{n11}$- is a single bond. When n11 is 2 or more, a plurality of $L_{11}$ may be identical or different.

n12 in Formula 1 indicates the number of $L_{12}$ and may be selected from 0, 1, 2 and 3. For example, n12 may be 0 or 1, but is not limited thereto. When n11 in Formula 1 is 0, $-(L_{12})_{n12}$- is a single bond. When n12 is 2 or more, a plurality of $L_{12}$ may be identical or different.

$R_{11}$ and $R_{12}$ in Formula 1 are each independently a substituted or unsubstituted benzimidazole;

at least one substituent of the substituted benzimidazole is selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $_2$-$C_{60}$ alkynyl group, a $C_1$-$C_{60}$ alkoxy group, and —Si(Q$_1$)(Q$_2$)(Q$_3$);

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group; and a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group; and a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, non-aromatic condensed polycyclic group, and —Si(Q$_{11}$)(Q$_{21}$)(Q$_{31}$); and $Q_1$ to $Q_3$, $Q_{11}$, $Q_{21}$, and $Q_{31}$ are each independently selected from a $C_1$-$C_{60}$ alkyl group, a $C_6$-$C_{60}$ aryl group, and a $C_1$-$C_{60}$ heteroaryl group.

In an embodiment of the present disclosure, $R_{11}$ and $R_{12}$ in Formula 1 are each independently selected from benzimidazole and a substituted benzimidazole; and at least one substituent of the substituted benzimidazole may be selected from a deuterium atom, a $C_1$-$C_{20}$ alkyl group, a $C_6$-$C_{60}$ aryl group, a $C_1$-$C_{60}$ heteroaryl group, and a non-aromatic condensed polycyclic group; and a $C_6$-$C_{60}$ aryl group, a $C_1$-$C_{60}$ heteroaryl group, and a non-aromatic condensed polycyclic group, each substituted with at least one selected from a deuterium atom, a halogen atom, a cyano group, a nitro group, a $C_6$-$C_{60}$ aryl group, a $C_1$-$C_{60}$ heteroaryl group, a non-aromatic condensed polycyclic group, and —Si(Q$_{11}$)(Q$_{21}$)(Q$_{31}$); and $Q_{11}$, $Q_{21}$, and $Q_{31}$ may be each independently a $C_1$-$C_{60}$ alkyl group, but $Q_{11}$, $Q_{21}$, and $Q_{31}$ are not limited thereto.

In another embodiment of the present disclosure, $R_{11}$ and $R_{12}$ in Formula 1 may be each independently represented by one of Formulae 2-1 to 2-3 below:

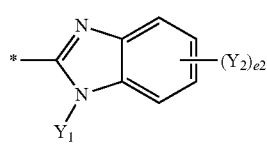

Formula 2-1

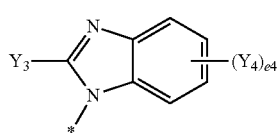

Formula 2-2

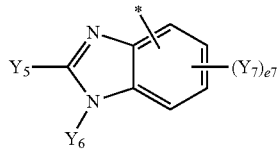

Formula 2-3 where in Formulae 2-1 to 2-3, $Y_1$ to $Y_7$ are each independently selected from:

a hydrogen atom, a deuterium atom, a $C_1$-$C_{20}$ alkyl group, a $C_6$-$C_{60}$ aryl group, a $C_1$-$C_{60}$ heteroaryl group, and a non-aromatic condensed polycyclic group; and a $C_6$-$C_{60}$ aryl group, a $C_1$-$C_{60}$ heteroaryl group, and a non-aromatic condensed polycyclic group, each substituted with at least one selected from a deuterium atom, a halogen atom, a cyano group, a nitro group, a $C_6$-$C_{60}$ aryl group, a $C_1$-$C_{60}$ heteroaryl group, a non-aromatic condensed polycyclic group, and —Si$(Q_{11})(Q_{21})(Q_{31})$; and $Q_{11}$) $Q_{21}$, and $Q_{31}$ may be each independently a $C_1$-$C_{60}$ alkyl group, e2 and e4 are each independently an integer of 1 to 4;

e7 is an integer of 1 to 3;

* indicates a binding site to $L_{11}$, $L_{12}$, or benzocarbazole (e.g., 4H-benzo[def]carbazole) in Formula 1.

In another embodiment of the present disclosure, $R_{11}$ and $R_{12}$ in Formula 1 may be each independently represented by one of Formulae 2-1 to 2-3 below, but are not limited thereto:

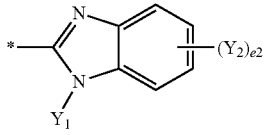

Formula 2-1

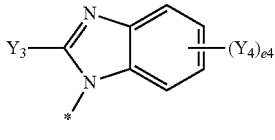

Formula 2-2

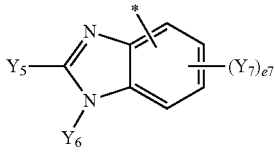

Formula 2-3 where in Formulae 2-1 to 2-3, $Y_1$ to $Y_7$ are each independently selected from:

a hydrogen atom, a deuterium atom, a methyl, an ethyl, an n-propyl, an iso-propyl, an n-butyl, a sec-butyl, an iso-butyl, a tert-butyl, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a cyano group, a nitro group, a phenyl group, a naphthyl group, a fluorenyl group, a pyridinyl group, a pyrazinyl group, a pyrimidinyl group, a pyridazinyl group, and —Si$(Q_{11})(Q_{21})(Q_{31})$;

$Q_{11}$, $Q_{21}$, and $Q_{31}$ are each independently selected from a methyl, an ethyl, an n-propyl, an iso-propyl, an n-butyl, a sec-butyl, an iso-butyl, and a tert-butyl;

e2 and e4 are each independently an integer of 1 to 4;

e7 is an integer of 1 to 3;

* indicates a binding site to $L_{11}$, $L_{12}$, or benzocarbazole (e.g., 4H-benzo[def]carbazole) in Formula 1.

m11 in Formula 1 indicates the number of $R_{11}$ (e.g., the number of $R_{11}$ groups) and may be an integer of 1 to 3. For example, m11 may be 1, but is not limited thereto. When m11 is an integer of 2 or more, a plurality of $R_{11}$ (e.g., each $R_{11}$) may be identical or different.

m12 in Formula 1 indicates the number of $R_{12}$ (e.g., the number of $R_{12}$ groups) and may be an integer of 1 to 3. For example, m12 may be 1, but is not limited thereto. When m12 is an integer of 2 or more, a plurality of $R_{12}$ (e.g., each $R_{12}$) may be identical or different.

k11 in Formula 1 may be an integer selected from (e.g., an integer of) 0 to 4. For example, k11 may be 0 or 1, but is not limited thereto. k12 in Formula 1 may be an integer selected from (e.g., an integer of) 0 to 4. For example, k12 may be 0 or 1, but is not limited thereto. The sum of k11 and k12 in Formula 1 may be 1 or more.

In an embodiment, k11 may be 1 and k12 may be 0, but k11 and k12 are not limited thereto.

In another embodiment, k11 may be 1 and k12 may be 1, but k11 and k12 are not limited thereto.

$R_{13}$ and $R_{16}$ in Formula 1 may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $_2$-$C_{60}$ alkynyl group, a $C_1$-$C_{60}$ alkoxy group, and —Si$(Q_4)(Q_5)(Q_6)$;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group; and a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a C6-C60 arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ haloalkyl group, a $C_2$-$C_{60}$ alkenyl group, a $C_2$-$C_{60}$ alkynyl group, a $C_1$-$C_{60}$ alkoxy group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, and —Si$(Q_{41})(Q_{51})(Q_{61})$;

$Q_4$ to $Q_6$, $Q_{41}$, $Q_{51}$, and $Q_{61}$ are each independently selected from a $C_1$-$C_{60}$ alkyl group, a $C_6$-$C_{60}$ aryl group, and a $C_1$-$C_{60}$ heteroaryl group.

In an embodiment of the present disclosure, $R_{13}$ in Formula 1 may be selected from:

a hydrogen atom, a deuterium atom, and a $C_1$-$C_{20}$ alkyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{41}$)($Q_{51}$)($Q_{61}$); and $Q_{41}$, $Q_{51}$, and $Q_{61}$ may be each independently a $C_1$-$C_{60}$ alkyl group, but $Q_{41}$, $Q_{51}$, and $Q_{61}$ are not limited thereto.

In another embodiment of the present disclosure, $R_{13}$ in Formula 1 may be selected from:

a hydrogen atom, a deuterium atom, a methyl, an ethyl, an n-propyl, an iso-propyl, an n-butyl, a sec-butyl, an iso-butyl, and a tert-butyl;

a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, and a triazinyl group; and a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, and a triazinyl group, each substituted with at least one selected from a deuterium atom, a halogen atom, a cyano group, a nitro group, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, carbazolyl, a triazinyl group, and —Si($Q_{41}$)($Q_{51}$)($Q_{61}$);

$Q_{41}$, $Q_{51}$, and $Q_{61}$ may be each independently selected from a methyl, an ethyl, an n-propyl, an iso-propyl, an n-butyl, a sec-butyl, an iso-butyl, and a tert-butyl, but $Q_{41}$, $Q_{51}$, and $Q_{61}$ are not limited thereto.

According to an embodiment of the present disclosure, $L_{14}$ to $L_{16}$ in Formula 1 may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and —Si($Q_4$)($Q_5$)($Q_6$);

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $Q_4$ to $Q_6$ may be each independently a $C_1$-$C_{60}$ alkyl group, but $Q_4$ to $Q_6$ are not limited thereto.

According to another embodiment of the present disclosure, $L_{14}$ to $L_{16}$ in Formula 1 may be each independently selected from:

a hydrogen atom, a deuterium atom, a halogen atom, a cyano group, a nitro group, a methyl, an ethyl, an n-propyl, an iso-propyl, an n-butyl, a sec-butyl, an iso-butyl, a tert-butyl, a methoxy, an ethoxy, a tert-butoxy, and —Si($Q_4$)($Q_5$)($Q_6$);

a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, and a triazinyl group; and a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, and a triazinyl group, each substituted with at least one selected from a deuterium atom, a halogen atom, a cyano group, a nitro group, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, carbazolyl, and a triazinyl group;

$Q_4$ to $Q_6$ may be each independently selected from a methyl, an ethyl, an n-propyl, an iso-propyl, an n-butyl, a sec-butyl, an iso-butyl, and a tert-butyl, but $Q_4$ to $Q_6$ are not limited thereto.

In another embodiment of the present disclosure, $R_{13}$ in Formula 1 may be selected from a hydrogen atom, a deuterium atom, a methyl, an ethyl, an n-propyl, an iso-propyl, an n-butyl, a sec-butyl, an iso-butyl, a tert-butyl, and Formulae 5-1 to 5-35;

$R_{14}$ to $R_{16}$ are each independently selected from:

a hydrogen atom, a deuterium atom, a halogen atom, a cyano group, a nitro group, a methyl, an ethyl, an n-propyl, an iso-propyl, an n-butyl, a sec-butyl, an iso-butyl, a tert-butyl, a methoxy, an ethoxy, a tert-butoxy, and Formulae 5-1 to 5-35:

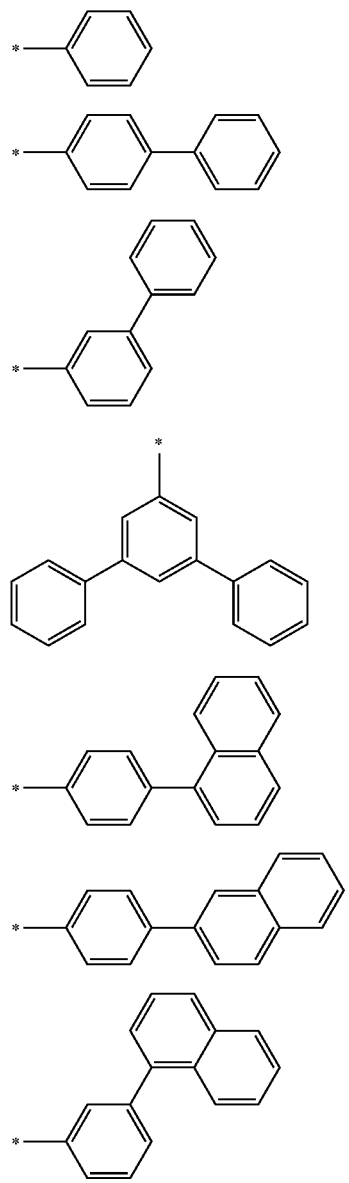

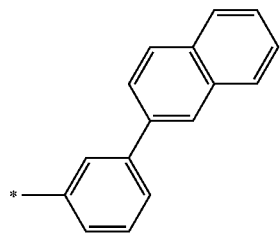

5-8

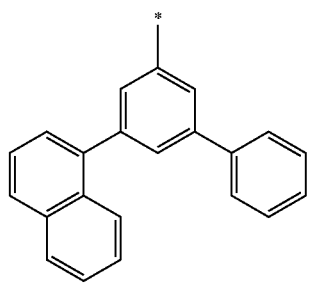

5-9

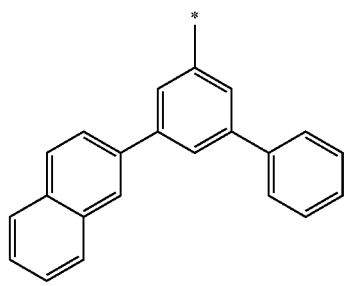

5-10

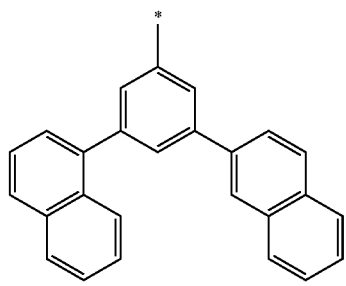

5-11

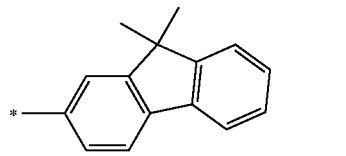

5-12

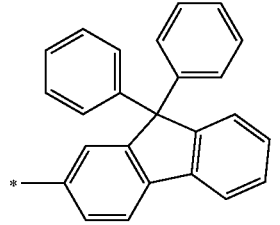

5-13

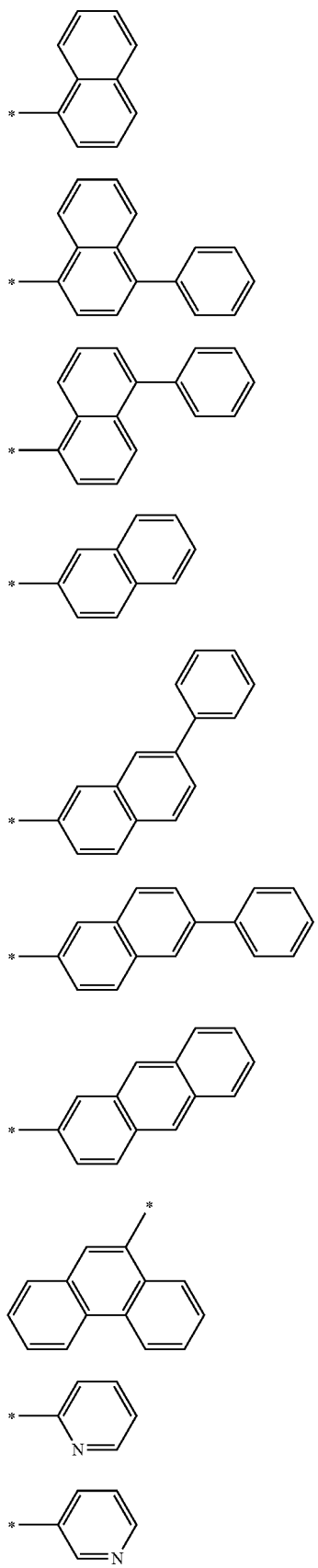
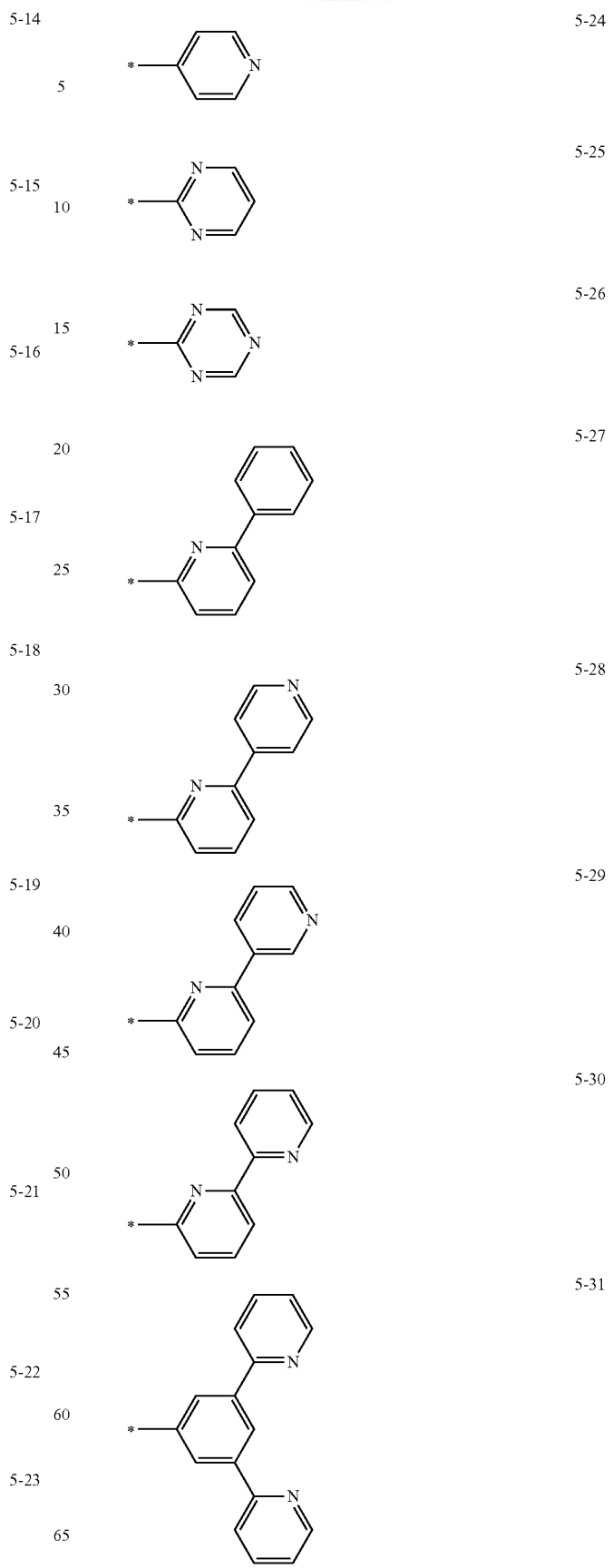

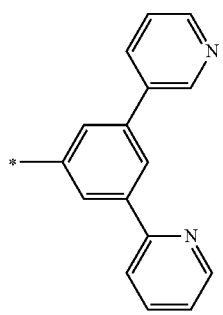
5-32
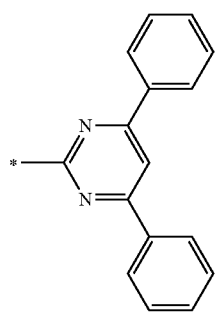
5-34
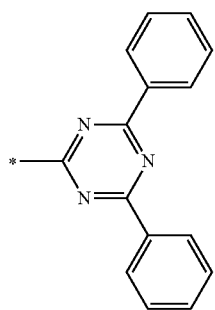
5-33
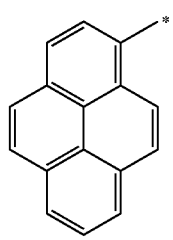
5-35
where * indicates a binding site to benzocarbazole (e.g., 4H-benzo[def]carbazole) of Formula 1.
For example, the organic compound represented by Formula 1 may be represented by one of Formulae 1-1 to 1-6 below, but the organic compound is not limited thereto:
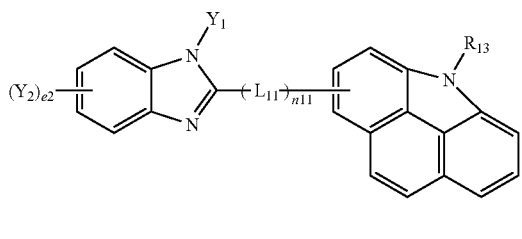
Formula 1-1
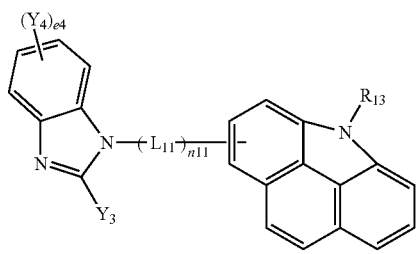
Formula 1-2
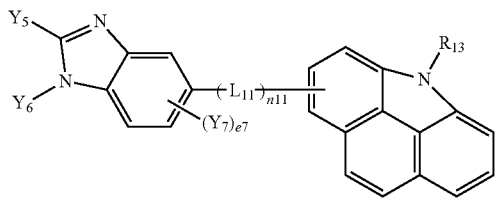
Formula 1-3
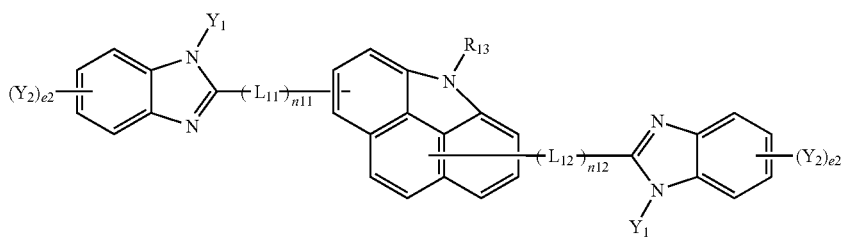
Formula 1-4

Formula 1-5

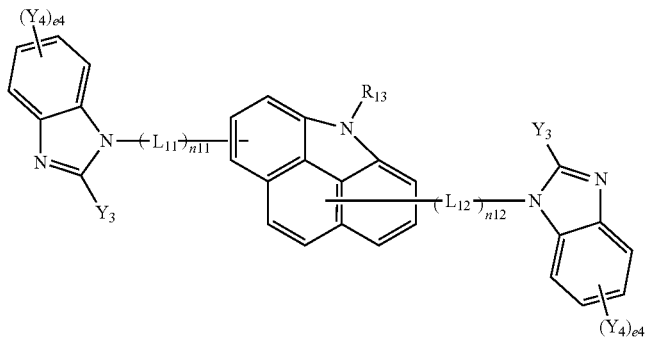

Formula 1-6

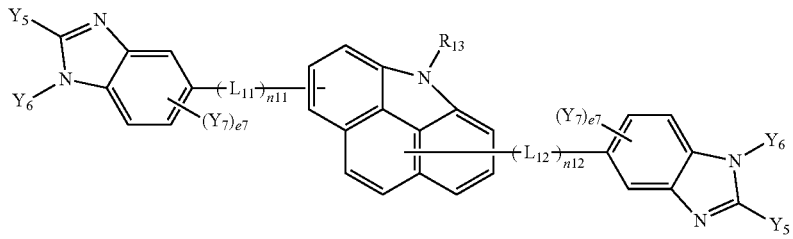

$L_{11}$, $L_{12}$, n11, n12, $R_{13}$, $Y_1$ to $Y_7$, e2, e4, and e7 in Formulae 1-1 to 1-6 being the same as those described above.

According to an embodiment of the present disclosure, the organic compound represented by Formula 1 may be represented by one of Formulae 1-1 to 1-6, and $L_{11}$ and $L_{12}$ in Formulae 1-1 to 1-6 are each independently represented by one of Formulae 4-1 to 4-25.

According to another embodiment of the present disclosure, the organic compound represented by Formula 1 may be represented by one of Formulae 1-1 to 1-6, and n11 and n12 in Formulae 1-1 to 1-6 may be each independently 0 or 1.

According to another embodiment of the present disclosure, the organic compound represented by Formula 1 may be represented by one of Formulae 1-1 to 1-6, and $R_{13}$ in Formula 1-1 to 1-6 may be selected from a hydrogen atom, a deuterium atom, a methyl, an ethyl, an n-propyl, an iso-propyl, an n-butyl, a sec-butyl, an iso-butyl, a tert-butyl, and Formulae 5-1 to 5-35.

For example, the organic compound represented by Formula 1 may be represented by one of Formulae 1-7 to 1-10 below, but the organic compound is not limited thereto:

Formula 1-7

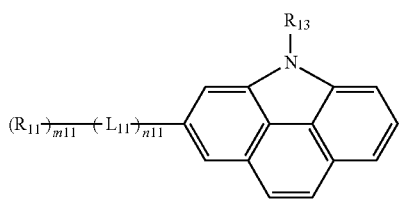

Formula 1-8

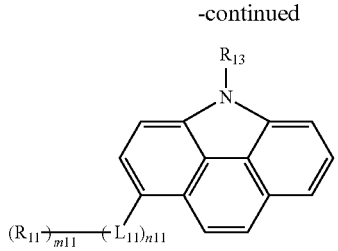

Formula 1-9

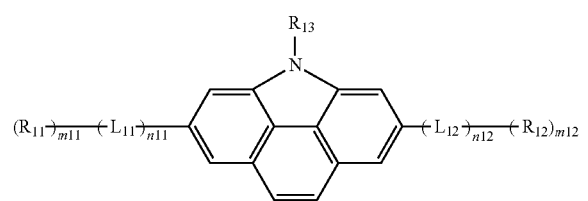

Formula 1-10

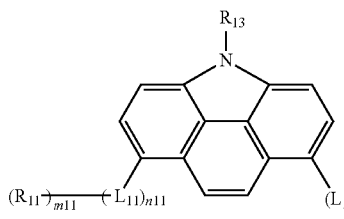

$L_{11}$, $L_{12}$, n11, n12, $R_{11}$, $R_{12}$, m11, m12, and $R_{13}$ in Formulae 1-7 to 1-10 being the same as those described above.

According to an embodiment of the present disclosure, the organic compound represented by Formula 1 may be represented by one of Formulae 1-7 to 1-10, and $L_{11}$ and $L_{12}$ in Formulae 1-7 to 1-10 are each independently represented by one of Formulae 4-1 to 4-25, $L_{11}$ and $L_{12}$ but are not limited thereto.

According to another embodiment of the present disclosure, the organic compound represented by Formula 1 may be represented by one of Formulae 1-7 to 1-10, and n11 and n12 in Formulae 1-7 to 1-10 may be each independently 0 or 1, but n11 and n12 are not limited thereto.

According to an embodiment of the present disclosure, the organic compound represented by Formula 1 may be represented by one of Formulae 1-7 to 1-10, and $R_{11}$ and $R_{12}$ in Formulae 1-7 to 1-10 are each independently represented by one of Formulae 2-1 to 2-3, but $R_{11}$ and $R_{12}$ are not limited thereto.

According to another embodiment of the present disclosure, the organic compound represented by Formula 1 may be represented by one of Formulae 1-7 to 1-10, and m11 and m12 in Formulae 1-7 to 1-10 may be each independently 1, but m11 and m12 are not limited thereto.

According to another embodiment of the present disclosure, the organic compound represented by Formula 1 may be represented by one of Formulae 1-7 to 1-10, and $R_{13}$ in Formula 1-7 to 1-10 may be selected from a hydrogen atom, a deuterium atom, a methyl, an ethyl, an n-propyl, an iso-propyl, an n-butyl, a sec-butyl, an iso-butyl, a tert-butyl, and Formulae 5-1 to 5-35.

The organic compound represented by Formula 1 may be one of Compounds 1 to 81 below, but the organic compound is not limited thereto:

1

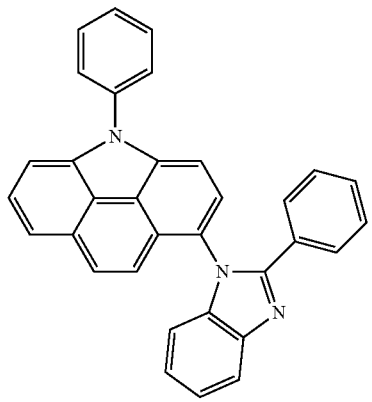

2

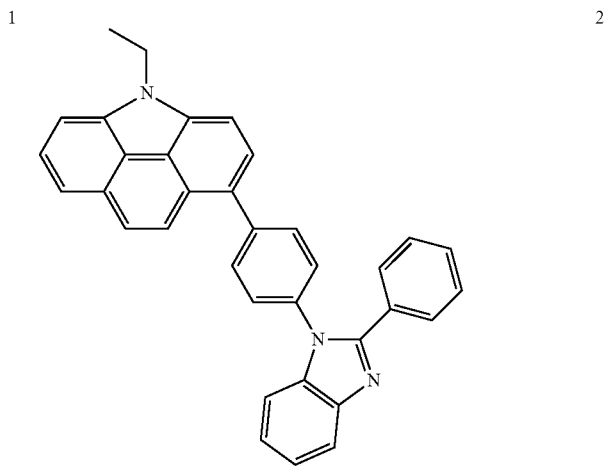

3

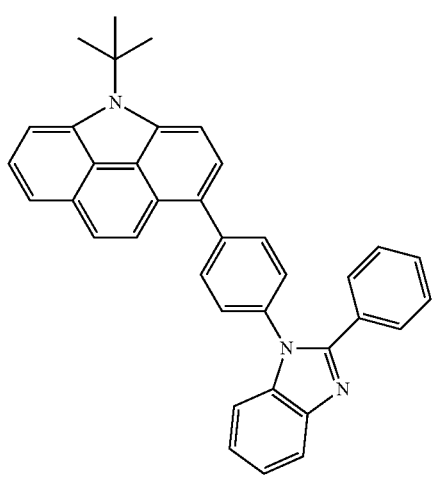

4

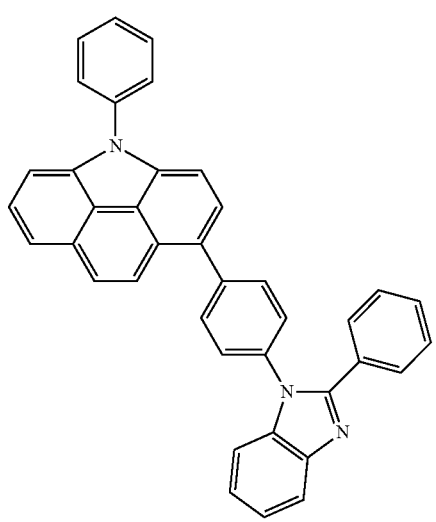

-continued
5
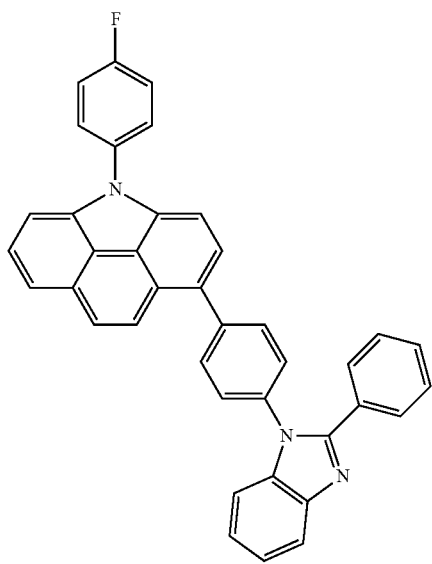
6
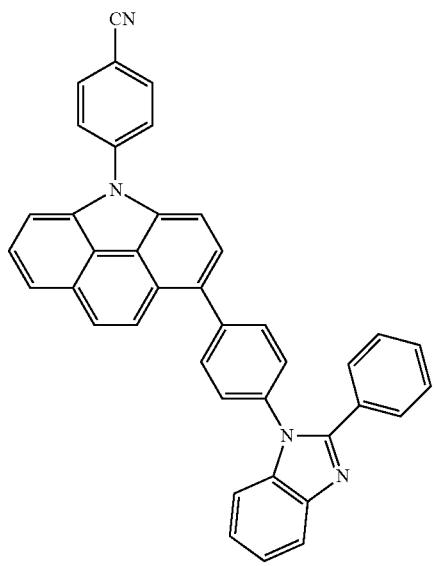
7
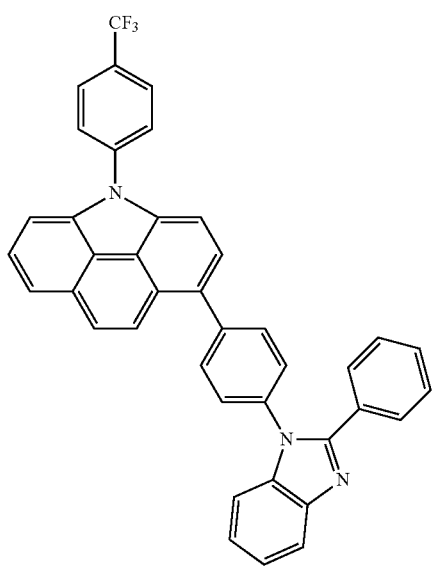
8
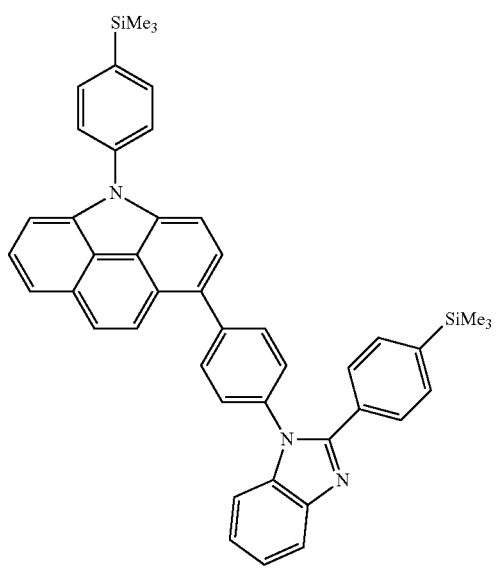

-continued
9
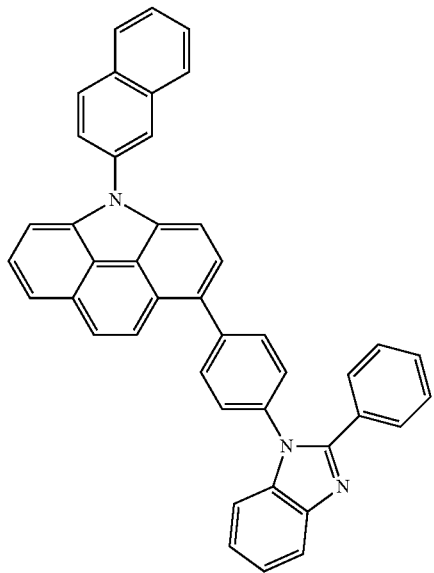
10
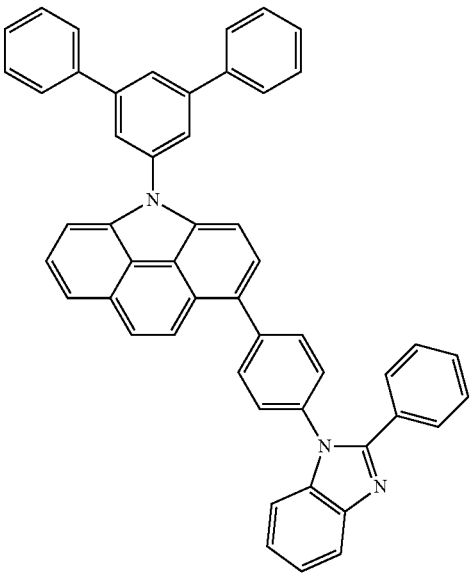
11
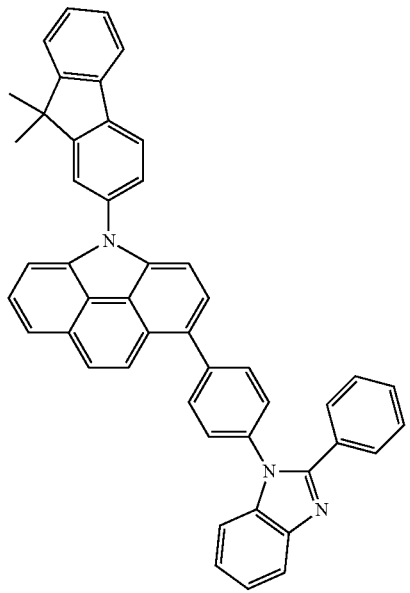
12
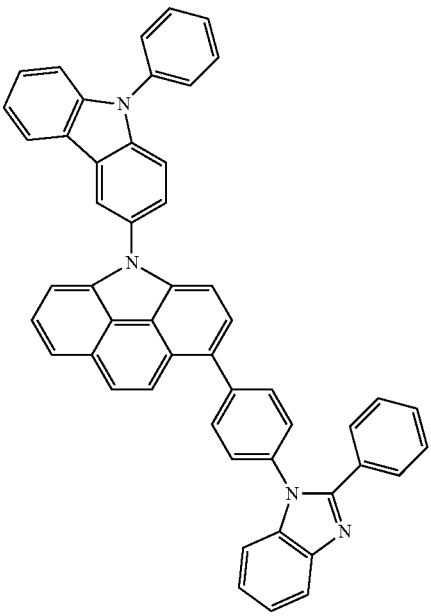

-continued
13
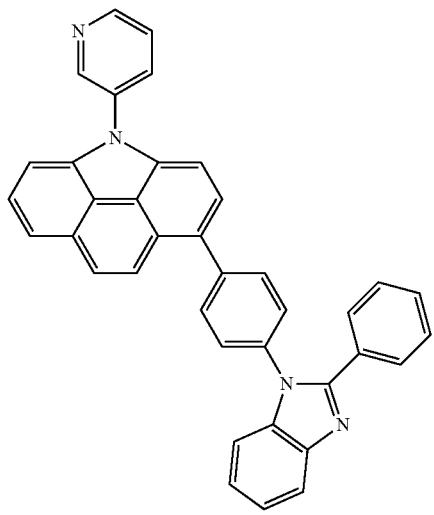
14
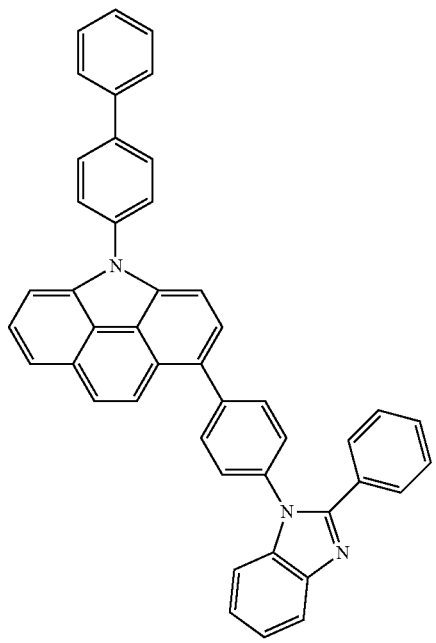
15
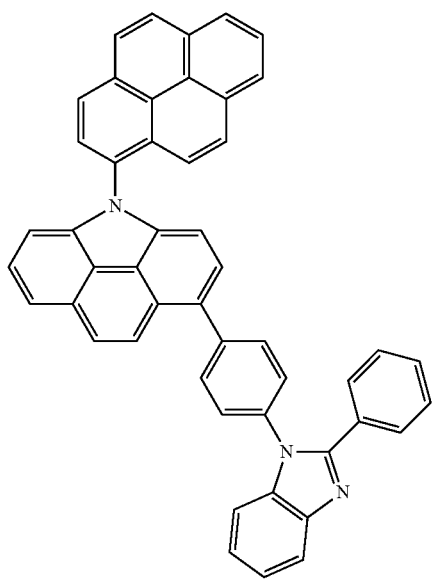
16
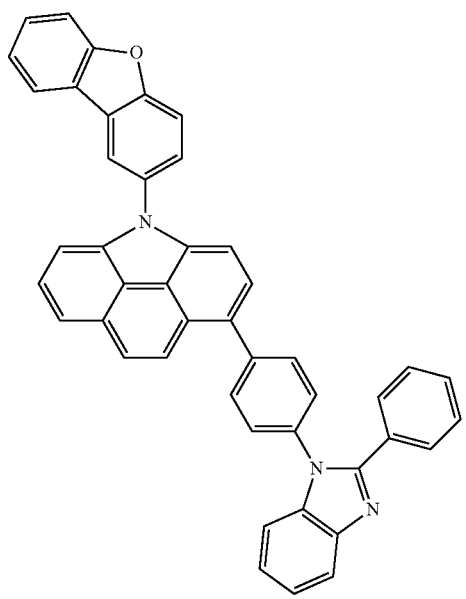

-continued
17
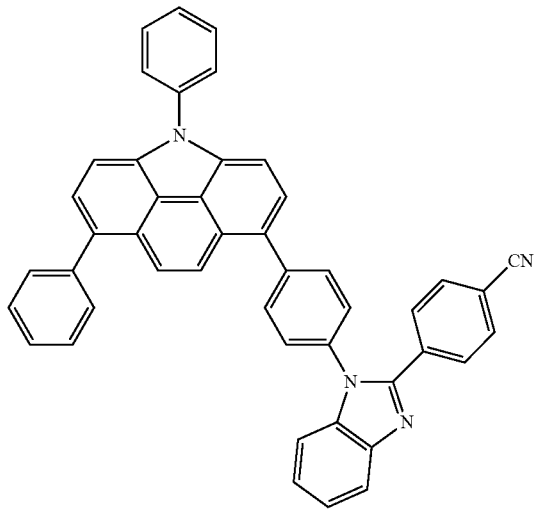
18
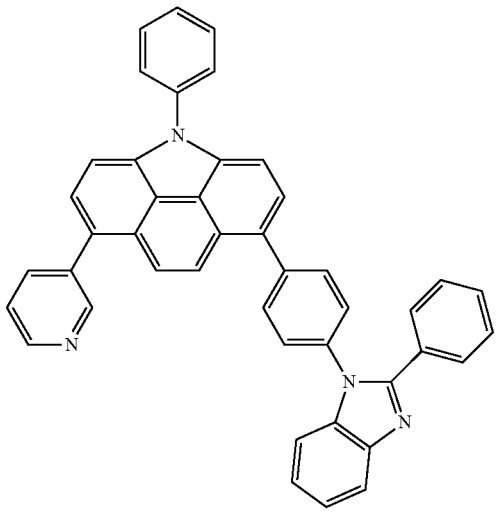
19
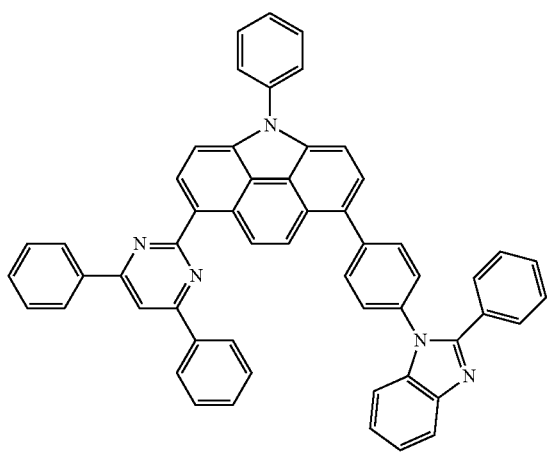
20
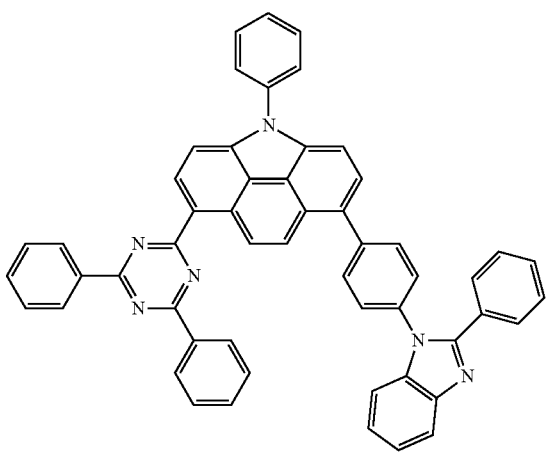
21
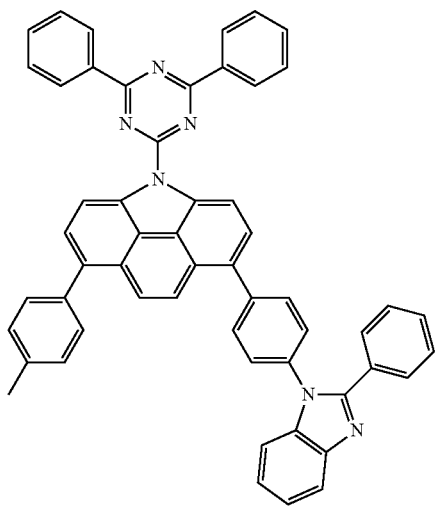
22
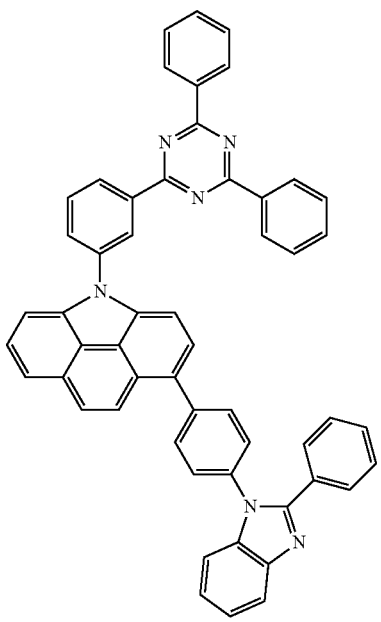

-continued
23
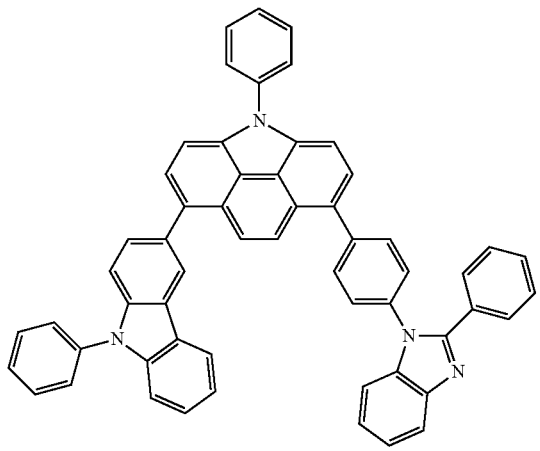
24
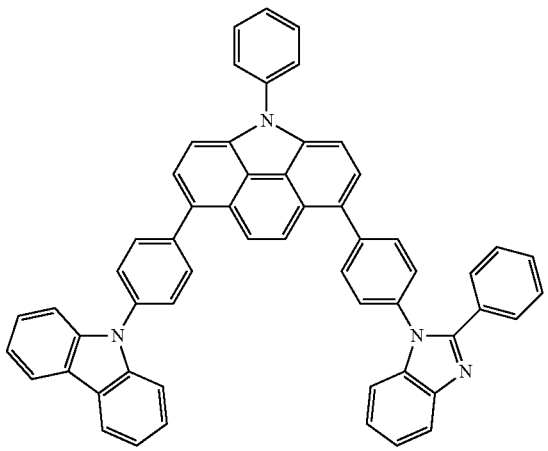
25
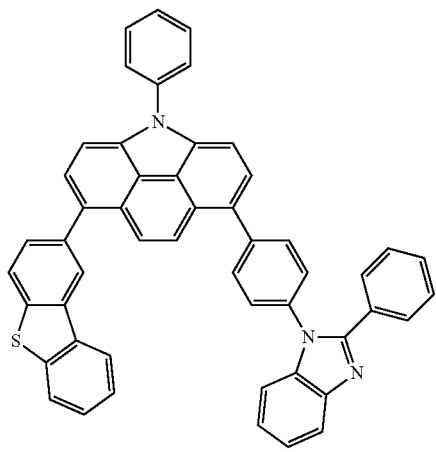
26
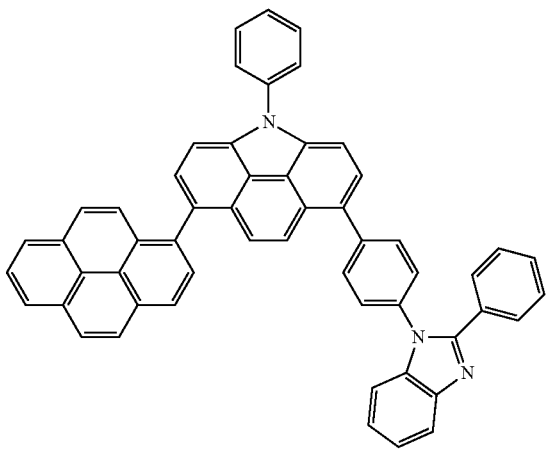
27
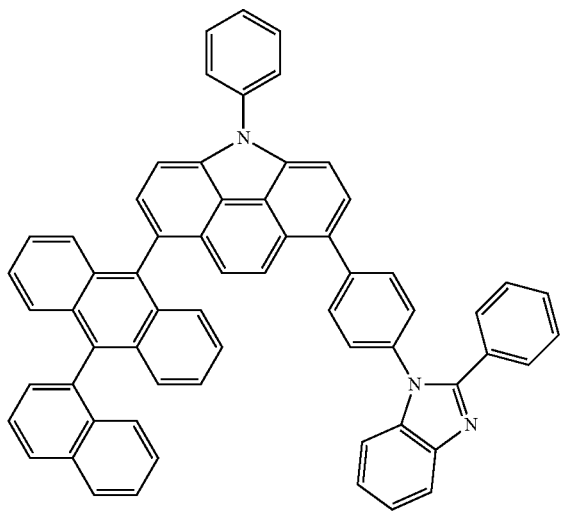
28
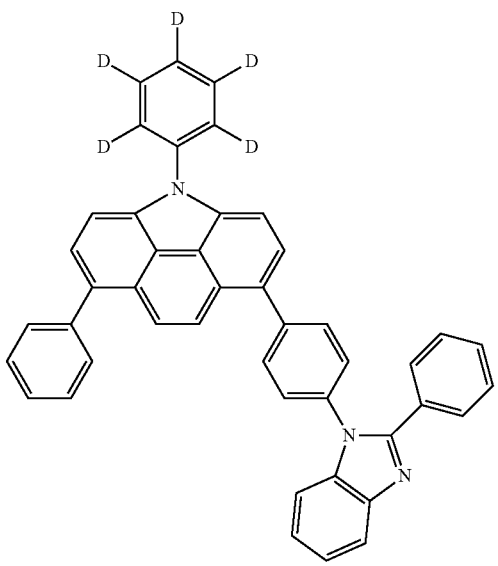

-continued
29
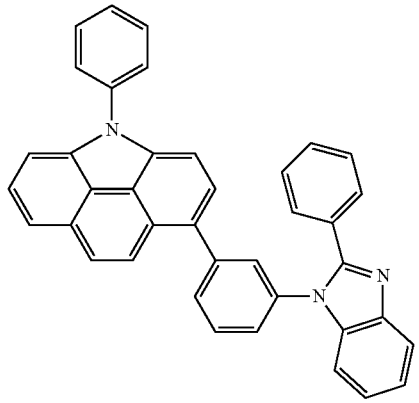
30
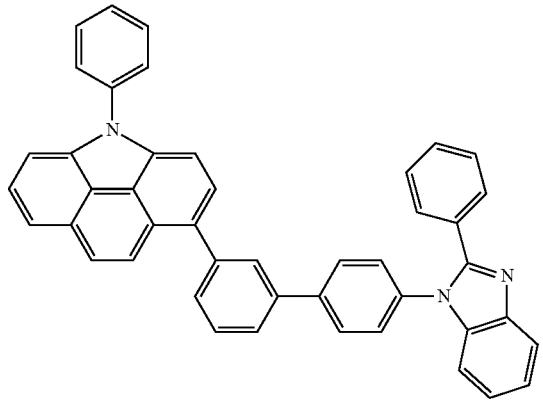
31
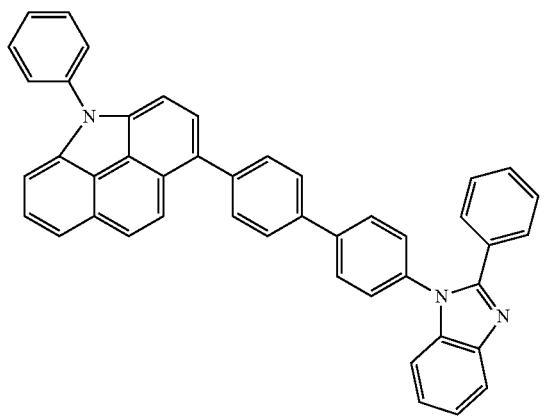
32
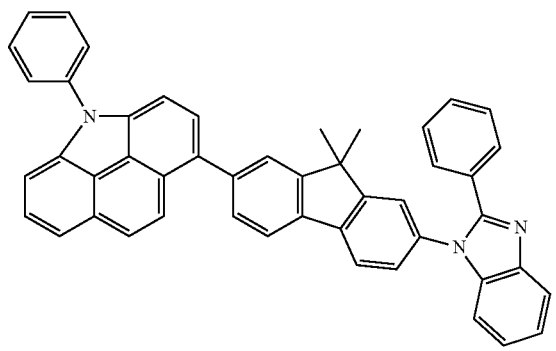
33
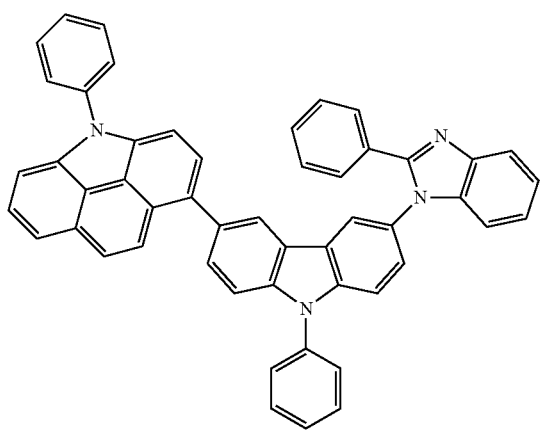
34
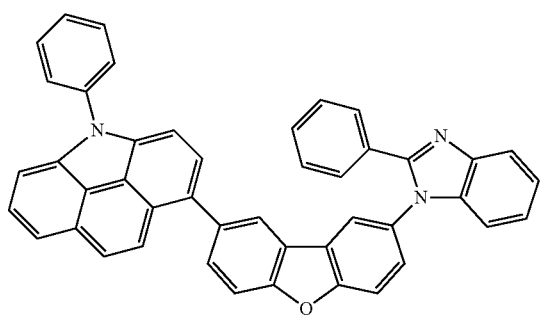

-continued
35
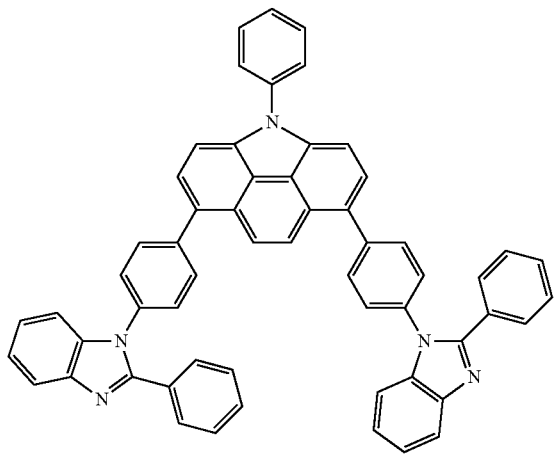
36
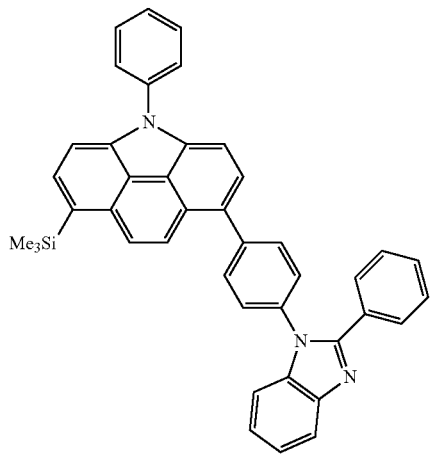
37
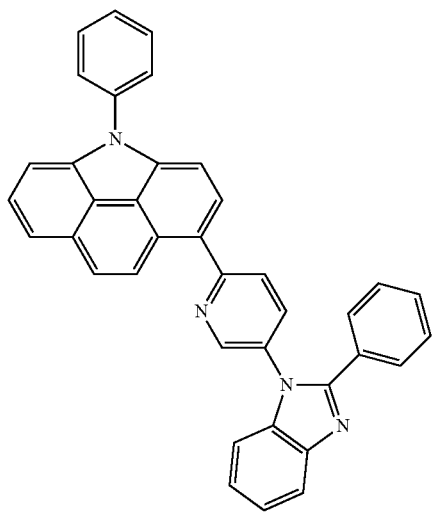
38
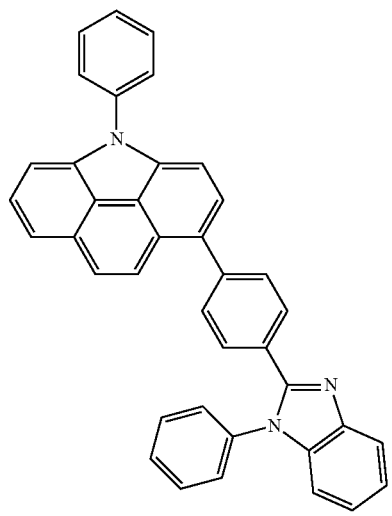
39
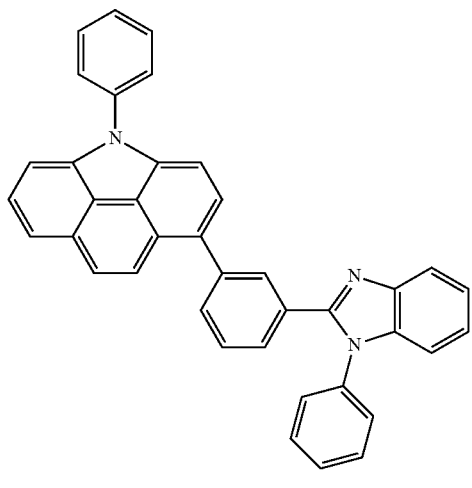
40
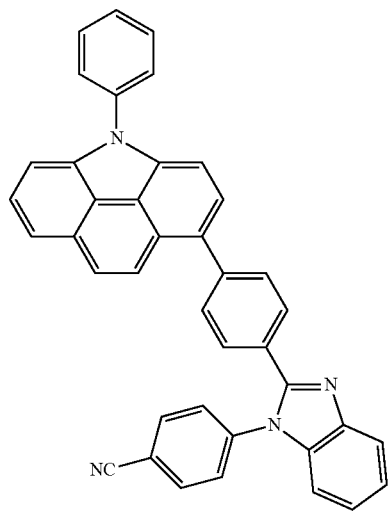

-continued
41
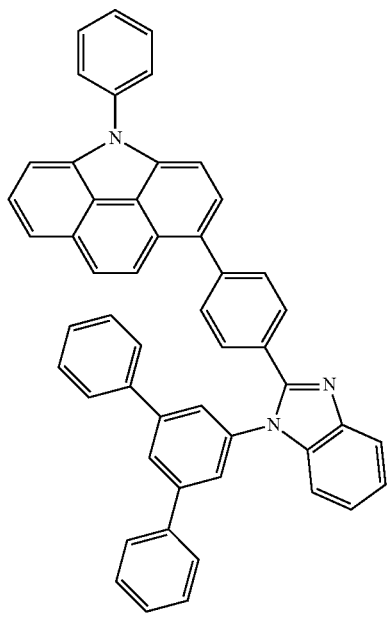
42
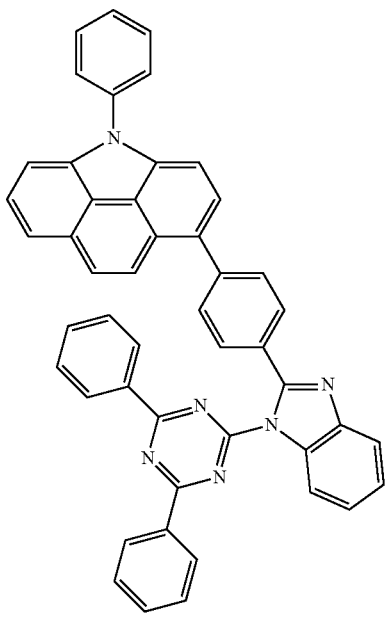
43
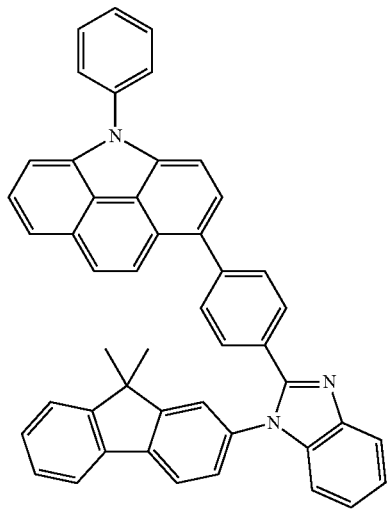
44
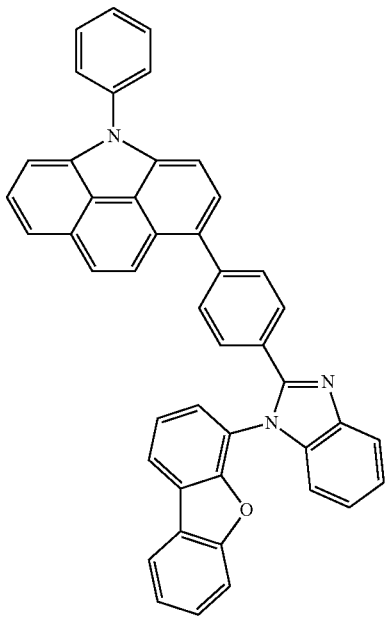

-continued
45
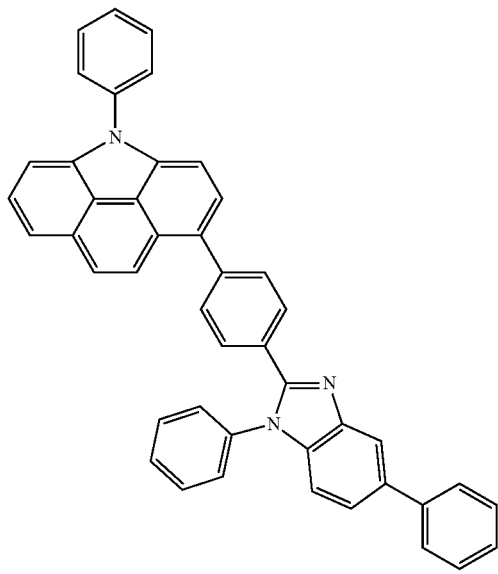
46
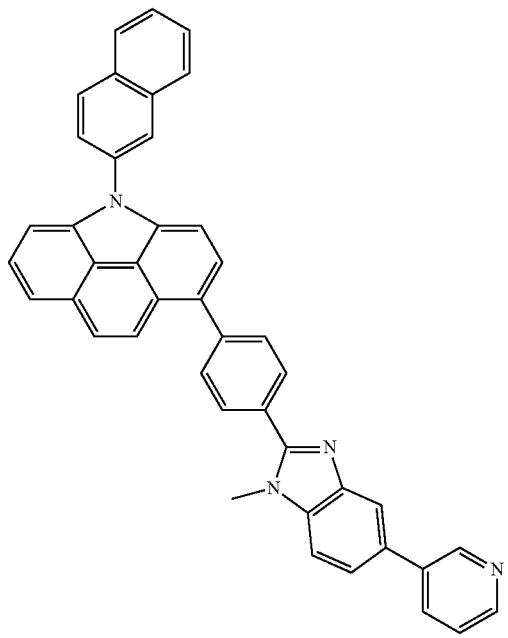
47
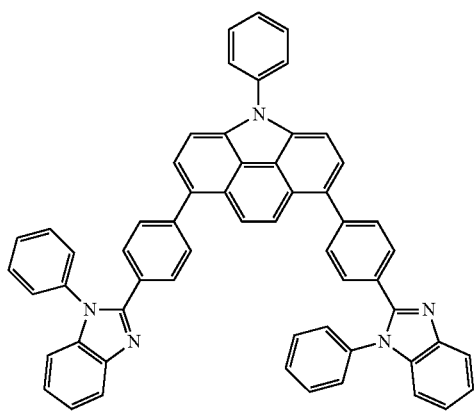
48
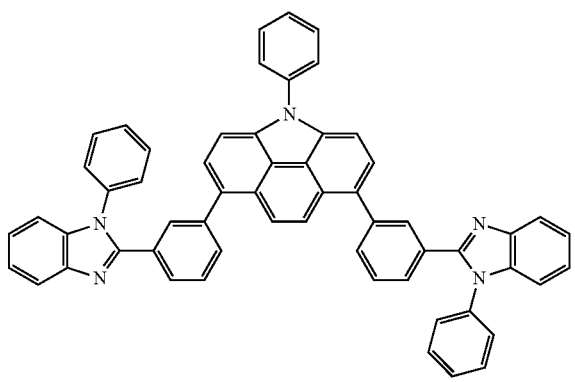
49
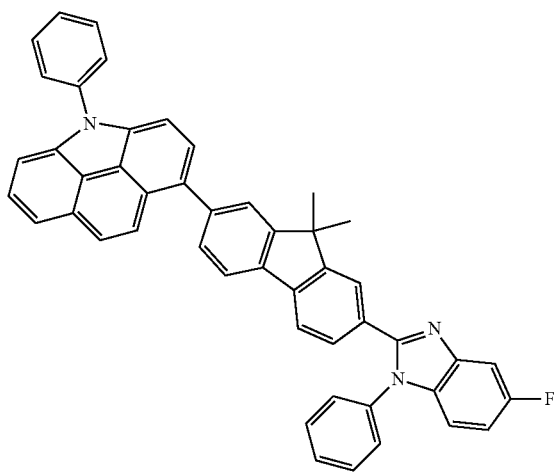
50
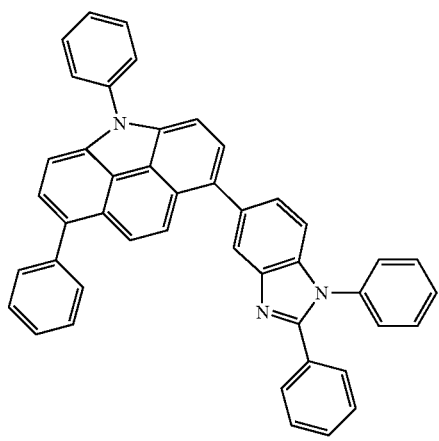

-continued
51
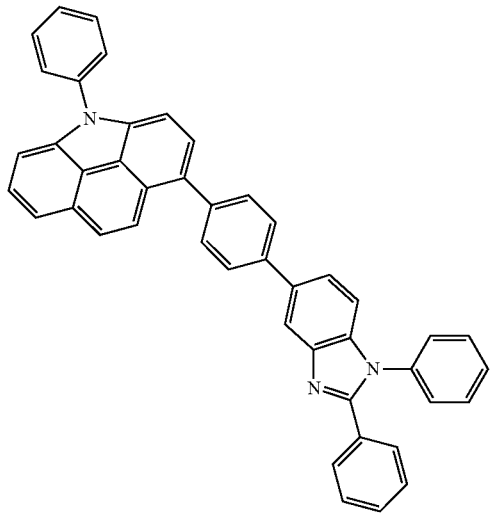
52
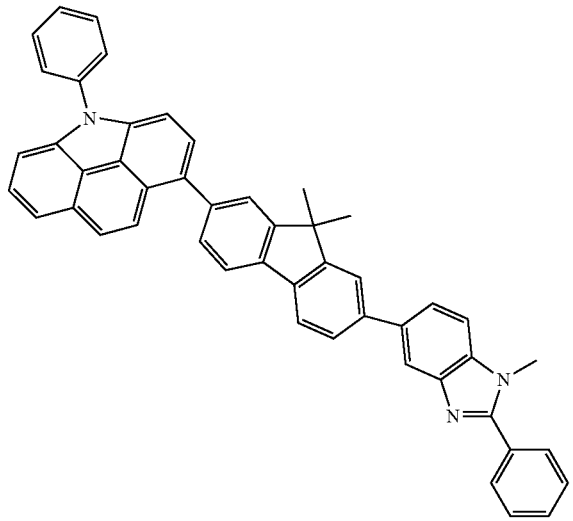
53
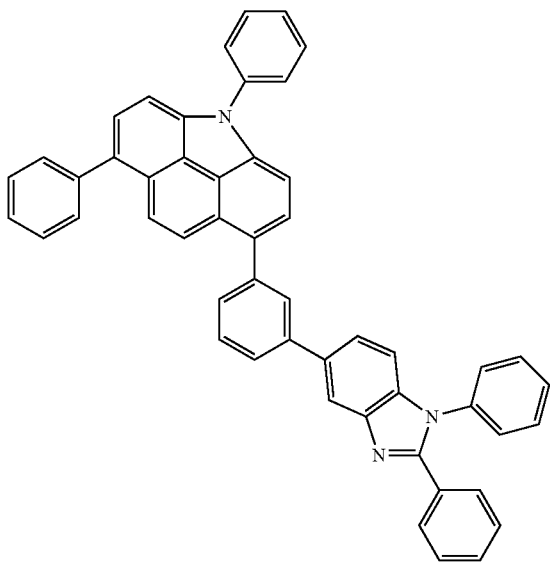
54
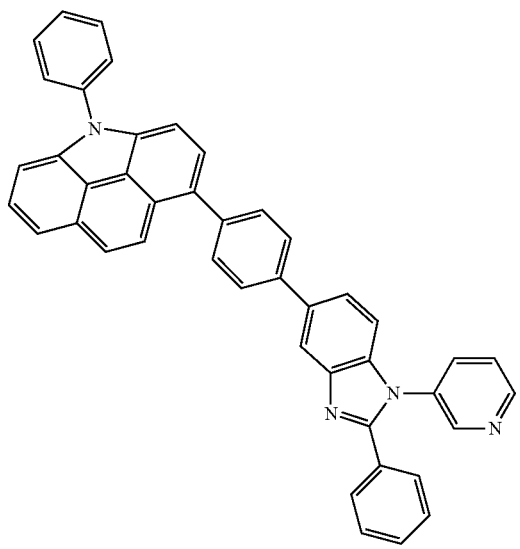

-continued
55
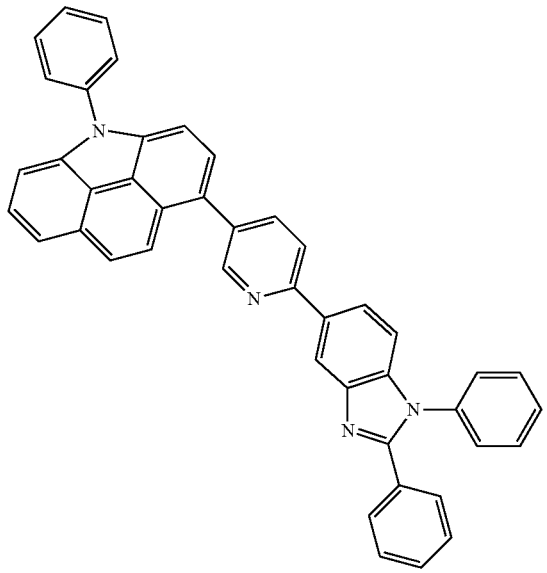
56
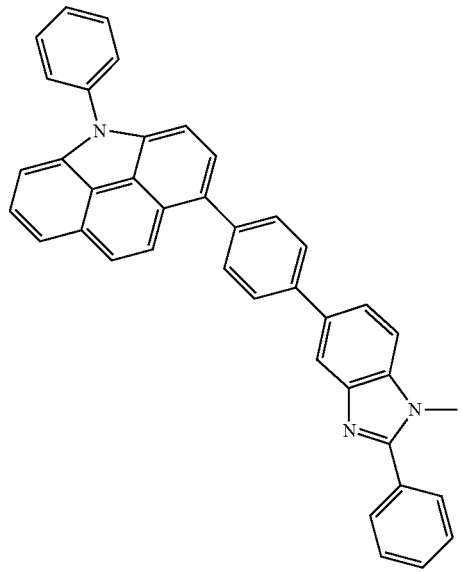
57
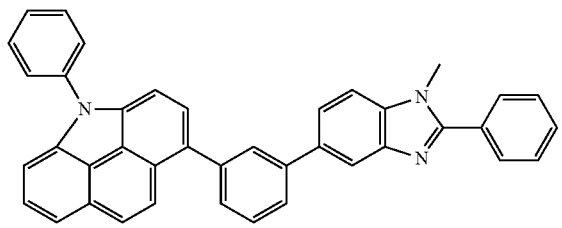
58
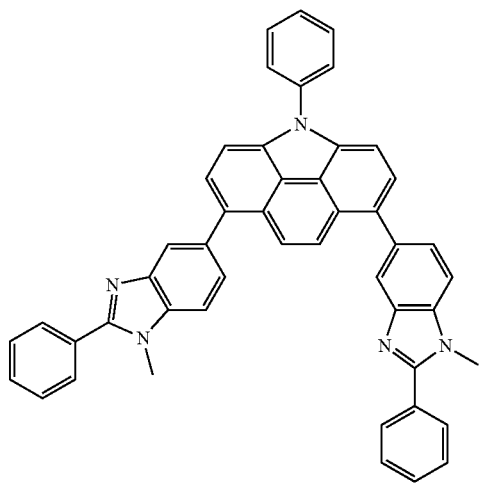
59
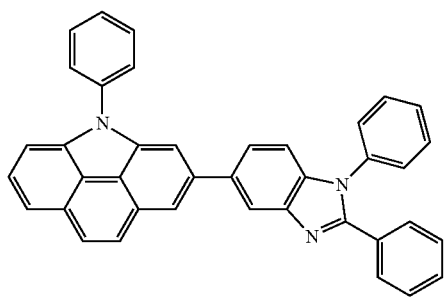
60
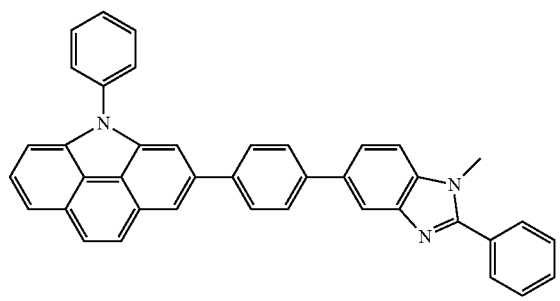

-continued
61
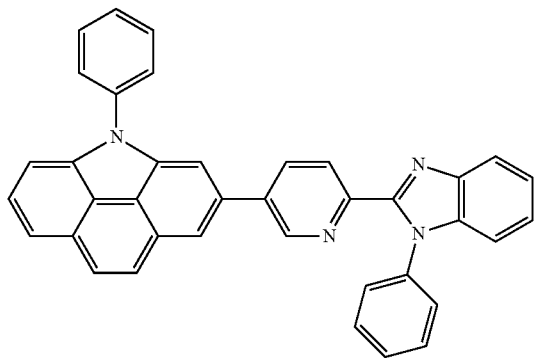
62
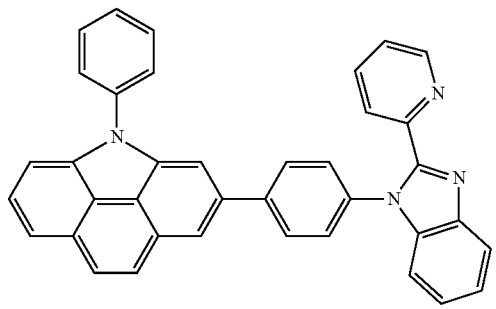
63
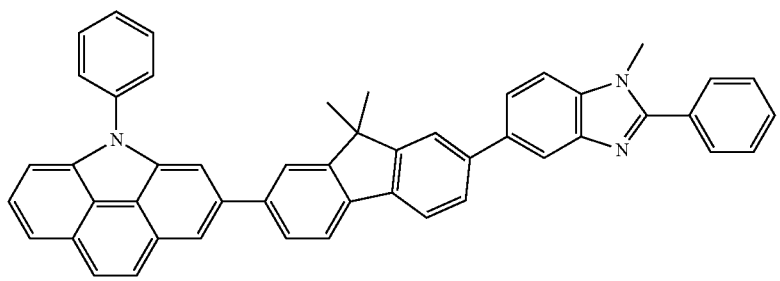
64
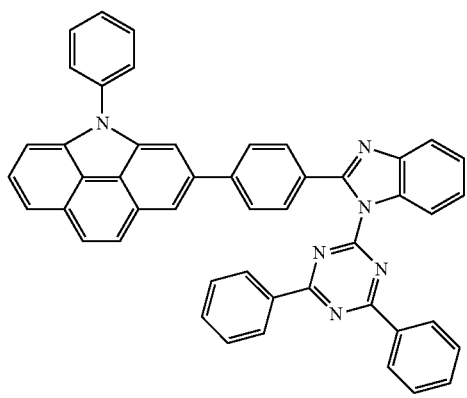
65
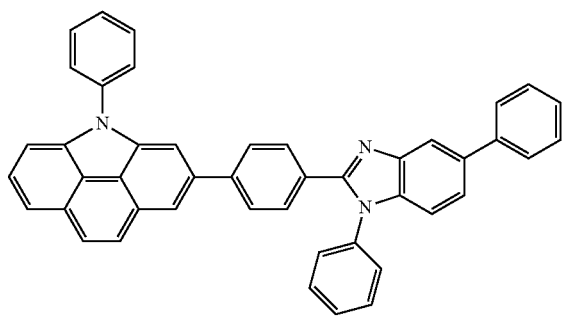
66
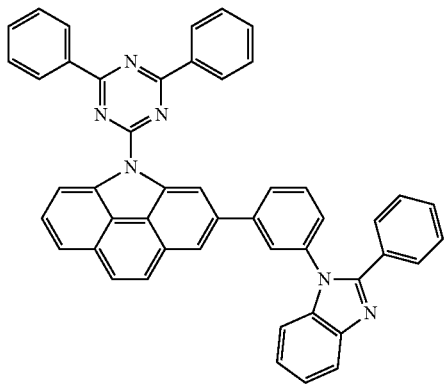
67
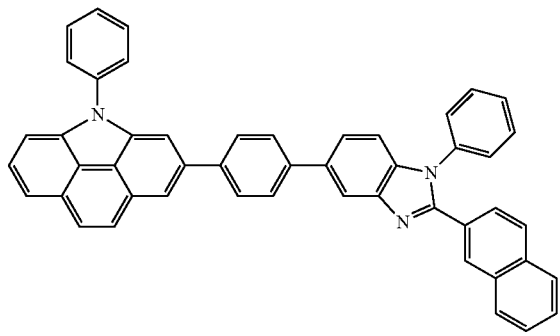

-continued
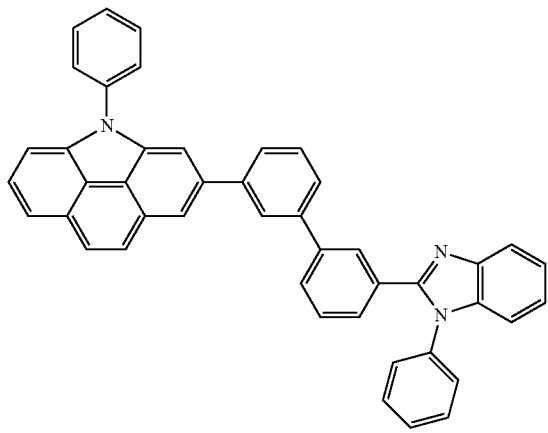
68
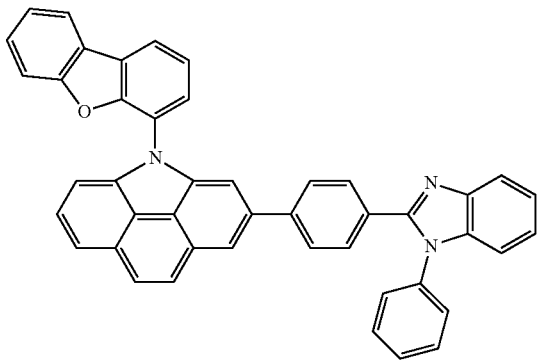
69
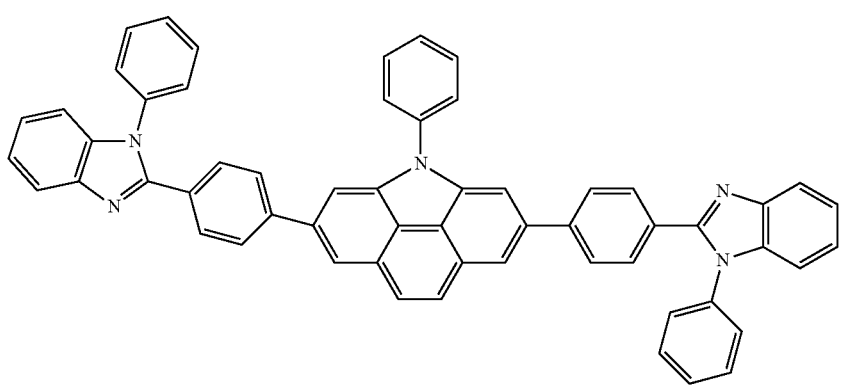
70
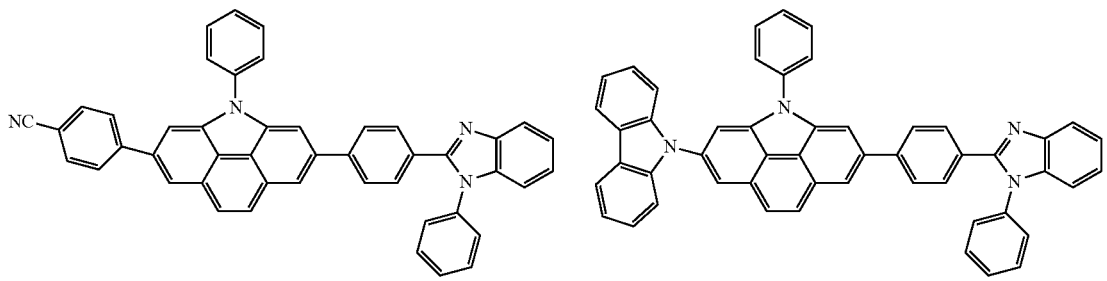
71
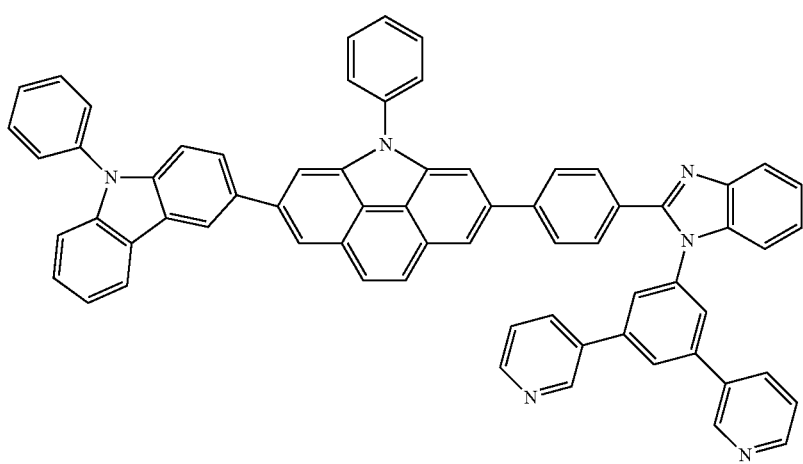
72
73

74
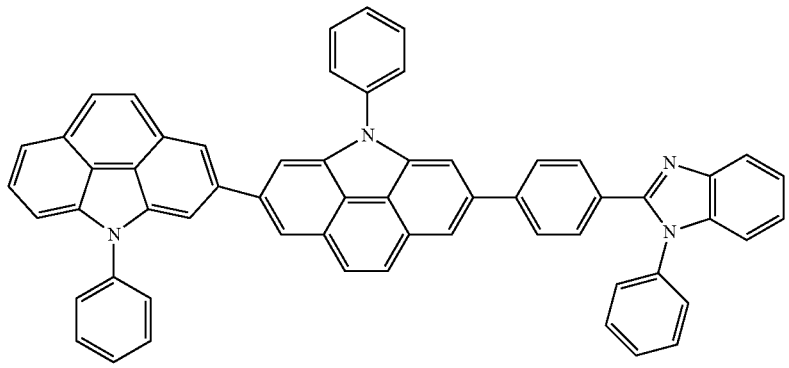
75
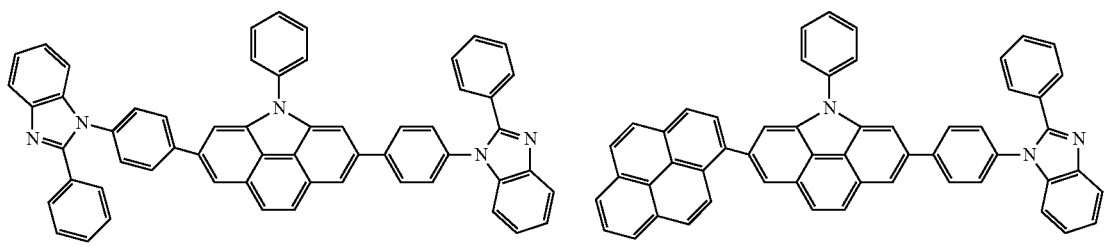
76
77
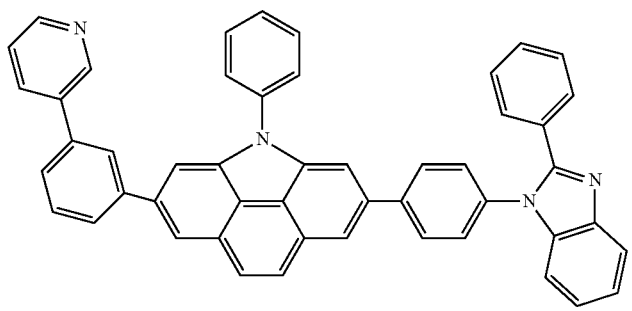
78
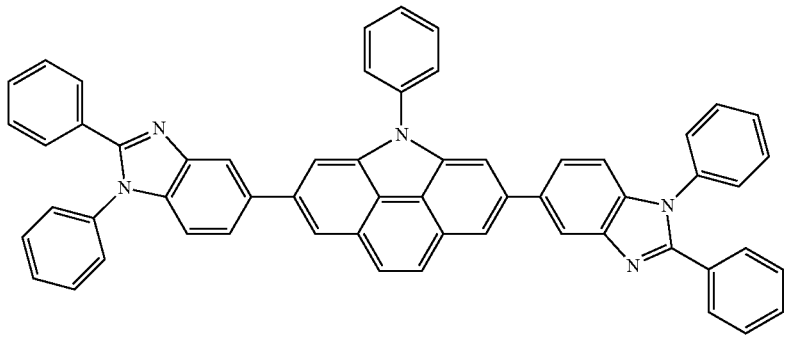
79
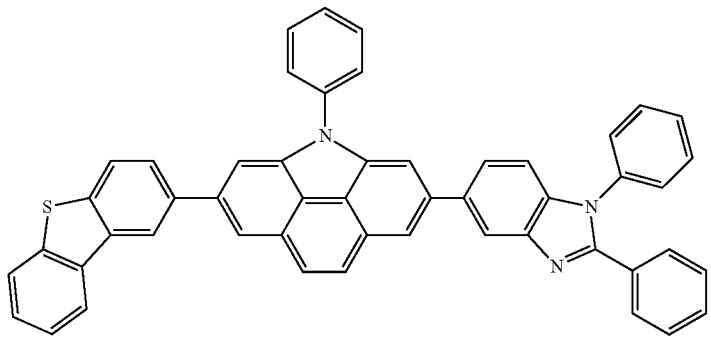

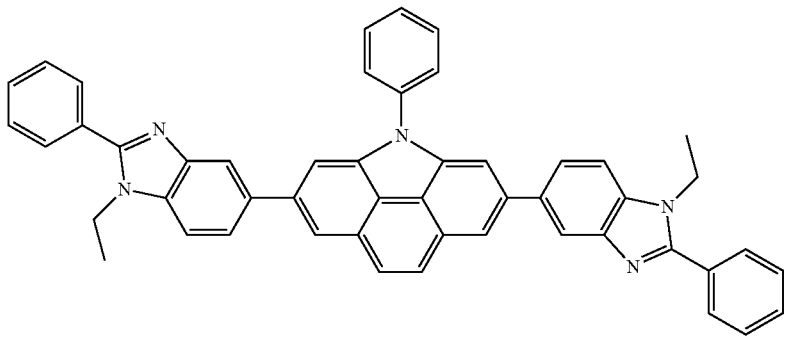

80

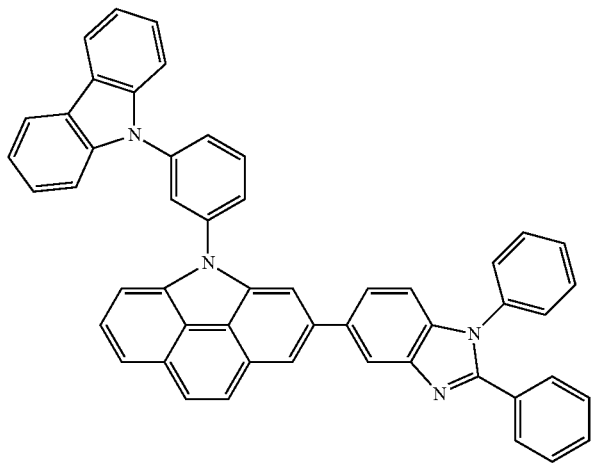

81

The organic compound represented by Formula 1 has various benzimidazole substituents linked to a benzocarbazole (e.g., a 4H-benzo[def]carbazole) backbone that is a nitrogen-containing polycyclic group.

The benzocarbazole (e.g., the 4H-benzo[def]carbazole) included in the organic compound represented by Formula 1 is similar to carbazole in terms of structure, but compared to carbazole, the benzocarbazole (e.g., the 4H-benzo[def]carbazole) of Formula 1 is enriched with electrons and has a relatively higher molecular weight. Accordingly, the organic compound represented by Formula 1 has, compared to carbazole, strong hole and electron transport capabilities. Also, because the organic compound represented by Formula 1 has relatively higher molecular thermal stability than carbazole, the organic compound has high glass transition temperature (Tg), and when the organic compound represented by Formula 1 is included in an organic light-emitting device, the organic light-emitting device may have high thin-film stability.

The organic compound represented by Formula 1 may retain its electron-lacking environment in its molecular structure due to the nitrogen atom in the benzimidazole group. Also, due to electron-withdrawing effects of the nitrogen atom of the benzimidazole group, the organic compound represented by Formula 1 may induce a bipolar moment in its molecular structure.

The organic compound represented by Formula 1 has high electron transport capability and high molecular stability. As such, when the organic compound represented by Formula 1 is formed as a thin film, stability of the formed thin film is high.

Accordingly, an organic light-emitting device including the organic compound represented by Formula 1 may have a low driving voltage, high efficiency, high brightness, and long lifespan.

The organic compound represented by Formula 1 may be synthesized by using a known organic synthetic method. A synthesis method of the organic compound may be apparent to one of ordinary skill in the art in view of the following embodiments.

The organic compound of Formula 1 may be used between a pair of electrodes of an organic light-emitting device. For example, the organic compound may be included in an electron transport region, for example, an electron transport layer. Accordingly, an organic light-emitting device according to an embodiment of the present disclosure includes: a first electrode; a second electrode facing the first electrode; and an organic layer between the first electrode and the second electrode and including an emission layer, where the organic layer includes at least one of the organic compounds described above.

The expression "(an organic layer) includes at least one organic compounds" used herein may include a case in which "(an organic layer)" includes one organic compound of Formula 1 and a case in which "(an organic layer)" includes two or more different organic compounds of Formula 1.

For example, the organic layer may include, as the organic compound, only Compound 1. In this regard, Compound 1 may exist (e.g., be present) in an electron transport region of the organic light-emitting device. In another embodiment of the present disclosure, the organic layer may include, as the organic compound, Compound 1 and Compound 2. In this regard, Compound 1 and Compound 2 may exist (e.g., be present) in an identical layer (for example, Compound 1 and Compound 2 may all exist (e.g., be present) in an electron transport region), or different layers (for example, Compound 1 may exist (e.g., be present) in an emission layer and Compound 2 may exist (e.g., be present) in an electron transport region).

The organic layer may further include a hole transport region between the first electrode and the emission layer. The hole transport region may include at least one selected from a hole injection layer, a hole transport layer, a buffer layer, and an electron blocking layer.

The organic layer may further include an electron transport region between the emission layer and the second electrode. The electron transport region may include at least one selected from a hole blocking layer, an electron transport layer, and an electron injection layer.

The electron transport region may include an organic compound represented by Formula 1. For example, the electron transport region may include the electron transport layer, where the electron transport layer includes the organic compound represented by Formula 1.

The term "organic layer" used herein refers to a single layer and/or a plurality of layers between the first electrode and the second electrode of the organic light-emitting device. A material included in the "organic layer" is not limited to an organic material.

The accompanying drawing is a cross-sectional schematic view of an organic light-emitting device 10 according to an embodiment of the present disclosure. The organic light-emitting device 10 includes a first electrode 110, an organic layer 150, and a second electrode 190.

Hereinafter, the structure of an organic light-emitting device according to an embodiment of the present disclosure and a method of manufacturing an organic light-emitting device according to an embodiment of the present disclosure will be described in connection with the accompanying drawing.

In the accompanying drawing, a substrate may be additionally under the first electrode 110 or above the second electrode 190. The substrate may be a glass substrate or transparent plastic substrate, each with excellent mechanical strength, thermal stability, transparency, surface smoothness, ease of handling, and water repellency, but the substrate is not limited thereto.

The first electrode 110 may be formed by depositing or sputtering a material for forming the first electrode on the substrate. When the first electrode 110 is an anode, the material for the first electrode 110 may be selected from materials with a high work function for holes to be easily injected. The first electrode 110 may be a reflective electrode or a transmissive electrode. The material for the first electrode may be a transparent and highly conductive material, and examples of such a material include indium tin oxide (ITO), indium zinc oxide (IZO), tin oxide ($SnO_2$), and zinc oxide (ZnO), but the first electrode is not limited thereto. When the first electrode 110 is a semi-transmissive electrode or a reflective electrode, as a material for forming the first electrode, at least one of magnesium (Mg), aluminum (Al), aluminum-lithium (Al—Li), calcium (Ca), magnesium-indium (Mg—In), magnesium-silver (Mg—Ag) may be used, but the first electrode is not limited thereto.

The first electrode 110 may have a single-layer structure, or a multi-layer structure including two or more layers. For example, the first electrode 110 may have a three-layered structure of ITO/Ag/ITO, but the structure of the first electrode 110 is not limited thereto.

An organic layer 150 is on the first electrode 110. The organic layer 150 may include an emission layer.

The organic layer 150 may further include a hole transport region disposed between the first electrode and the emission layer. The organic layer 150 may further include an electron transport region between the emission layer and the second electrode.

The hole transport region may include at least one selected from a hole injection layer (HIL), a hole transport layer (HTL), a buffer layer, and an electron blocking layer (EBL), and the electron transport region may include at least one selected from a hole blocking layer (HBL), an electron transport layer (ETL), and an electron injection layer (EIL), but the hole transport region and the electron transport region are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, where layers of each structure are sequentially stacked from the first electrode 110 in this stated order, but the hole transport region is not limited thereto.

When the hole transport region includes a hole injection layer, the hole injection layer may be formed on the first electrode 110 by using various methods, such as vacuum deposition, spin coating casting, a Langmuir-Blodgett (LB) method, ink-jet printing, laser-printing, or laser-induced thermal imaging, but the hole injection layer is not limited thereto.

When a hole injection layer is formed by vacuum deposition, for example, the vacuum deposition may be performed at a temperature in a deposition temperature range of about 100 to about 500° C., at a vacuum degree of about $10^{-8}$ to about $10^{-3}$ torr, and at a deposition rate of about 0.01 to about 100 Å/sec in consideration of a compound for a hole injection layer to be deposited, and the structure of a hole injection layer to be formed.

When a hole injection layer is formed by spin coating, the spin coating may be performed at a coating rate of about 2000 rpm to about 5000 rpm, and at a temperature of about 80° C. to 200° C. in consideration of a compound for a hole injection layer to be deposited, and the structure of a hole injection layer to be formed.

When the hole transport region includes a hole transport layer, the hole transport layer may be formed on the first electrode 110 or the hole injection layer by using various methods, such as vacuum deposition, spin coating, casting, a LB method, ink-jet printing, laser-printing, or laser-induced thermal imaging, but the hole transport layer is not limited thereto. When the hole transport layer is formed by vacuum deposition or spin coating, deposition and coating conditions for the hole transport layer may be determined by referring to the deposition and coating conditions for the hole injection layer.

The hole transport region may include at least one selected from m-MTDATA, TDATA, 2-TNATA, NPB, β-NPB, TPD, Spiro-TPD, Spiro-NPB, α-NPB, TAPC, HMTPD, 4,4',4''-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201 below, and a compound represented by Formula 202 below:

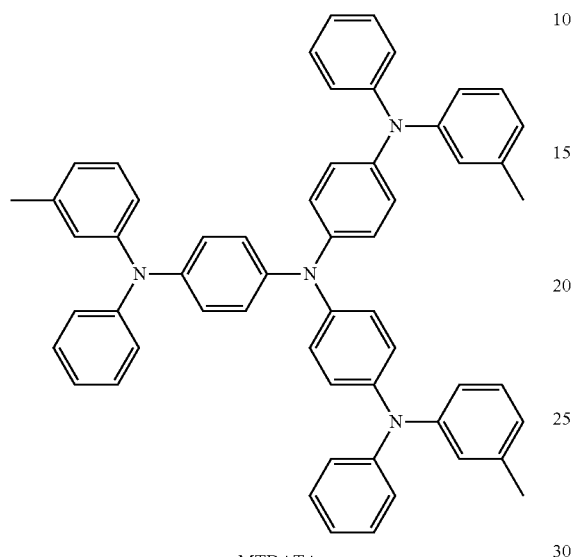

m-MTDATA

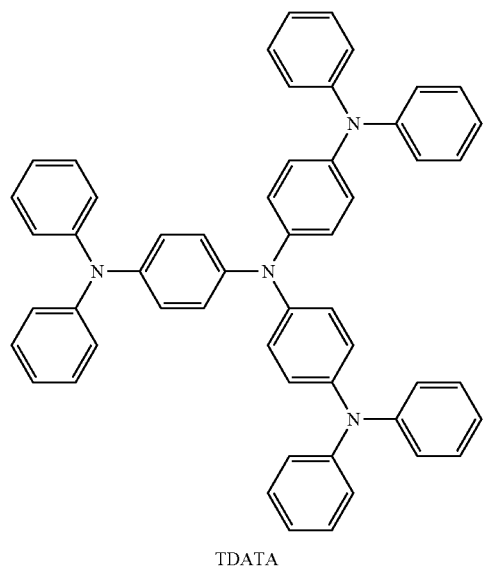

TDATA

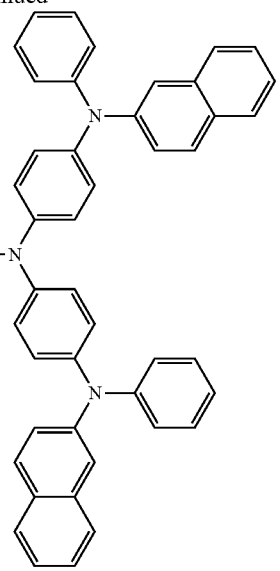

2-TNATA

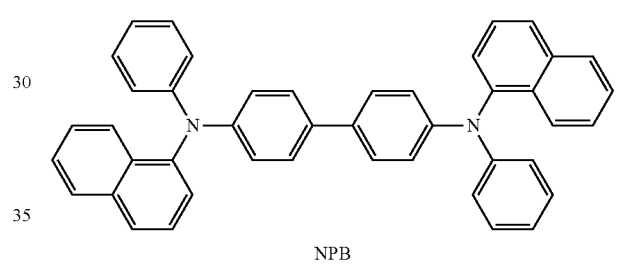

NPB

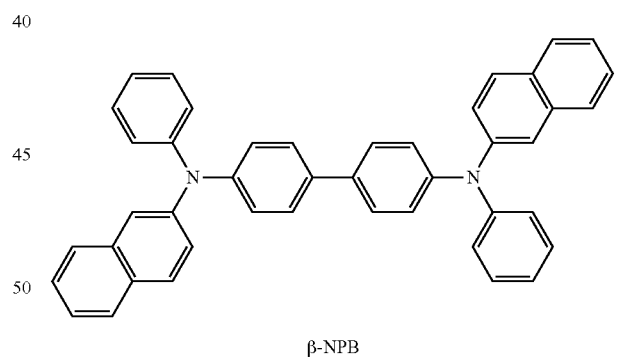

β-NPB

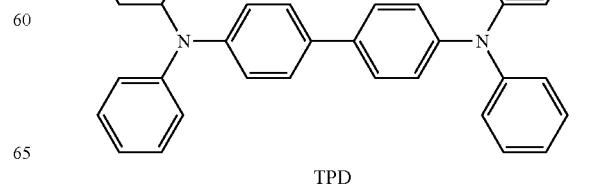

TPD

-continued

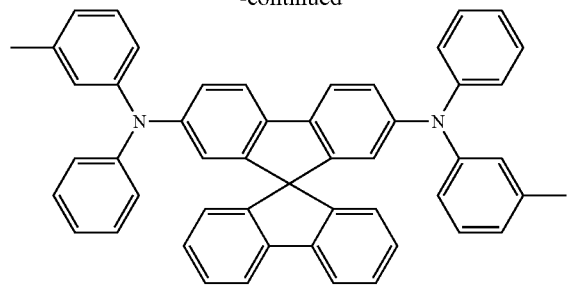
Spiro-TPD

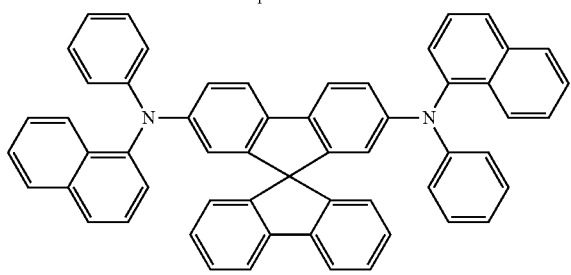
Spiro-NPB

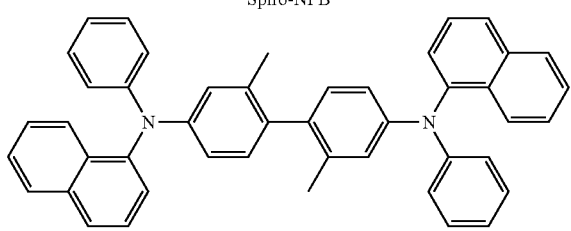
α-NPB

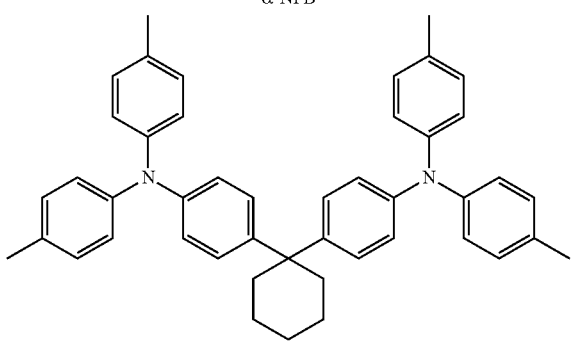
TAPC

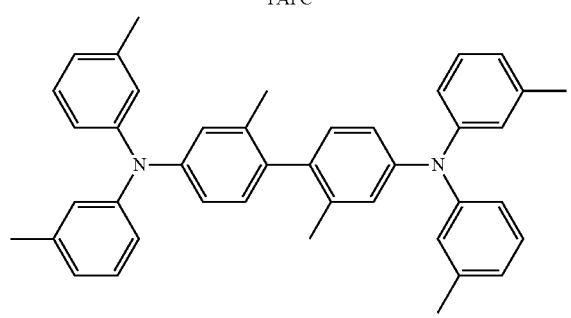
HMTPD

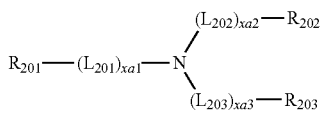
Formula 201

-continued

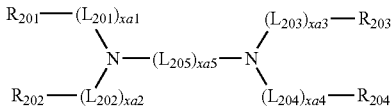
Formula 202 where in Formulae 201 and 202, $L_{201}$ to $L_{205}$ are each independently selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{60}$ arylene group, a substituted or unsubstituted $C_1$-$C_{60}$ heteroarylene group, and a substituted or unsubstituted non-aromatic condensed polycyclic group, at least one substituent of the substituted $C_3$-$C_{10}$ cycloalkylene group, the substituted $C_3$-$C_{10}$ heterocycloalkylene group, the substituted $C_3$-$C_{10}$ cycloalkenylene group, the substituted $C_3$-$C_{10}$ heterocycloalkenylene group, the substituted $C_6$-$C_{60}$ arylene group, the substituted $C_1$-$C_{60}$ heteroarylene group, and the substituted divalent non-aromatic condensed polycyclic group is selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, —N($Q_{201}$)($Q_{202}$), —Si($Q_{203}$)($Q_{204}$)($Q_{205}$), and —B($Q_{206}$)($Q_{207}$);

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_1$-$C_{60}$ heteroaryl, a non-aromatic condensed polycyclic group, —N(Q$_{211}$)(Q$_{212}$), —Si(Q$_{213}$)(Q$_{214}$)(Q$_{215}$), and —B(Q$_{216}$)(Q$_{217}$); and —N(Q$_{221}$)(Q$_{222}$), —Si(Q$_{223}$)(Q$_{224}$)(Q$_{225}$), and —B(Q$_{226}$)(Q$_{227}$); and xa1 to xa4 may be each independently selected from 0, 1, 2, and 3;

xa5 may be selected from 1, 2, 3, 4, and 5; and

R$_{201}$ to R$_{205}$ are each independently selected from:

a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, —N(Q$_{231}$)(Q$_{232}$), —Si(Q$_{233}$)(Q$_{234}$)(Q$_{235}$), and —B(Q$_{236}$)(Q$_{237}$);

a C$_3$-C$_{10}$ cycloalkyl group, a C$_3$-C$_{10}$ heterocycloalkyl group, a C$_3$-C$_{70}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, and a non-aromatic condensed polycyclic group;

a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic hetero-condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a non-aromatic condensed polycyclic group, —N(Q$_{241}$)(Q$_{242}$), —Si(Q$_{243}$)(Q$_{244}$)(Q$_{245}$), and —B(Q$_{246}$)(Q$_{247}$); and Q$_{201}$ to Q$_{207}$, Q$_{211}$ to Q$_{217}$, Q$_{221}$ to Q$_{227}$, Q$_{231}$ to Q$_{237}$, and Q$_{241}$ to Q$_{247}$ are each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, and a monovalent non-aromatic condensed polycyclic group;

a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, and a non-aromatic condensed polycyclic group; and a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic hetero-condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, and a non-aromatic condensed polycyclic group.

L$_{201}$ to L$_{205}$ in Formulae 201 and 202 may be understood by referring to the description provided in connection with L$_{11}$, and R$_{201}$ to R$_{205}$ may be understood by referring to the description provided in connection with R$_{13}$.

In Formulae 201 and 202,

L$_{201}$ to L$_{205}$ may be each independently selected from:

a phenylene, a naphthylene, a fluorenylene, a spiro-fluorenylene, a benzofluorene, a dibenzofluorene, a phenanthrenylene, an anthracenylene, a pyrenylene, a chrysenylene, a pyridinylene, a pyrazinylene, a pyrimidinylene, a pyridazinylene, a quinolinylene, an isoquinolinylene, a quinoxalinylene, a quinazolinylene, a carbazolylene, and a triazinylene; and a phenylene, a naphthylene, a fluorenylene, a spiro-fluorenylene, a benzofluorenylene, a dibenzofluorenylene, a phenanthrenylene, an anthracenylene, a pyrenylene, a chrysenylene, a pyridinylene, a pyrazinylene, a pyrimidinylene, a pyridazinylene, a quinolinylene, an isoquinolinylene, a quinoxalinylene, a quinazolinylene, a carbazolylene, and a triazinylene, each substituted with at least one selected from a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3;

R$_{201}$ to R$_{205}$ are each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but Formulae 201 and 202 are not limited thereto.

The compound represented by Formula 201 may be represented by Formula 201A:

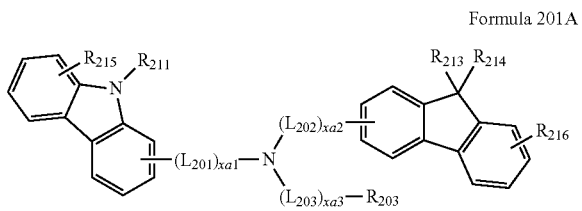

Formula 201A

For example, the compound represented by Formula 201 may be represented by Formula 201A-1 below, but is not limited thereto:

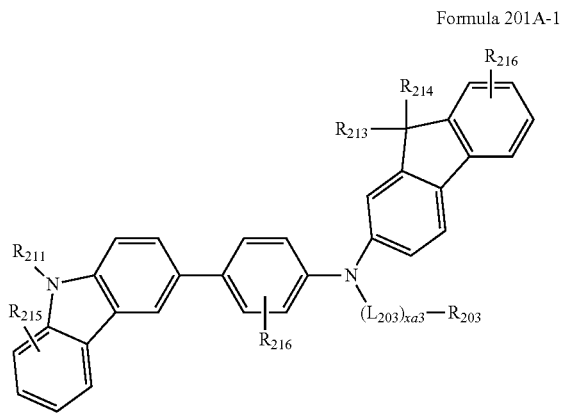

Formula 201A-1

For example, the compound represented by Formula 202 may be represented by Formula 202A below, but Formula 202 is not limited thereto:

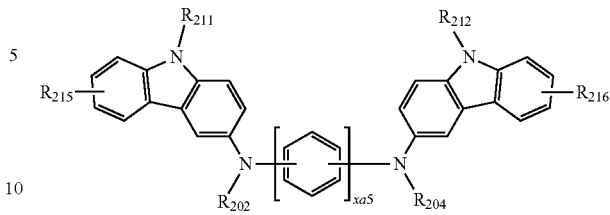

Formula 202A $L_{201}$ to $L_{203}$, xa1 to xa3, xa5, and $R_{202}$ to $R_{204}$ in Formulae 201A, 201A-1, and 202A are the same as those described above, $R_{211}$ may be understood by referring to the description above in connection with $R_{203}$, and $R_{213}$ to $R_{216}$ may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group.

For example, in Formulae 201A, 201A-1, and 202A, $L_{201}$ to $L_{203}$ in Formulae 201A, 201A-1, and 202A may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene, a naphthylene, a fluorenylene, a spiro-fluorenylene, a benzofluorenylene, a dibenzofluorenylene, a phenanthrenylene, an anthracenylene, a pyrenylene, a chrysenylene, a pyridinylene, a pyrazinylene, a pyrimidinylene, a pyridazinylene, a quinolinylene, an isoquinolinylene, a quinoxalinylene, a quinazolinylene, a carbazolylene, and a triazinylene, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $R_{215}$ and $R_{216}$ may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 is 1 or 2.

$R_{213}$ and $R_{214}$ in Formulae 201A, and 201A-1 may bind to each other (e.g., combine) to form a saturated or unsaturated ring.

The compound represented by Formula 201, and the compound represented by Formula 202 may include compounds HT1 to HT20 illustrated below, but are not limited thereto.

HT1
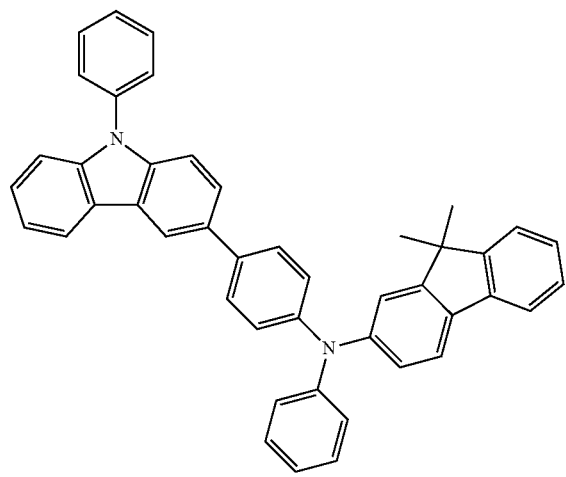
HT3
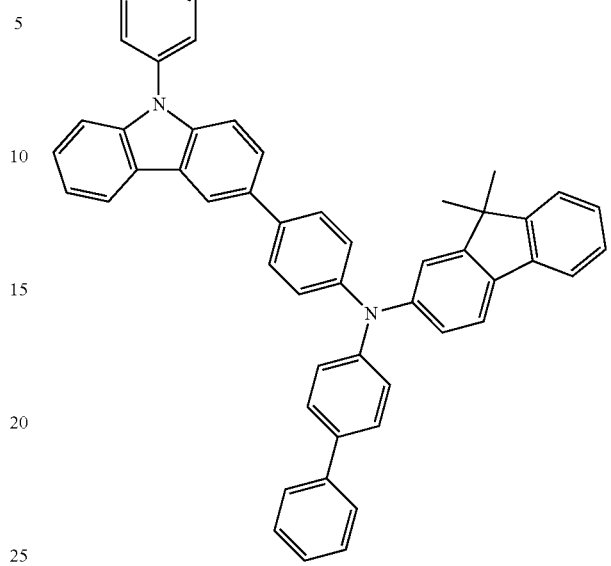
HT2
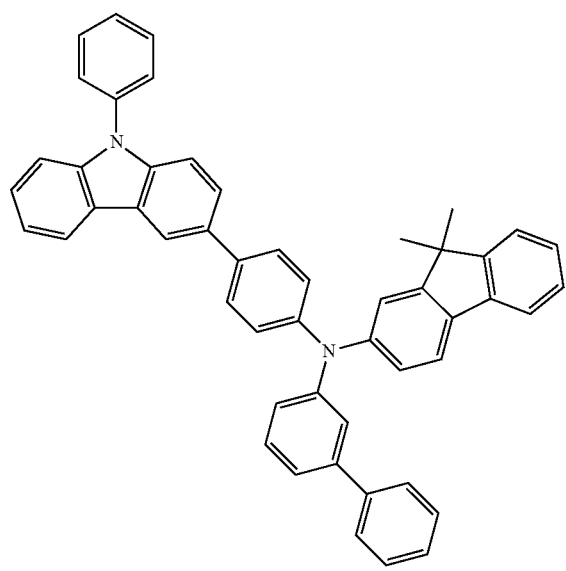
HT4
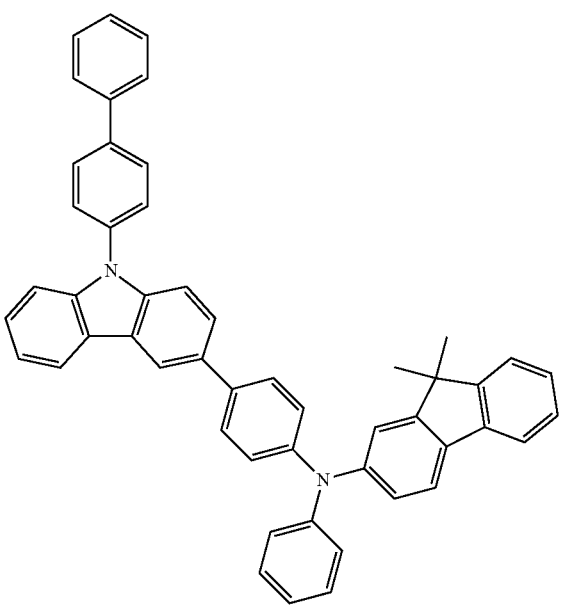

HT5
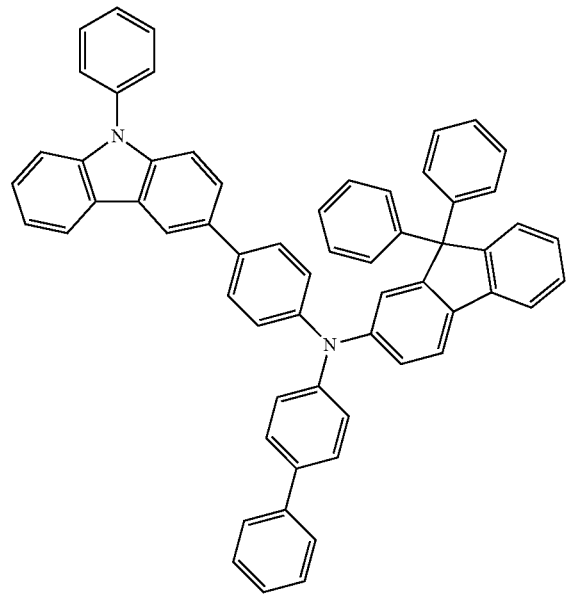
HT6
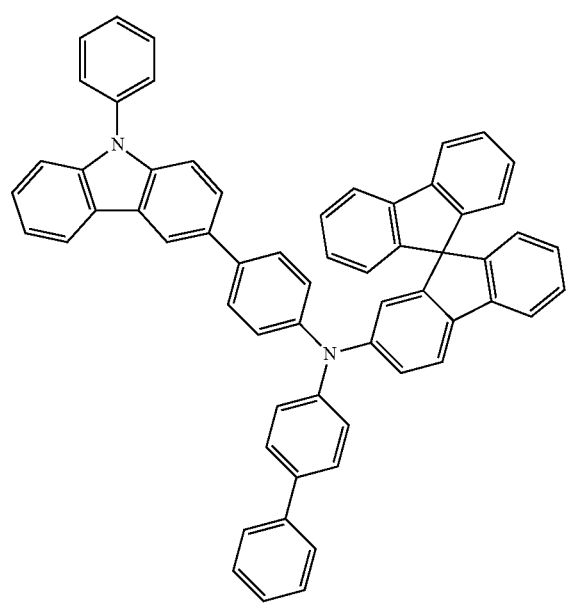
HT7
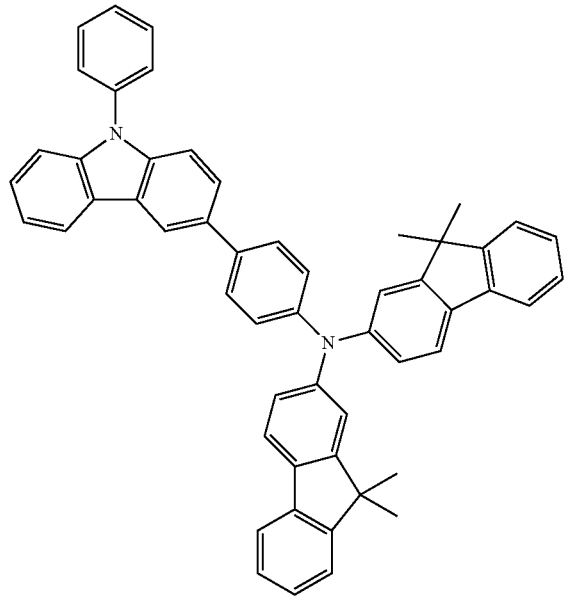
HT8
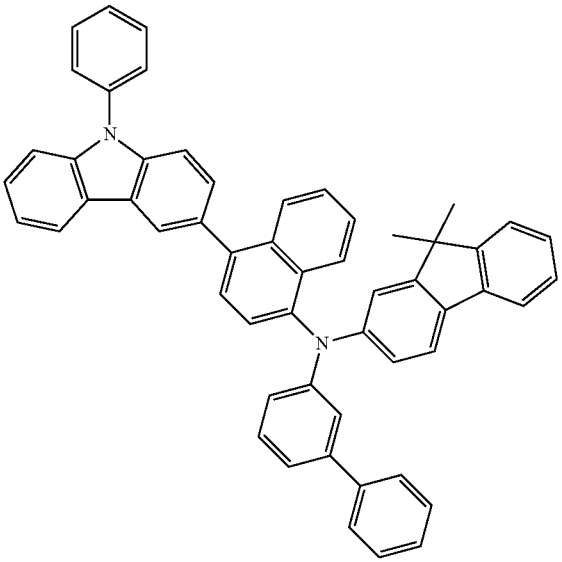

-continued
HT9
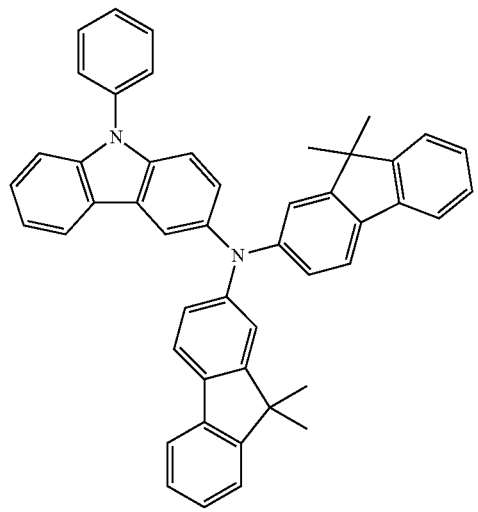
HT11
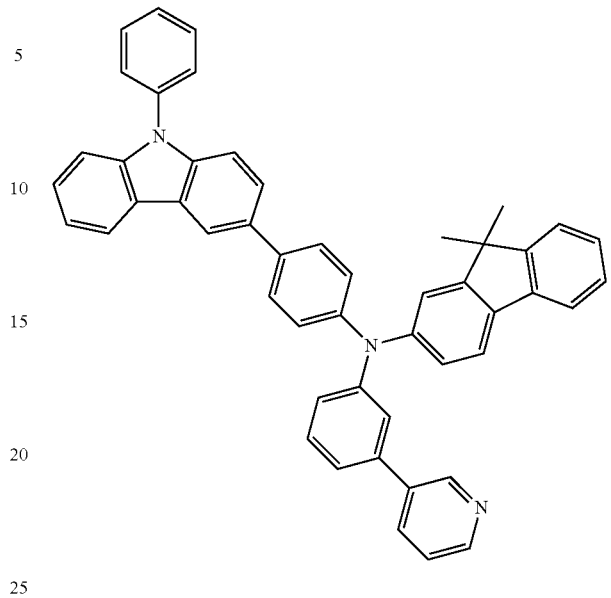
HT10
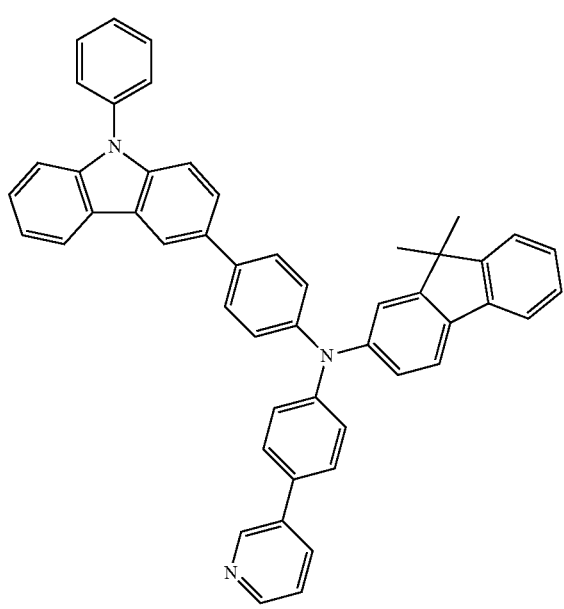
HT12
HT13
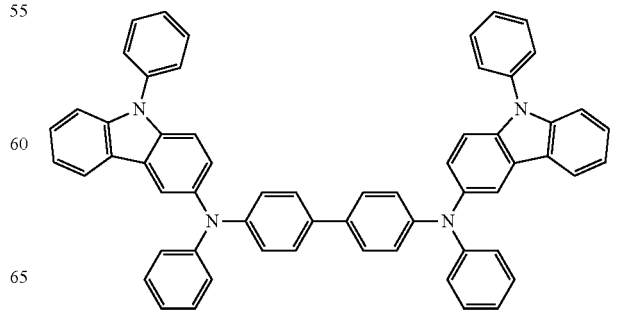

HT14

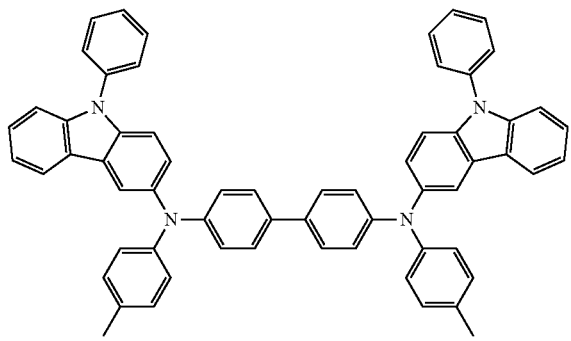

HT18

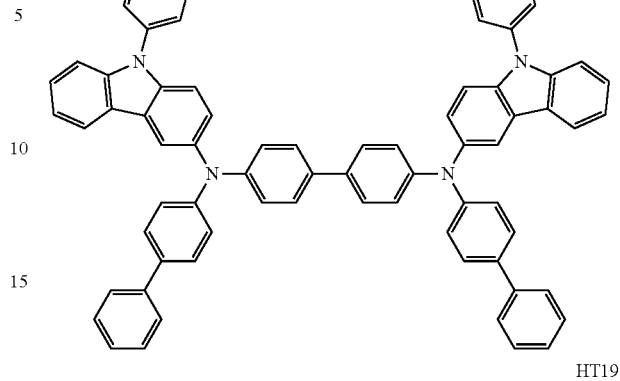

HT15

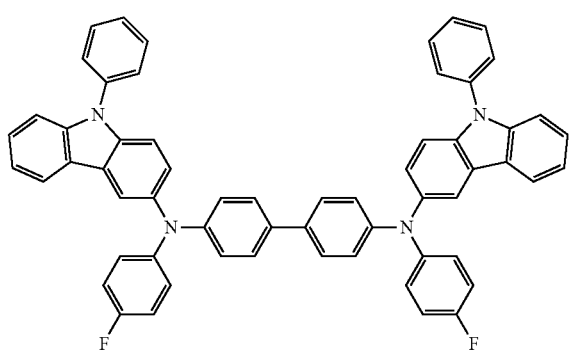

HT19

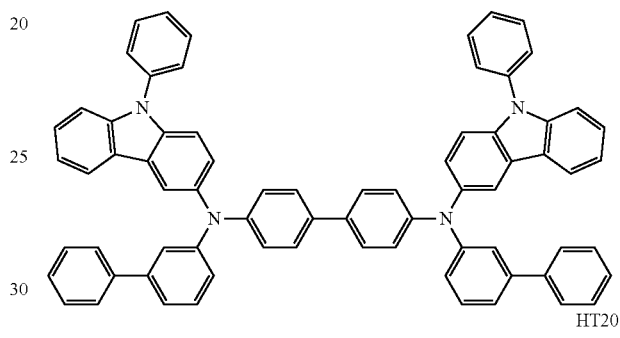

HT16

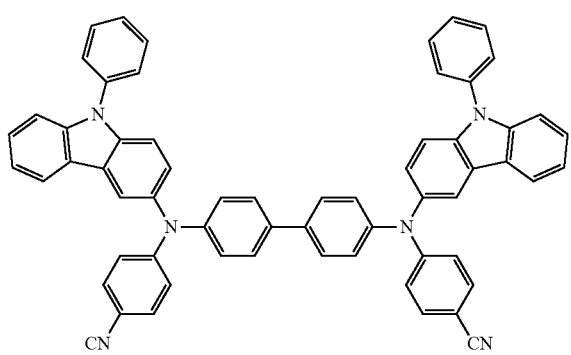

HT20

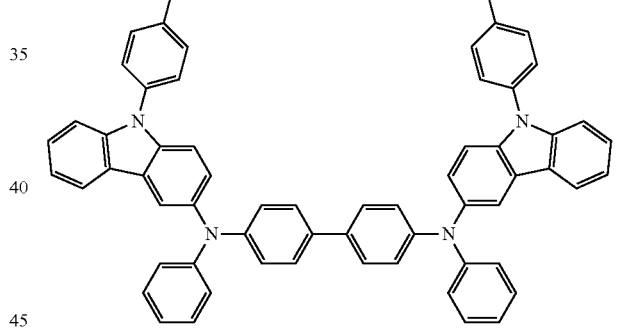

HT17

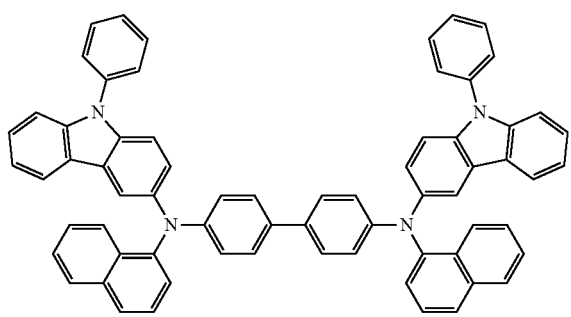

A thickness of the hole transport region may be in a range of about 100 Å to about 10,000 Å, for example, about 100 Å to about 1000 Å. When the hole transport region includes both a hole injection layer and a hole transport layer, a thickness of the hole injection layer may be in a range of about 100 Å to about 10000 Å, for example, about 100 Å to about 1000 Å, and a thickness of the hole transport layer may be in a range of about 50 Å to about 2000 Å, for example about 100 Å to about 1500 Å. When the thicknesses of the hole transport region, the hole injection layer, and the hole transport layer are within any of these ranges, satisfactory (e.g., suitable) hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound, but the charge-generation material is not limited thereto. For example, non-limiting examples of the p-dopant include a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide, and Compound HT-D1 illustrated below, but the p-dopant is not limited thereto.

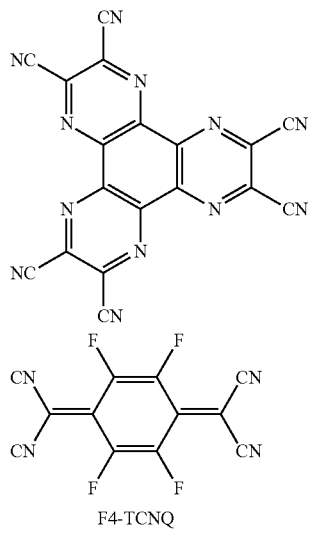

Compound HT-D1

F4-TCNQ

The hole transport region may further include, in addition to the hole injection layer and the hole transport layer, at least one of a buffer layer and an electron blocking layer. The buffer layer may compensate for an optical resonance distance according to a wavelength of light emitted from the emission layer, light-emission efficiency of a formed organic light-emitting device may be improved. For use as a material included in the buffer layer, materials that are included in the hole transport region may be used. The electron blocking layer prevents (or reduces) injection of electrons from the electron transport region.

An emission layer is formed on the first electrode 110 or the hole transport region by using various methods, such as vacuum deposition, spin coating, casting, a LB method, ink-jet printing, laser-printing, or laser-induced thermal imaging. When the emission layer is formed by vacuum deposition or spin coating, deposition and coating conditions for the emission layer may be determined by referring to the deposition and coating conditions for the hole injection layer.

When the organic light-emitting device 10 is a full color organic light-emitting device, the emission layer may be patterned into a red emission layer, a green emission layer, and a blue emission layer, according to a sub pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light. According to another embodiment of the present disclosure, the emission layer may be a white emission layer, and may further include a color converting layer or a color filter to turn white light into light of a desired color.

The emission layer may include a host and a dopant.

The host may include at least one selected from TPBi, TBADN, AND, CBP, CDBP, and TCP:

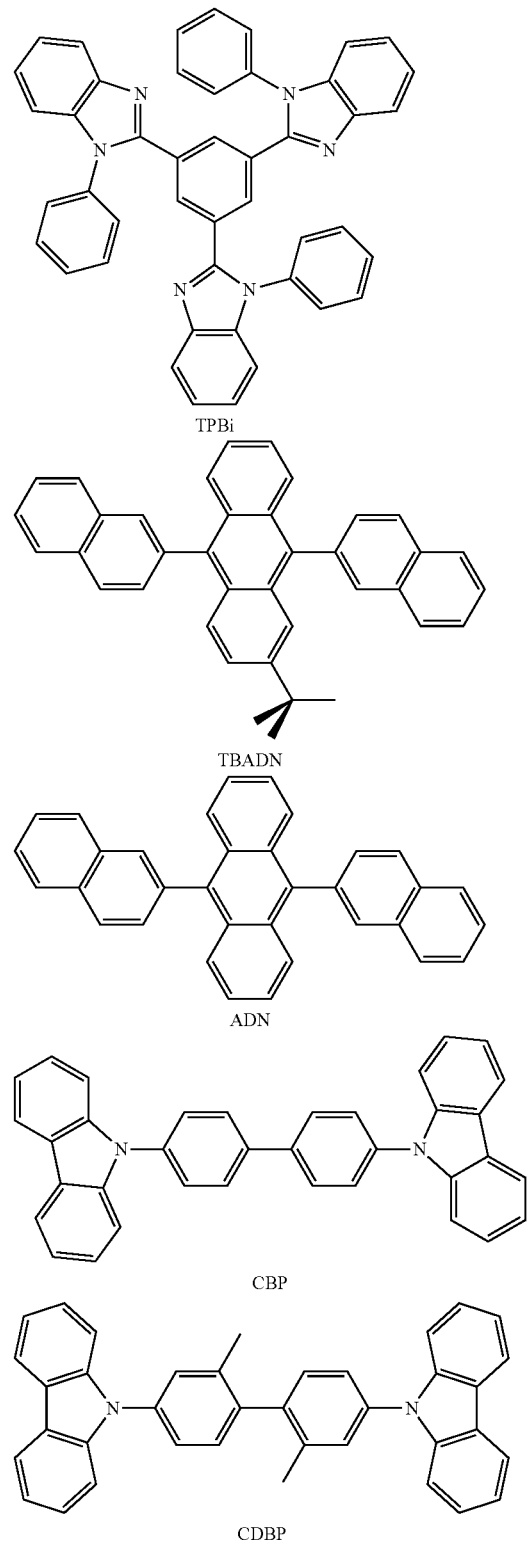

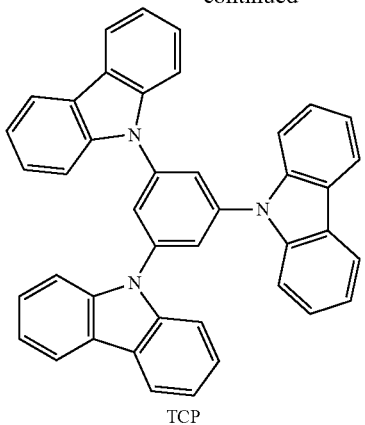

TCP

According to another embodiment of the present disclosure, the host may include a compound represented by Formula 301 below.

$$Ar_{301}-[(L_{301})_{xb1}-R_{301}]_{xb2}$$  Formula 301 where in Formula 301,

Ar$_{301}$ may be selected from:

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, and —Si($Q_{301}$)($Q_{302}$)($Q_{303}$) (where $Q_{301}$ to $Q_{303}$ are each independently selected from a hydrogen atom, a $C_1$-$C_{60}$ alkyl group, a $C_2$-$C_{60}$ alkenyl group, a $C_6$-$C_{60}$ aryl group, and a $C_1$-$C_{60}$ heteroaryl group);

L$_{301}$ may be understood by referring to the description above in connection With L$_{201}$;

R$_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xb1 may be selected from 0, 1, 2, and 3; and xb2 may be selected from 1, 2, 3, and 4.

where in Formula 301,

L$_{301}$ may be selected from:

a phenylene, a naphthylene, fluorenylene, a spiro-fluorenylene, a benzofluorenylene, a dibenzofluorenylene, phenanthrenylene, an anthracenylene, a pyrenylene, and a chrysenylene; and a phenylene, a naphthylene, a fluorenylene, a spiro-fluorenylene, a benzofluorenylene, a dibenzofluorenylene, phenanthrenylene, an anthracenylene, a pyrenylene, and a chrysenylene, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl, $C_1$-$C_{20}$ alkoxy, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and R$_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, but they are not limited thereto.

The compound represented by Formula 301 may include at least one of Compounds H1 to H42, but Formula 301 is not limited thereto:

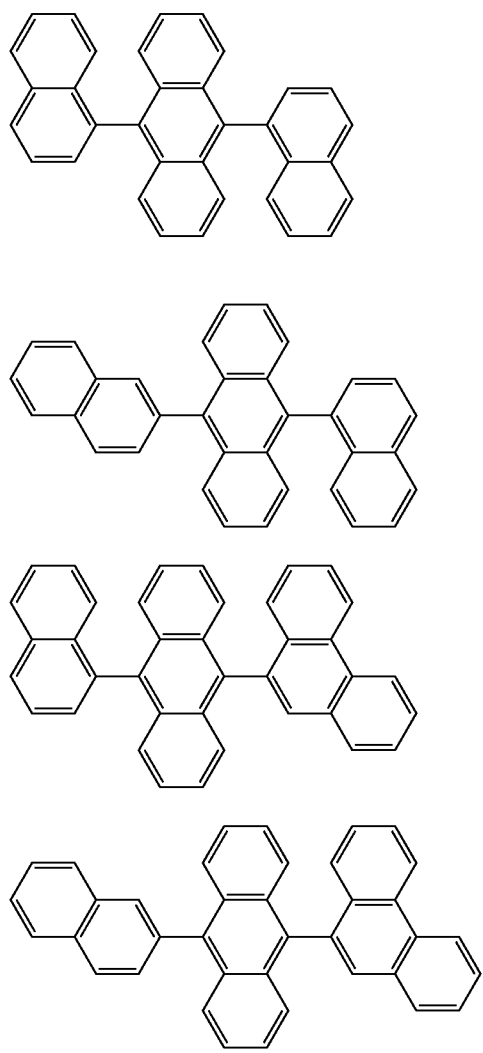

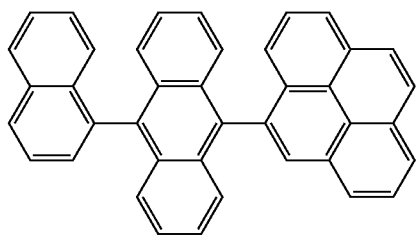

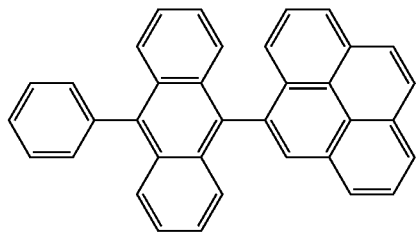

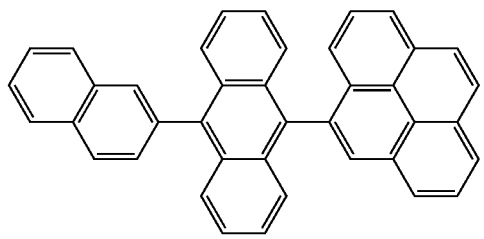

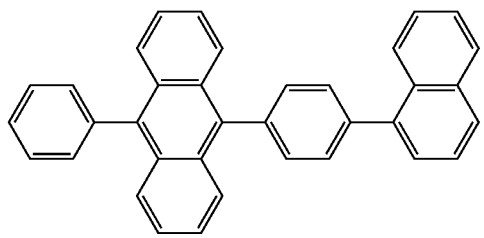

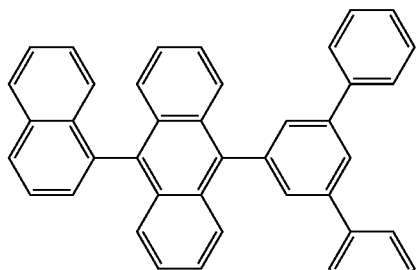

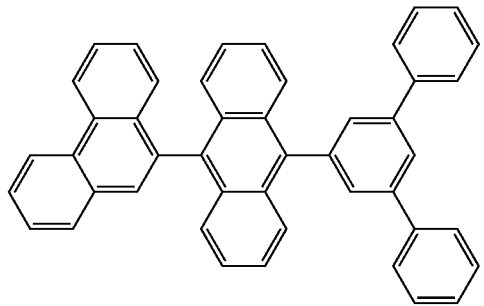

H11
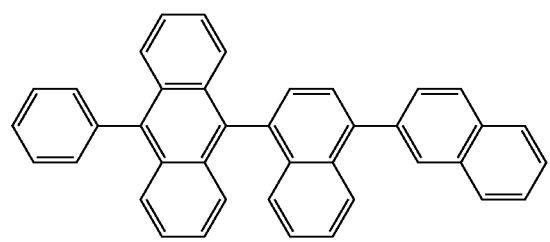
H12
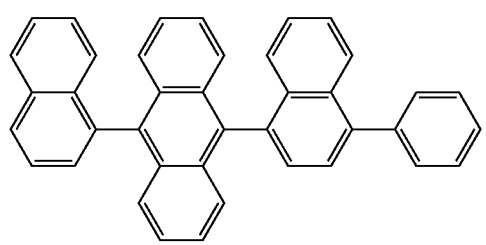
H13
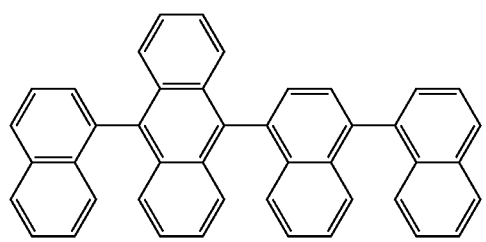
H14
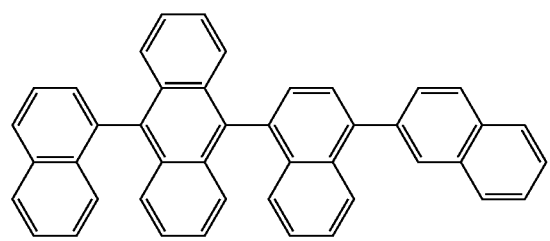
H15
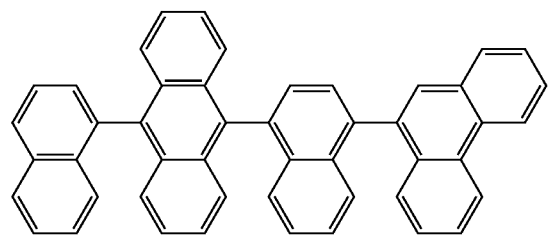
H16
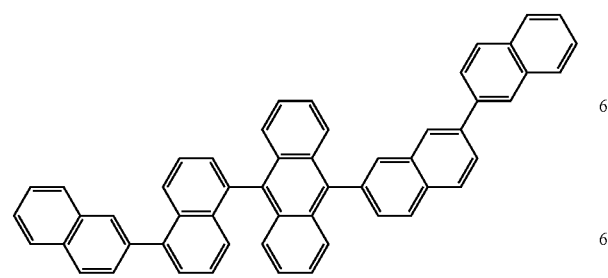
H17
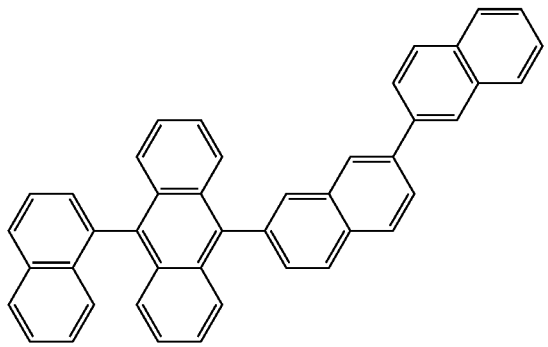
H18
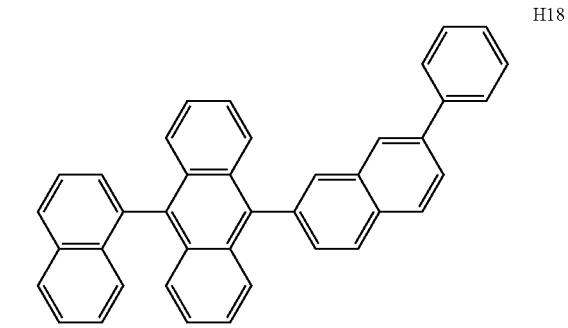
H19
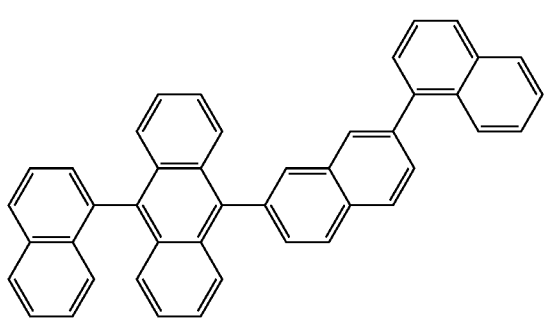
H20
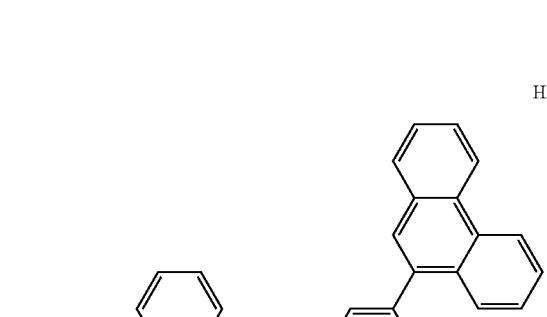

-continued
H21 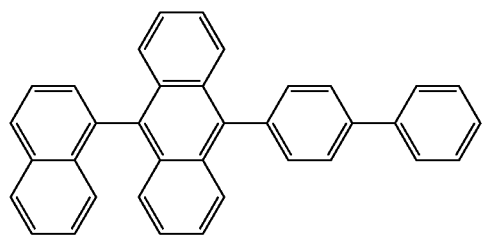
H22 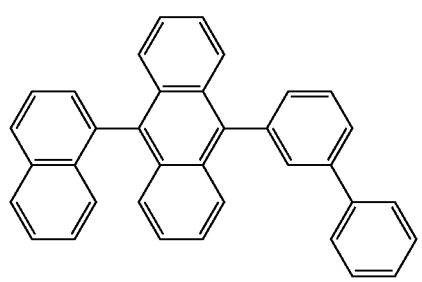
H23 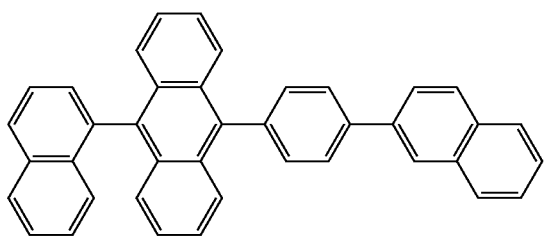
H24 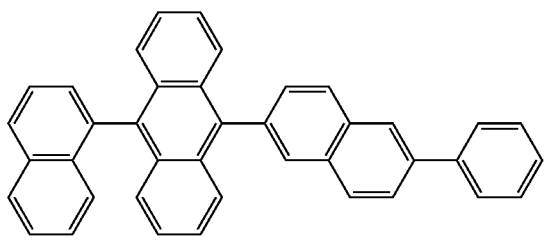
H25 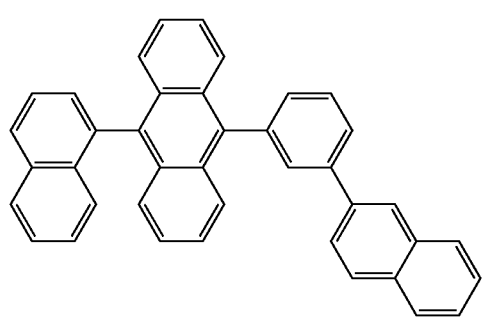
-continued
H26 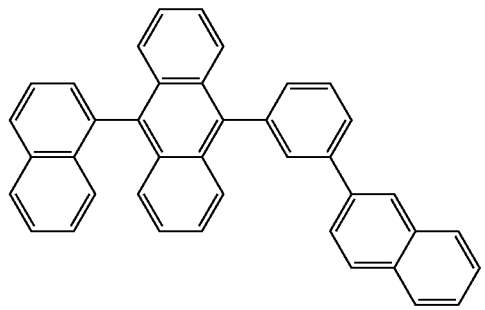
H27 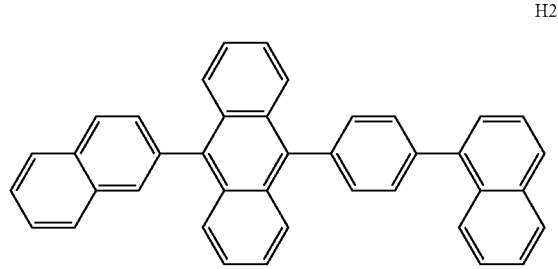
H28 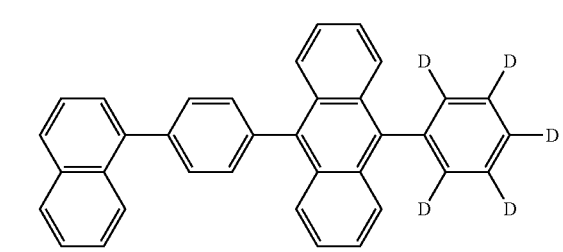
H29 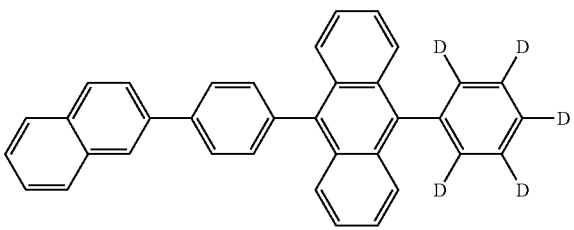
H30 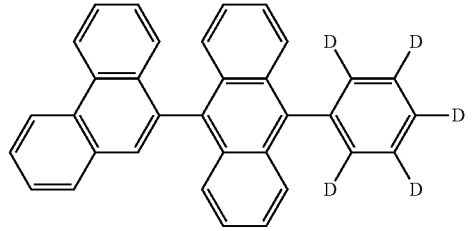
H31 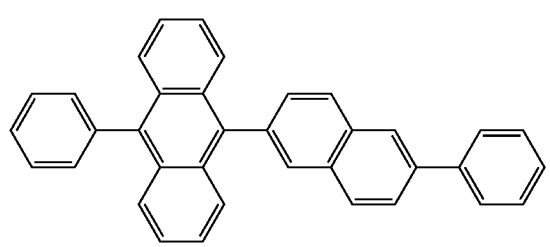

H32
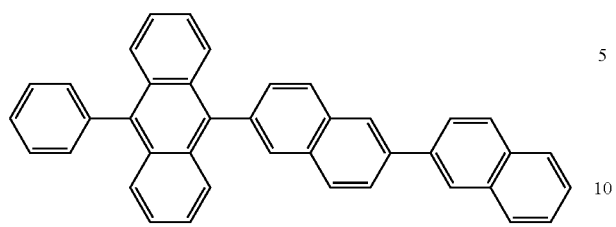
H33
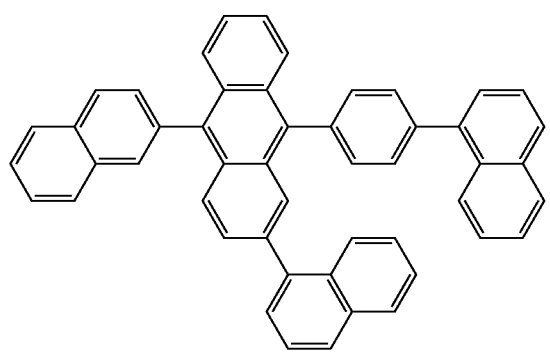
H34
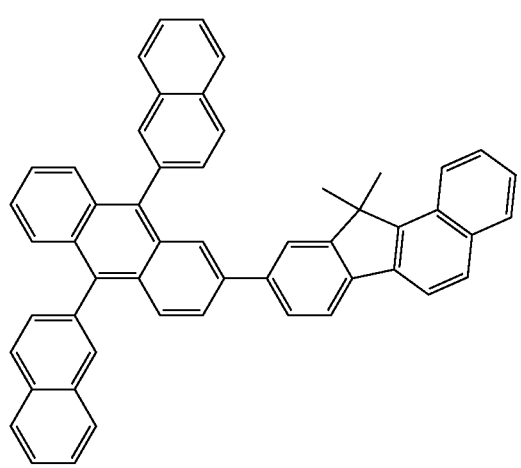
H35
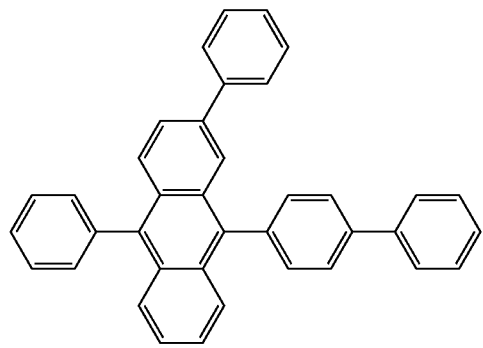
H36
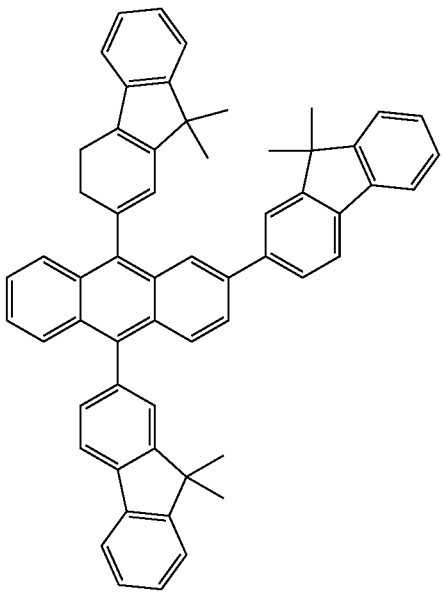
H37
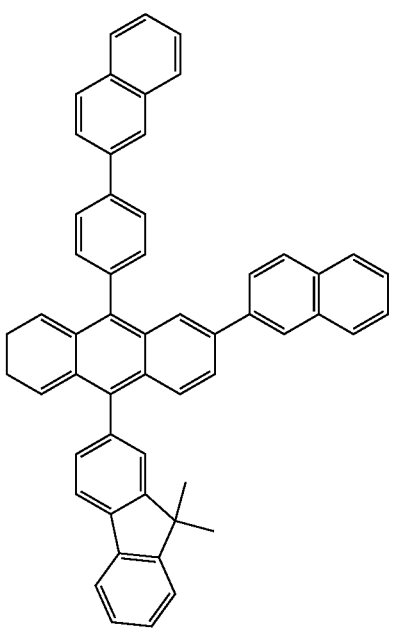
H38
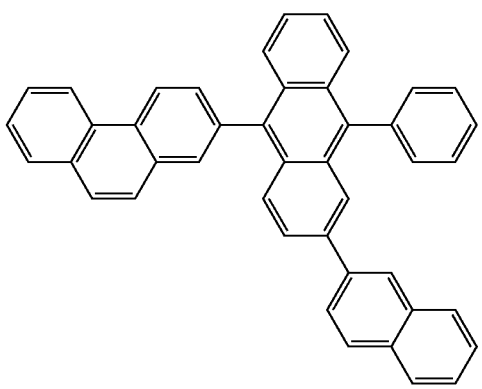

H39
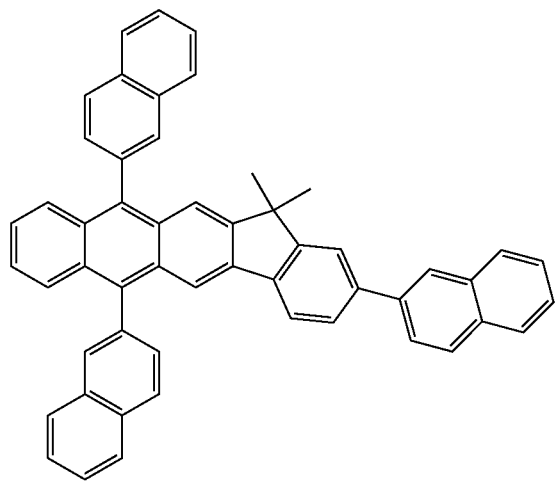
H40
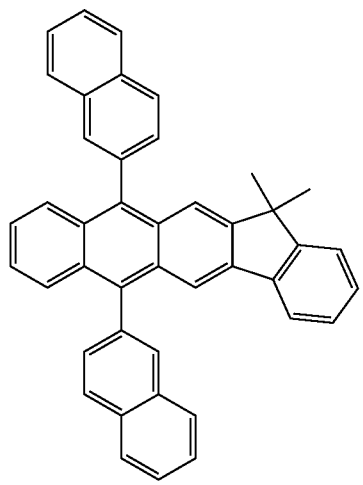
H41
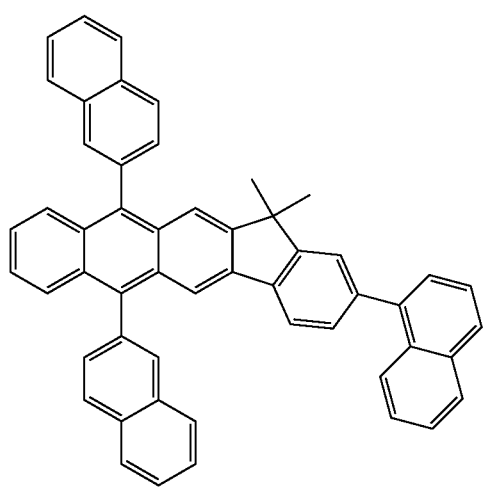
H42
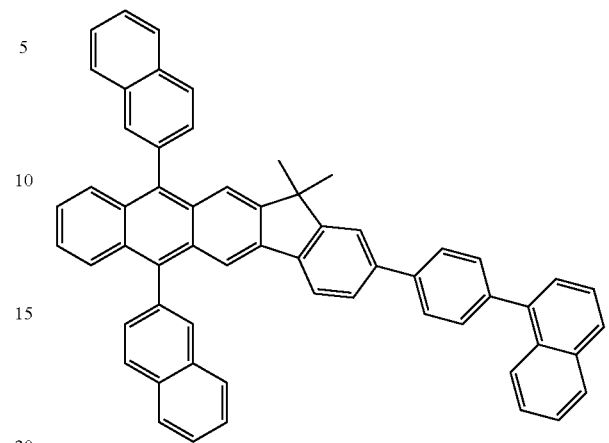
According to another embodiment of the present disclosure, the host may include at least one of Compounds H43 to H49 below, but the host is not limited thereto:
H43
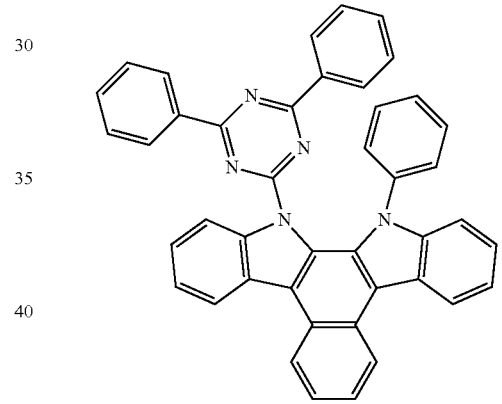
H44
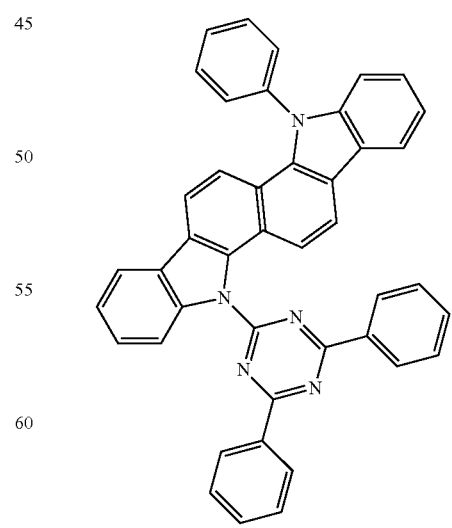

H45
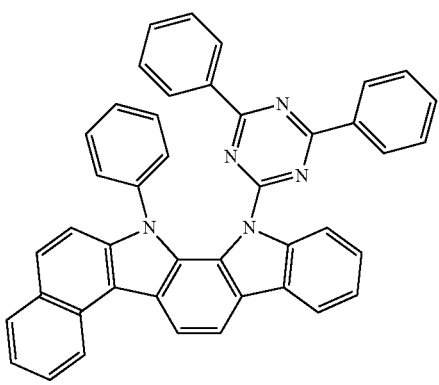

H46
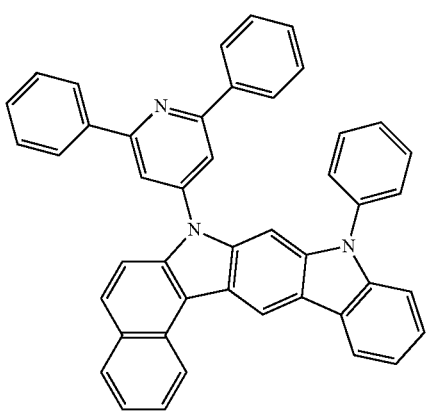

H47
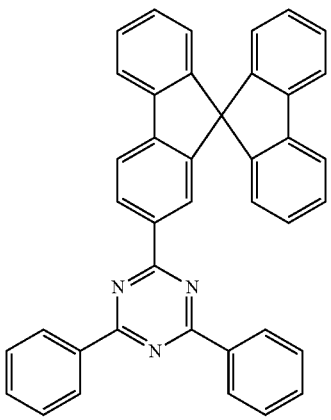

H48
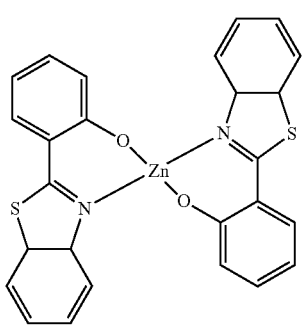

H49
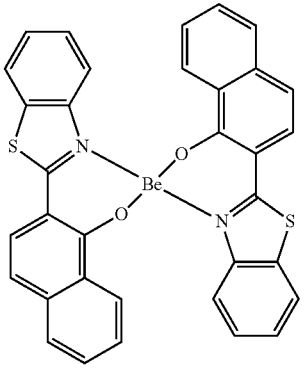

The dopant may be at least one selected from a fluorescent dopant and a phosphorescent dopant.

The phosphorescent dopant may include an organometallic complex represented by Formula 401 below:

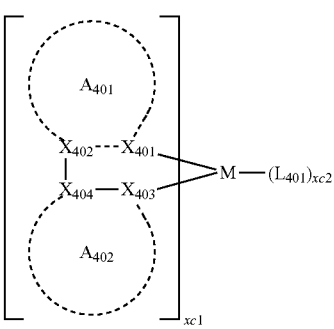

Formula 401 where in Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen or carbon;

$A_{401}$ and $A_{402}$ rings may be each independently selected from a substituted or unsubstituted benzene group, a substituted or unsubstituted naphthalene group, a substituted or unsubstituted fluorenene group, a substituted or unsubstituted spiro-fluorenene group, a substituted or unsubstituted indene group, a substituted or unsubstituted pyrrol group, a substituted or unsubstituted thiophene group, a substituted or unsubstituted furan group, a substituted or unsubstituted imidazole group, a substituted or unsubstituted pyrazole group, a substituted or unsubstituted thiazole group, a substituted or unsubstituted isothiazole group, a substituted or unsubstituted oxazole group, a substituted or unsubstituted isoxazole group, a substituted or unsubstituted pyridine group, a substituted or unsubstituted pyrazine group, a substituted or unsubstituted pyrimidine group, a substituted or unsubstituted pyridazine group, a substituted or unsubstituted quinoline group, a substituted or unsubstituted isoquinoline group, a substituted or unsubstituted benzoquinoline group, a substituted or unsubstituted quinoxaline group, a substituted or unsubstituted quinazoline group, a substituted or unsubstituted carbazol group, a substituted or unsubstituted benzoimidazole group, a substituted or unsubstituted benzofuran group, a substituted or unsubstituted benzothiophene group, a substituted or unsubstituted isobenzothiophene group, a substituted or unsubstituted benzooxazole group, a substituted or unsubstituted isobenzooxazole group, a substituted or unsubstituted triazole group, a substituted or unsubstituted oxadiazole group, a substituted or unsubstituted triazine group, a substituted or unsubstituted dibenzofuran group, and a substituted or unsubstituted dibenzothiophene group; and at least one substituent of the substituted benzene group, substituted naphthalene group, substituted fluorenene group, substituted spiro-fluorenene group, substituted indene group, substituted pyrrol group, substituted thiophene group, substituted furan group, substituted imidazole group, substituted pyrazole group, substituted thiazole group, substituted isothiazole group, substituted oxazole group, substituted isoxazole group, substituted pyridine group, substituted pyrazine group, substituted pyrimidine group, substituted pyridazine group, substituted quinoline group, substituted isoquinoline group, substituted benzoquinoline group, substituted quinoxaline group, substituted quinazoline group, substituted carbazol group, substituted benzoimidazole group, substituted benzofuran group, substituted benzothiophene group, substituted isobenzothiophene group, substituted benzooxazole group, substituted isobenzooxazole group, substituted triazole group, substituted oxadiazole group, substituted triazine group, substituted dibenzofuran group, and substituted dibenzothiophene group may be selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, a monovalent non-aromatic hetero-condensed polycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$); and $L_{401}$ is an organic ligand;

xc1 is 1, 2, or 3; and xc2 is 0, 1, 2, or 3.

$L_{401}$ may be a monovalent, divalent, or trivalent organic ligand. For example, $L_{401}$ may be selected from a halogen ligand (for example, Cl or F), a diketone ligand (for example, acetylacetonate, 1,3-diphenyl-1,3-propandionate, 2,2,6,6-tetramethyl-3,5-heptandionate, or hexafluoroacetonate), a carboxylic acid ligand (for example, picolinate, dimethyl-3-pyrazolecarboxylate, or benzoate), a carbon monooxide ligand, an isonitrile ligand, a cyano ligand, and a phosphorous ligand (for example, phosphine, phosphite and phosphate), but $L_{401}$ is not limited thereto.

When $A_{401}$ in Formula 401 has two or more substituents, the substituents of $A_{401}$ may bind to each other (e.g., combine) to form a saturated or unsaturated ring.

When $A_{401}$ in Formula 402 has two or more substituents, the substituents of $A_{402}$ may bind to each other (e.g., combine) to form a saturated or unsaturated ring.

When xc1 in Formula 401 is two or more, a plurality of ligands

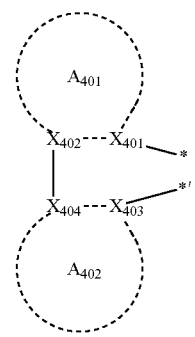

in Formula 401 may be identical or different, where * and *' each indicate a binding site to M. When xc1 in Formula 401 is two or more, $A_{401}$ and $A_{402}$ may be respectively directly connected to $A_{401}$ and $A_{402}$ of other neighboring ligands with or without a linker (for example, a $C_1$-$C_5$ alkylene, or —N(R')— (where R' may be a $C_1$-$C_{10}$ alkyl group or a $C_6$-$C_{20}$ aryl group) or —C(=O)—) therebetween.

The phosphorescent dopant may include at least one of Compounds PD1 to PD74 below, but the phosphorescent dopant is not limited thereto:

PD1 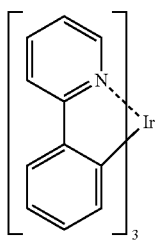
PD2 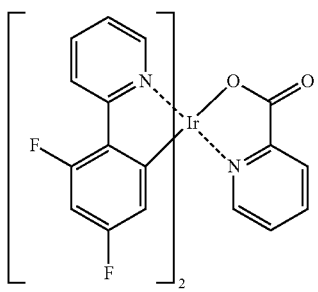
PD3 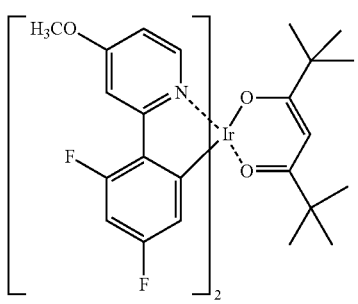
PD4 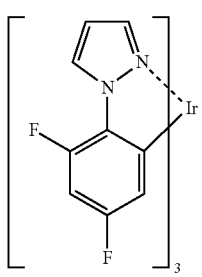
PD5 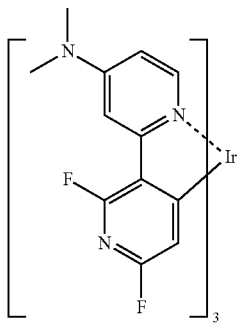
-continued
PD6 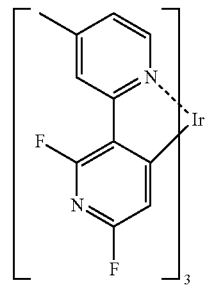
PD7 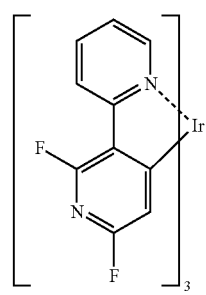
PD8 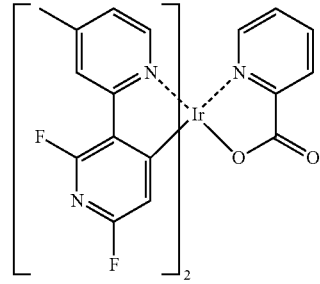
PD9 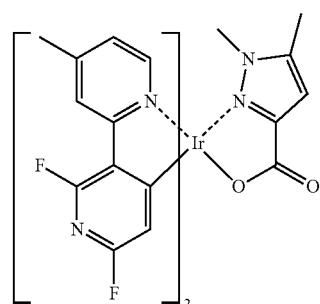
PD10 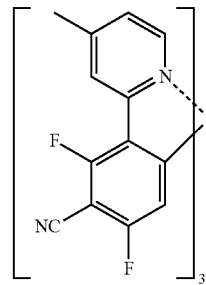

-continued
PD11 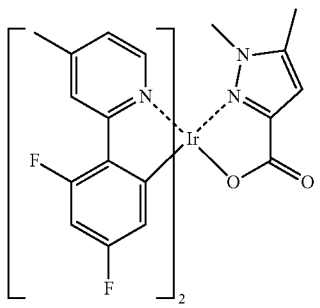
PD12 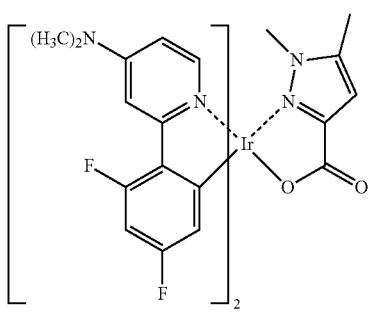
PD13 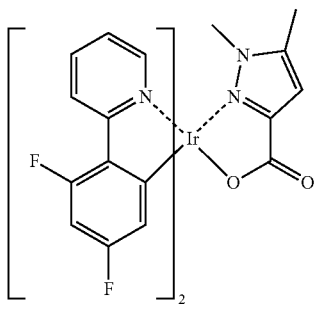
PD14 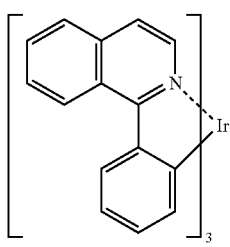
PD15 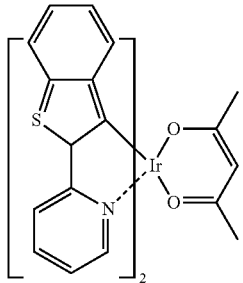
PD16 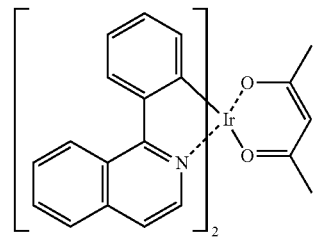
PD17 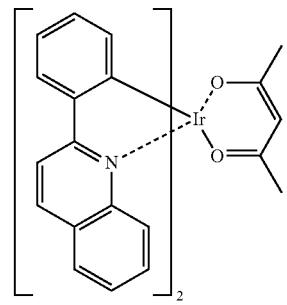
PD18
PD19
PD20 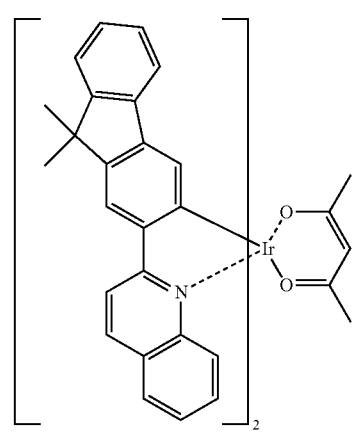

-continued
PD21
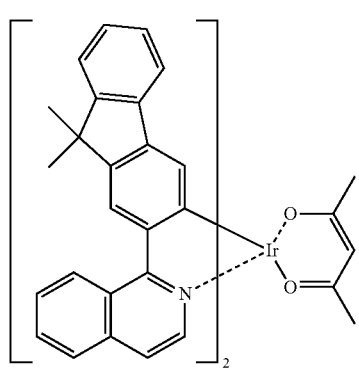
PD22
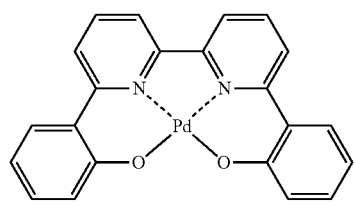
PD23
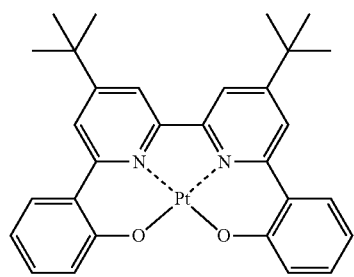
PD24
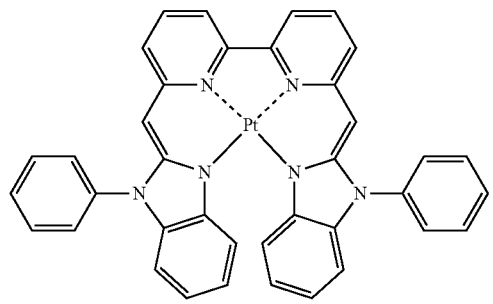
PD25
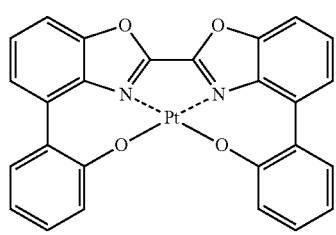
PD26
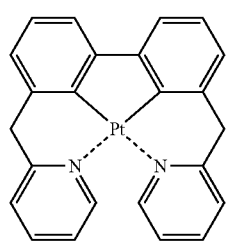
-continued
PD27
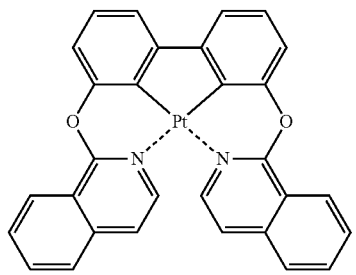
PD28
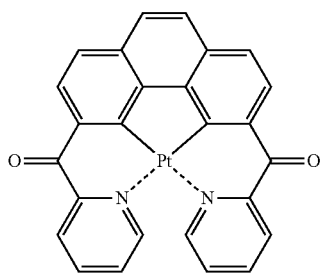
PD29
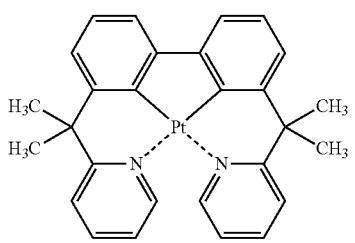
PD30
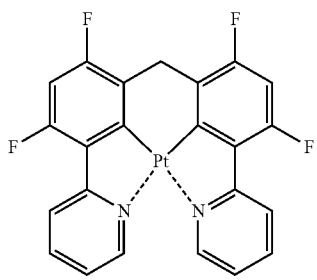
PD31
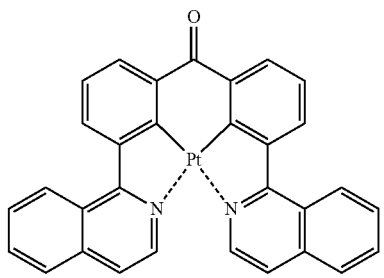
PD32
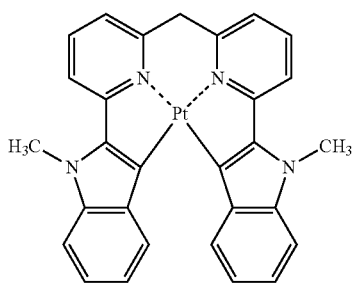

-continued
PD33 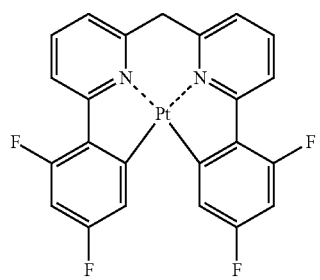
PD34 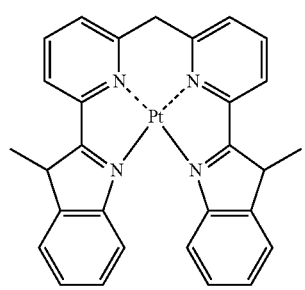
PD35 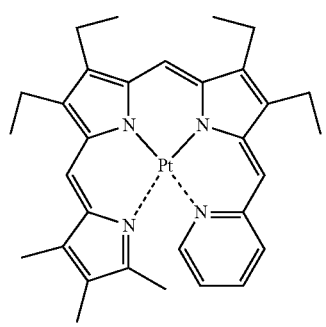
PD36 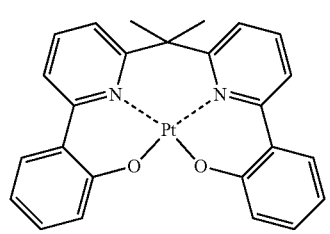
PD37 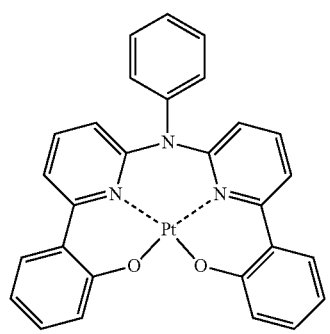
-continued
PD38 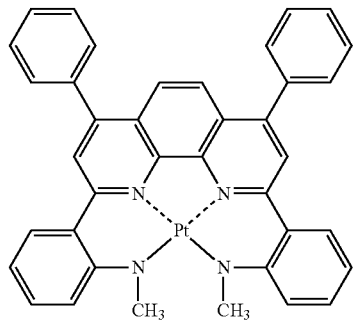
PD39 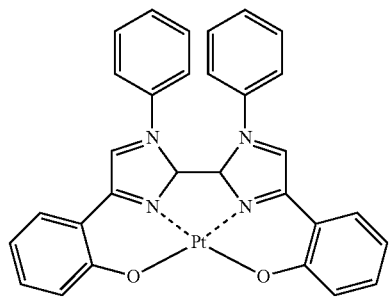
PD40 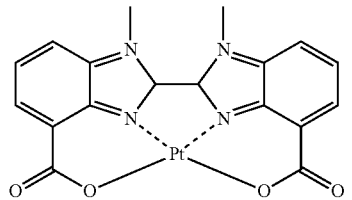
PD41 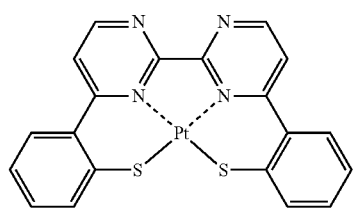
PD42 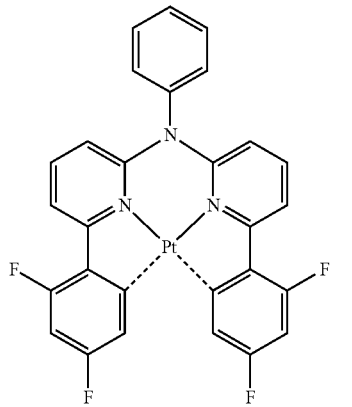

PD43 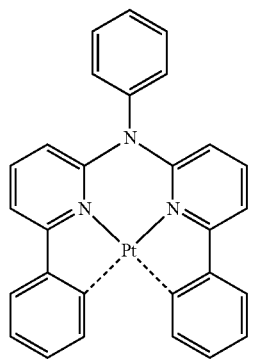
PD44 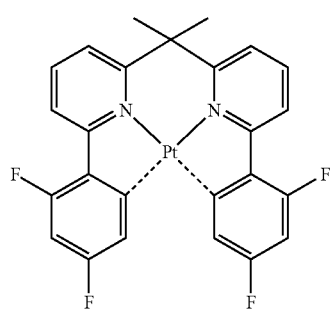
PD45 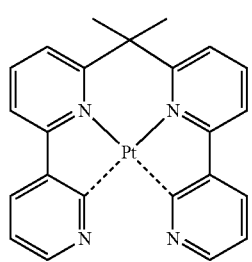
PD46 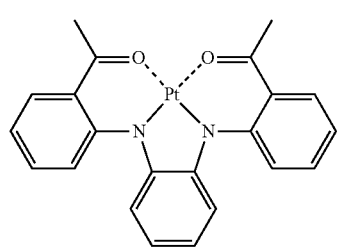
PD47 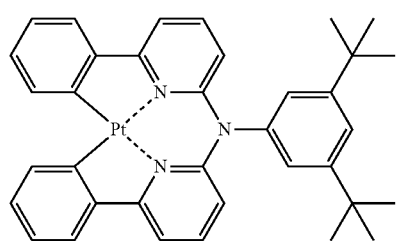
PD48 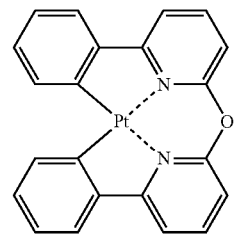
PD49 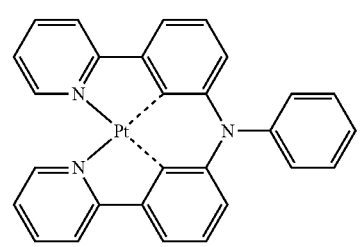
PD50 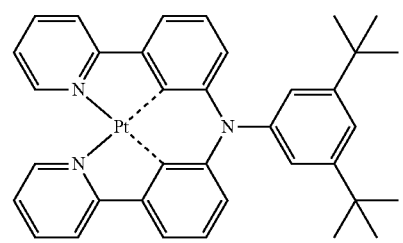
PD51 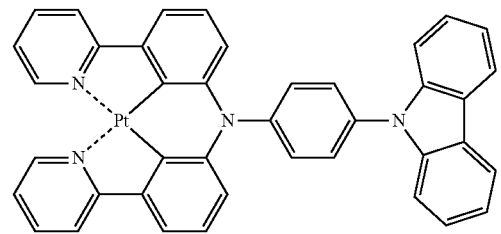
PD52 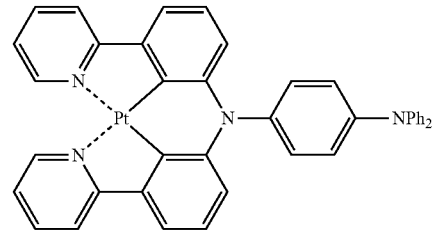
PD53

107
-continued
PD54
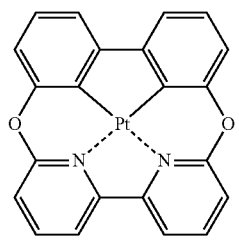
PD55
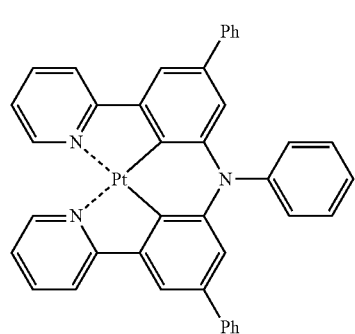
PD56
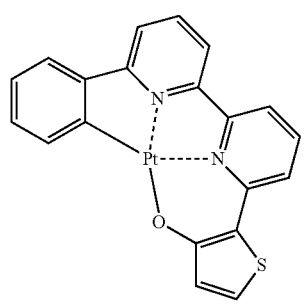
PD57
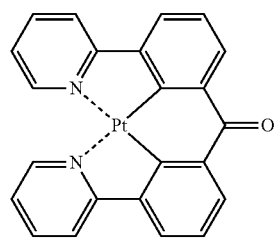
PD58
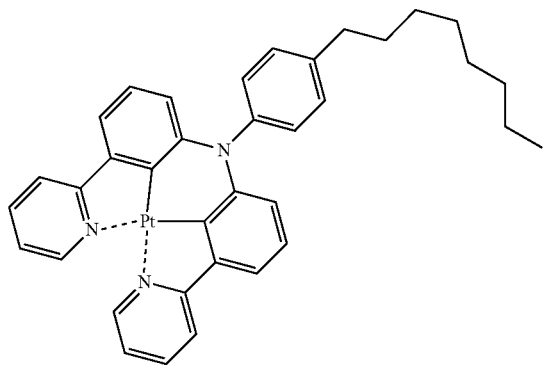
108
-continued
PD59
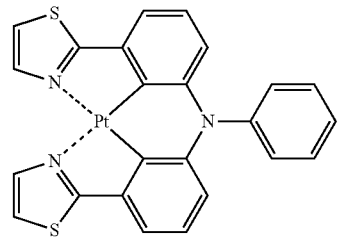
PD60
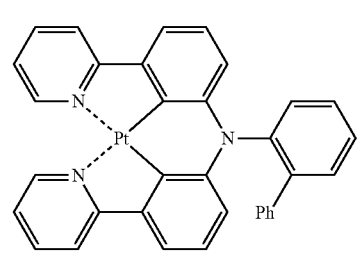
PD61
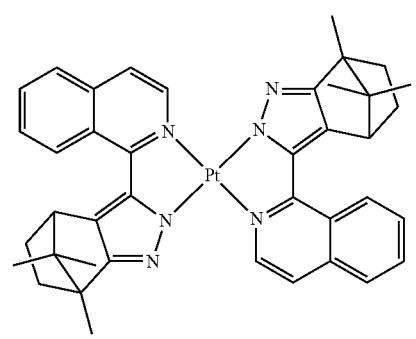
PD62
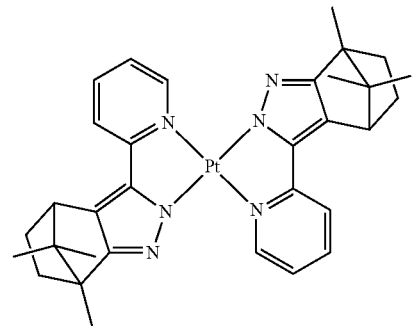
PD63
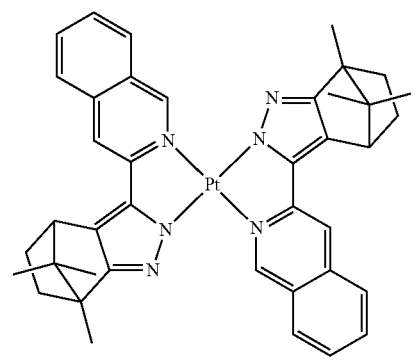

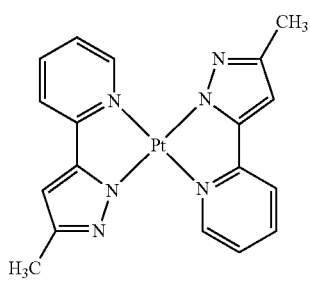
PD64
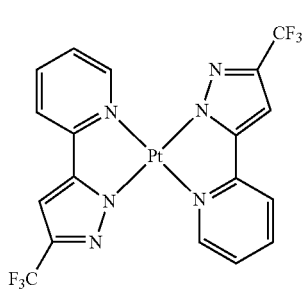
PD65
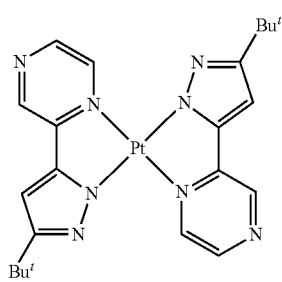
PD66
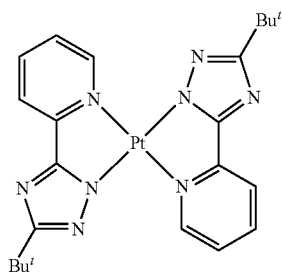
PD67
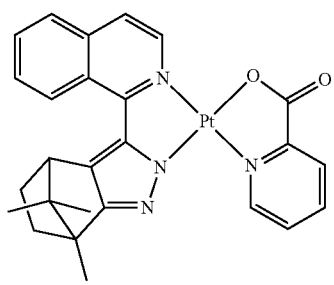
PD68
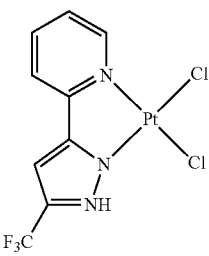
PD69
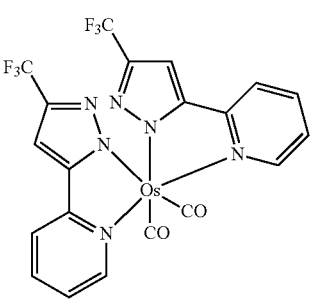
PD70
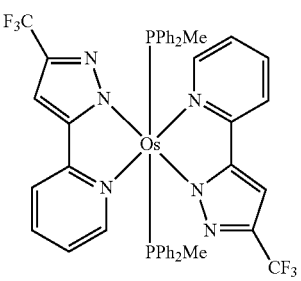
PD71
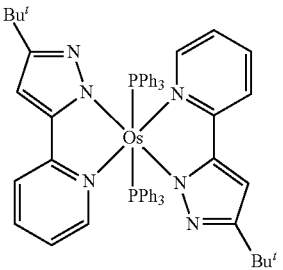
PD72
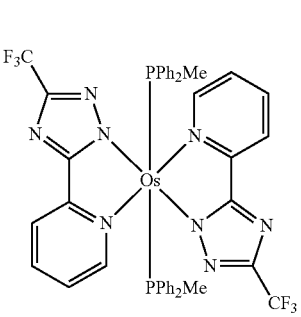
PD73

111
-continued
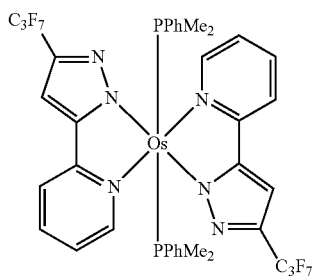
PD74
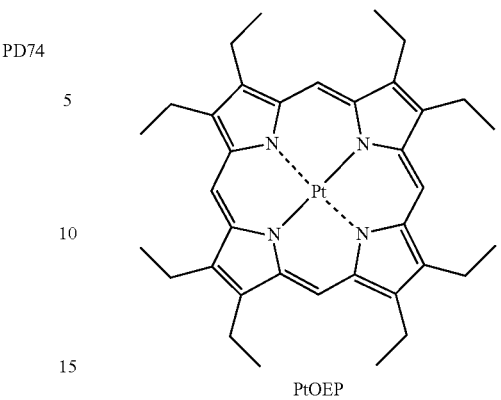
PtOEP
According to another embodiment of the present disclosure, the phosphorescent dopant may include PtOEP:
The fluorescent dopant may include at least one selected from DPAVBi, BDAVBi, TBPe, DCM, DCJTB, Coumarin 6, and C545T, but the fluorescent dopant is not limited thereto.
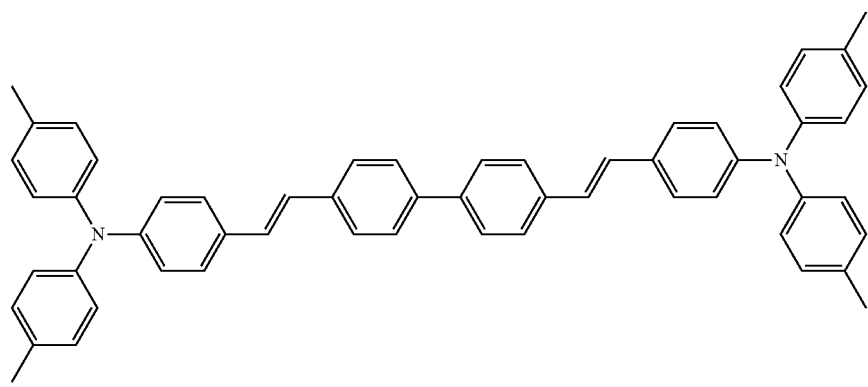
DPAVBi
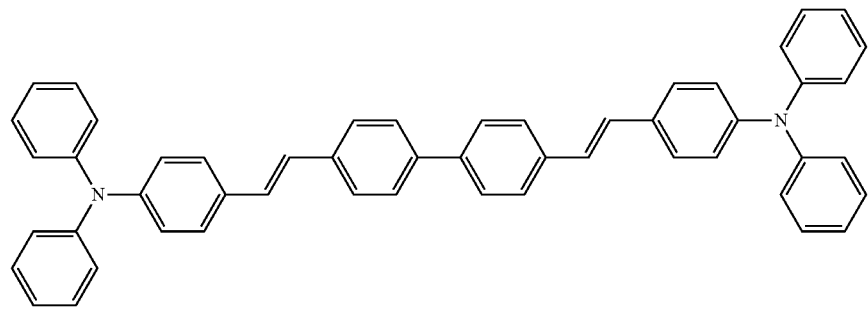
BDAVBi
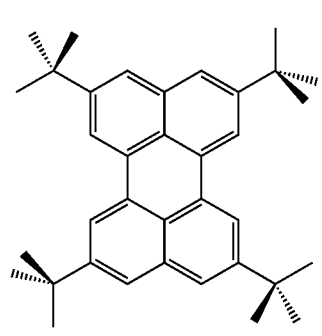
TBPe
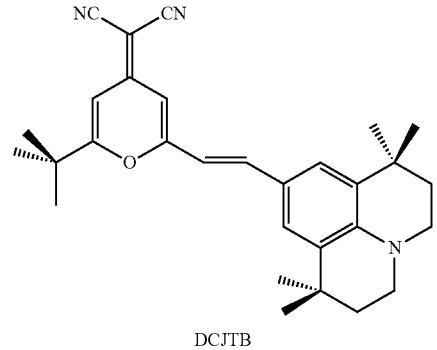
DCM  DCJTB

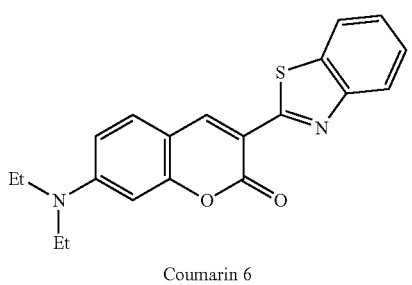

Coumarin 6

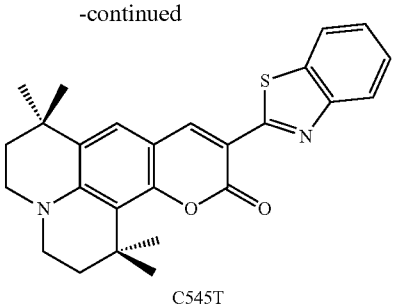

C545T

According to another embodiment of the present disclosure, the fluorescent dopant may include a compound represented by Formula 501 below.

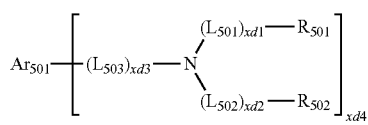

Formula 501 where in Formula 501,

Ar$_{501}$ may be selected from:

a naphthalene group, a heptalene group, a fluorenene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group;

a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, and —Si(Q$_{501}$)(Q$_{502}$)(Q$_{503}$) (where Q$_{501}$ to Q$_{503}$ are each independently selected from a hydrogen atom, a $C_1$-$C_{60}$ alkyl group, a $C_2$-$C_{60}$ alkenyl group, a $C_6$-$C_{60}$ aryl group, and a $C_1$-$C_{60}$ heteroaryl group);

L$_{501}$ to L$_{503}$ may be understood by referring to the description above in connection with L$_{201}$;

R$_{501}$ and R$_{502}$ are each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and xd1 to xd3 may be each independently selected from 0, 1, 2, and 3; and xd4 may be selected from 1, 2, 3, and 4.

The fluorescent host may include at least one of Compounds FD1 to FD14:

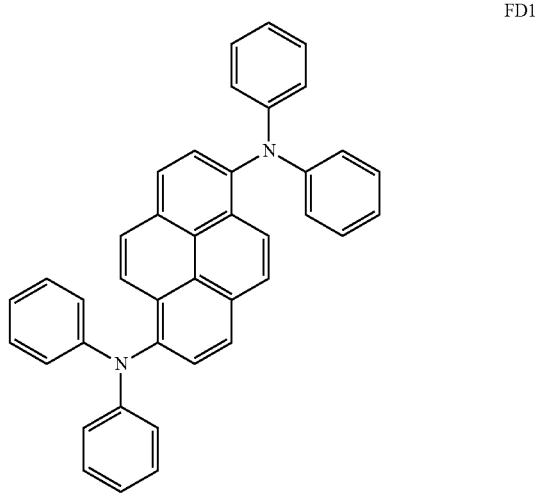

FD1

FD2
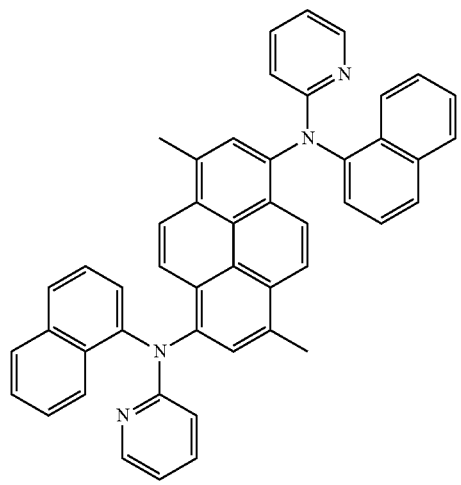
FD3
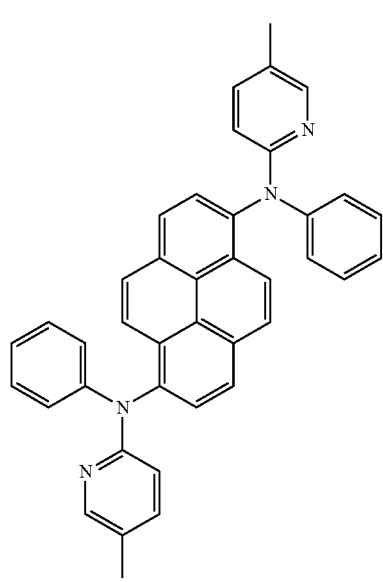
FD4
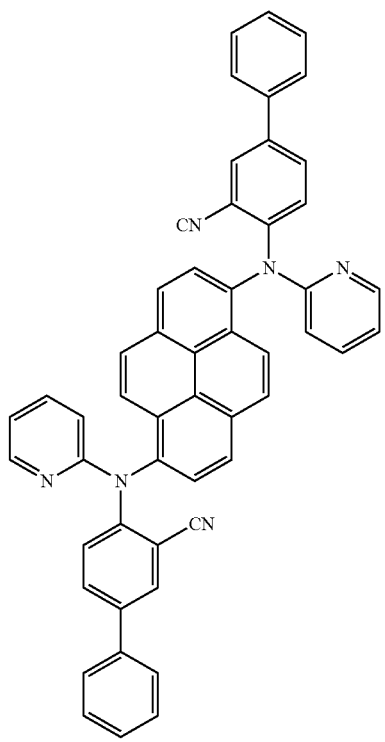
FD5
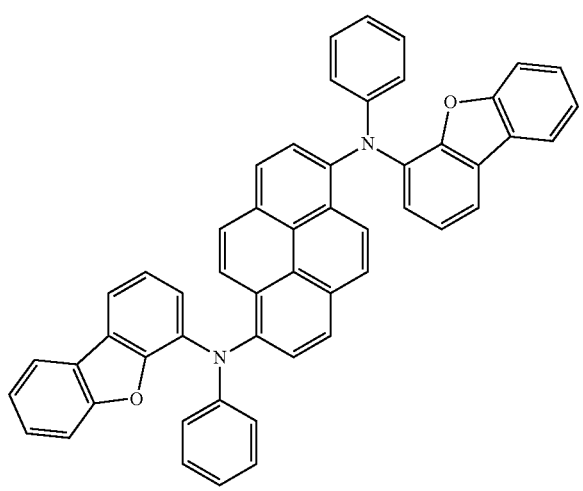

FD6
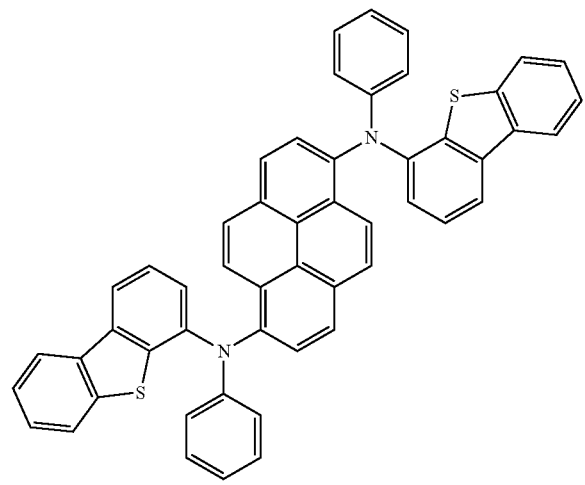
FD7
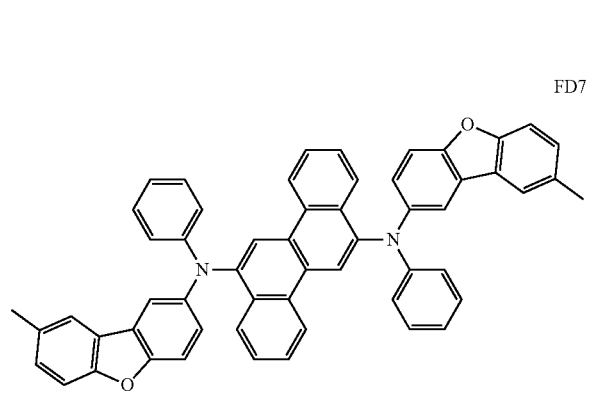
FD8
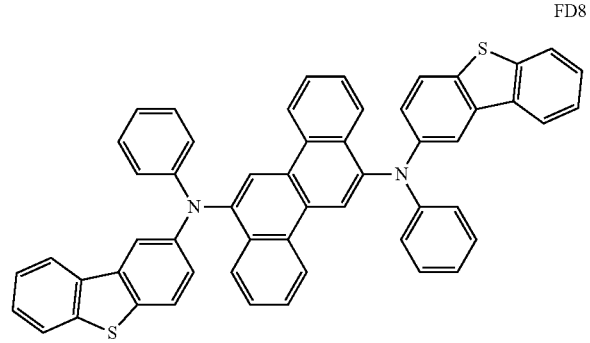
FD9
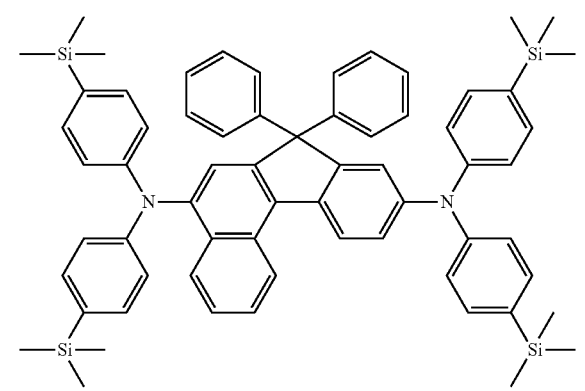
FD10
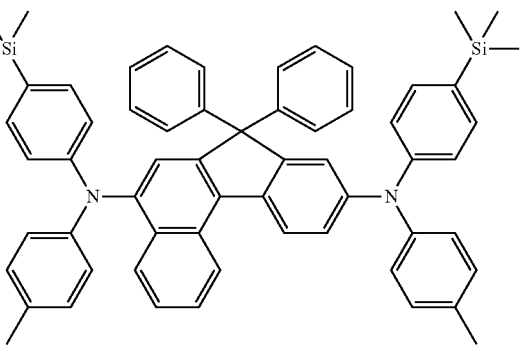
FD11
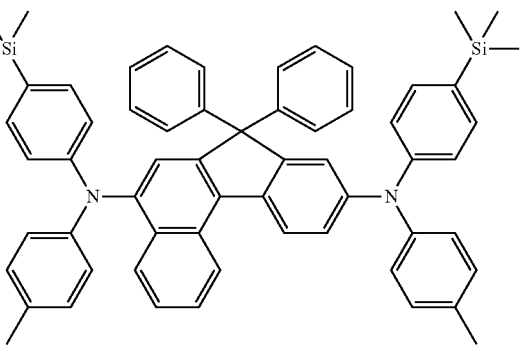
FD12
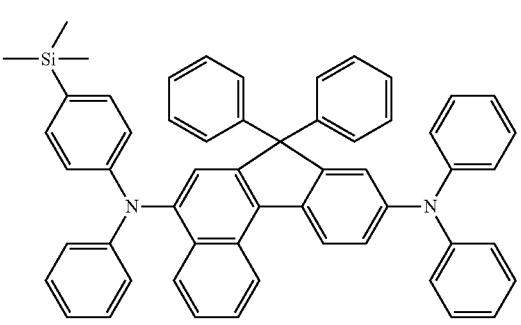
FD13
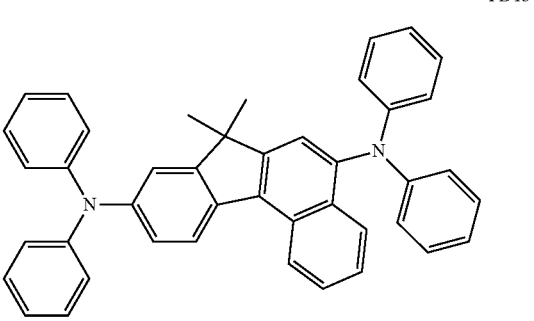

-continued

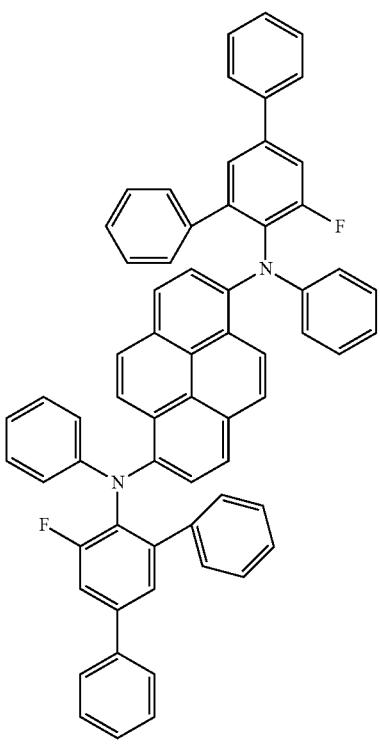

FD14

An amount of the dopant in the emission layer may be, in general, in a range of about 0.01 to about 15 parts by weight based on 100 parts by weight of the host, but the dopant is not limited thereto.

A thickness of the emission layer may be in a range of about 100 Å to about 1,000 Å, for example, about 200 Å to about 600 Å. When the thickness of the emission layer is within any of these ranges, excellent light-emission characteristics may be obtained without a substantial increase in driving voltage.

Then, an electron transport region may be on the emission layer.

The electron transport region may include at least one selected from a hole blocking layer, an electron transport layer (ETL), and an electron injection layer, but the electron transport region is not limited thereto.

For example, the electron transport region may have a structure of electron transport layer/electron injection layer or a structure of hole blocking layer/electron transport layer/electron injection layer, where layers of each structure are sequentially stacked from the emission layer in the stated order, but the electron transport region is not limited thereto.

According to an embodiment of the present disclosure, the organic layer 150 of the organic light-emitting device includes an electron transport region between the emission layer and the second electrode 190, where the electron transport region includes the organic compound represented by Formula 1.

The electron transport region may include a hole blocking layer. The hole blocking layer may be formed, when the emission layer includes a phosphorescent dopant, to prevent (or reduce) diffusion of excitons or holes into an electron transport layer.

When the electron transport region includes a hole blocking layer, the hole blocking layer may be formed on the emission layer by using various methods, such as vacuum deposition, spin coating casting, a Langmuir-Blodgett (LB) method, ink-jet printing, laser-printing, or laser-induced thermal imaging, but the hole blocking layer is not limited thereto. When the hole blocking layer is formed by vacuum deposition or spin coating, deposition and coating conditions for the hole blocking layer may be determined by referring to the deposition and coating conditions for the hole injection layer.

The hole blocking layer may include, for example, at least one of BCP and Bphen, but is not limited thereto.

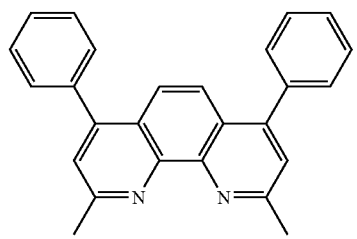

BCP

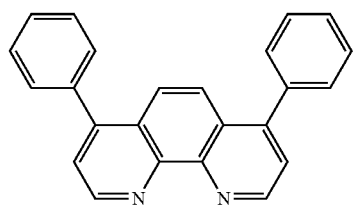

Bphen

A thickness of the hole blocking layer may be in a range of about 20 Å to about 1,000 Å, for example, about 30 Å to about 300 Å. When the thickness of the hole blocking layer is within any of these ranges, the hole blocking layer may have excellent hole blocking characteristics without a substantial increase in driving voltage.

The electron transport region may include an electron transport layer. The electron transport layer may be formed on the emission layer or the hole blocking layer by using various methods, such as vacuum deposition, spin coating casting, a LB method, ink-jet printing, laser-printing, or laser-induced thermal imaging, but the electron transport layer is not limited thereto. When an electron transport layer is formed by vacuum deposition or spin coating, deposition and coating conditions for the electron transport layer may be determined by referring to the deposition and coating conditions for the hole injection layer.

According to an embodiment of the present disclosure, the organic layer 150 of the organic light-emitting device includes an electron transport region disposed between the emission layer and the second electrode 190, where the electron transport region includes an electron transport layer, and the electron transport layer includes the organic compound represented by Formula 1.

The electron transport layer may further include, in addition to the organic compound represented by Formula 1, at least one selected from BCP, Bphen, and Alq$_3$, Balq, TAZ, and NTAZ, which are illustrated below.

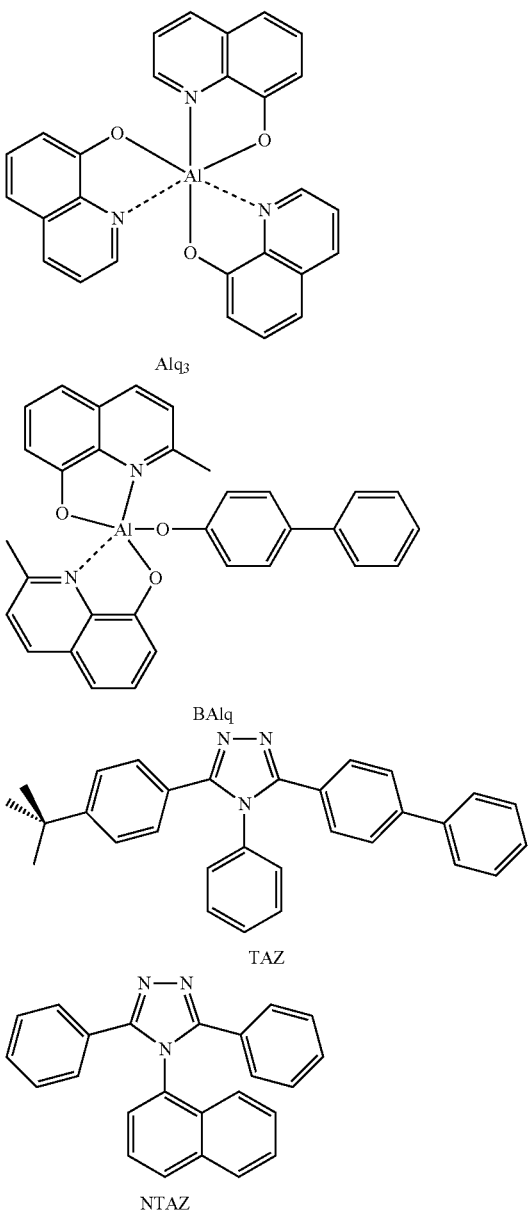

Alq3

BAlq

TAZ

NTAZ

According to another embodiment of the present disclosure, the electron transport layer may further include, the organic compound represented by Formula 1, at least one of compounds represented by Formula 601 below:

Ar$_{601}$-[(L$_{601}$)$_{xe1}$-E$_{601}$]$_{xe2}$    Formula 601 where in Formula 601,

Ar$_{601}$ may be selected from:

a naphthalene group, a heptalene group, a fluorenene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group; and a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_3$-C$_{10}$ heterocycloalkyl group, a C$_3$-C$_{10}$ cycloalkenyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a non-aromatic condensed polycyclic group, and —Si(Q$_{301}$)(Q$_{302}$)(Q$_{303}$) (where Q$_{301}$ to Q$_{303}$ are each independently selected from a hydrogen atom, a C$_1$-C$_{60}$ alkyl group, a C$_2$-C$_{60}$ alkenyl group, a C$_6$-C$_{60}$ aryl group, and a C$_1$-C$_{60}$ heteroaryl group);

L$_{601}$ may be understood by referring to the description above in connection with L$_{201}$;

E$_{601}$ may be selected from:

a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, and a dibenzothiophenyl group; and xe1 may be selected from 0, 1, 2, and 3; and
xe2 may be selected from 1, 2, 3, and 4.

According to another embodiment of the present disclosure, the electron transport layer may further include, the organic compound represented by Formula 1, at least one of compounds represented by Formula 602 below:

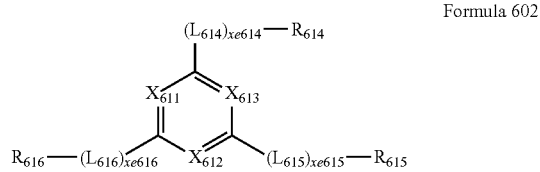

Formula 602 where in Formula 602,
$X_{611}$ is N or C-$(L_{611})_{xe611}$-$R_{611}$, $X_{612}$ is N or C-$(L_{612})_{xe612}$-$R_{612}$, $X_{613}$ is N or C-$(L_{613})_{xe613}$-$R_{613}$ and, at least one of $X_{611}$ to $X_{613}$ is N;
$L_{611}$ to $L_{616}$ may be understood by referring to the description above in connection with $L_{201}$;
$R_{611}$ and $R_{616}$ may be each independently selected from:
a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and
a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may include at least one of Compounds ET1 to ET16 below.

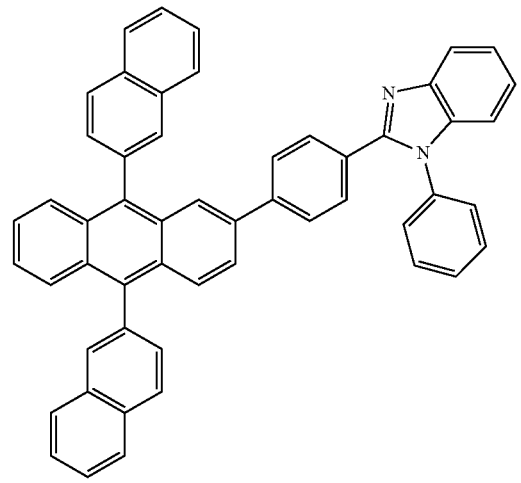

ET1

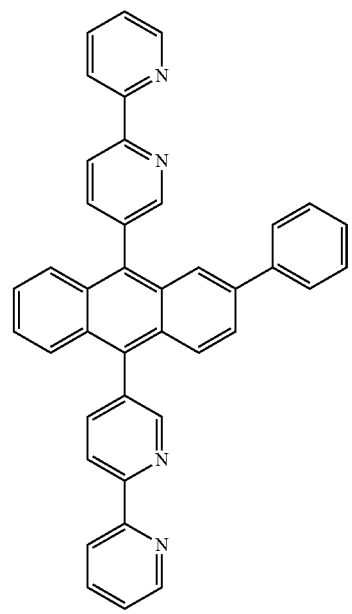

ET2

ET3
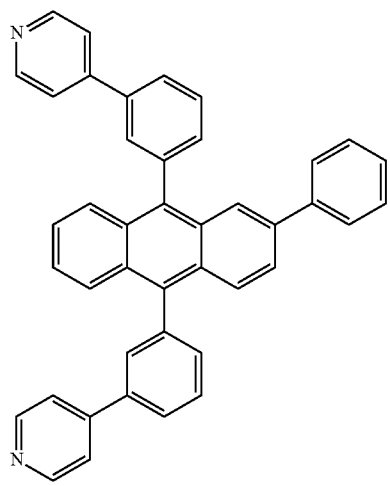
ET6
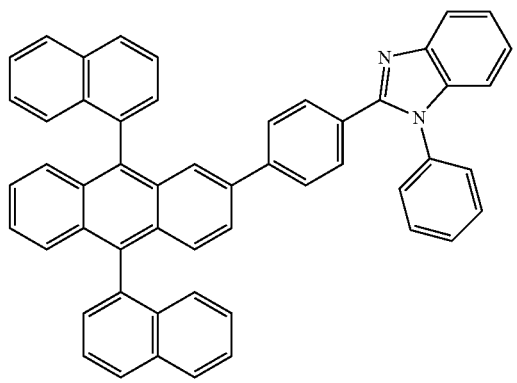
ET4
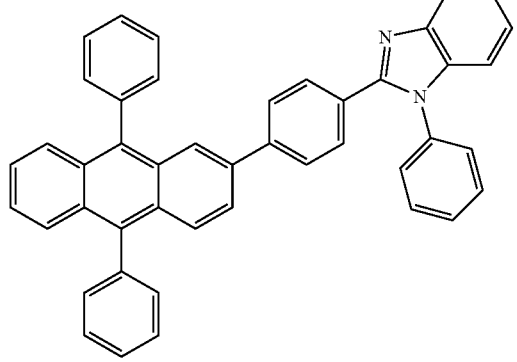
ET7
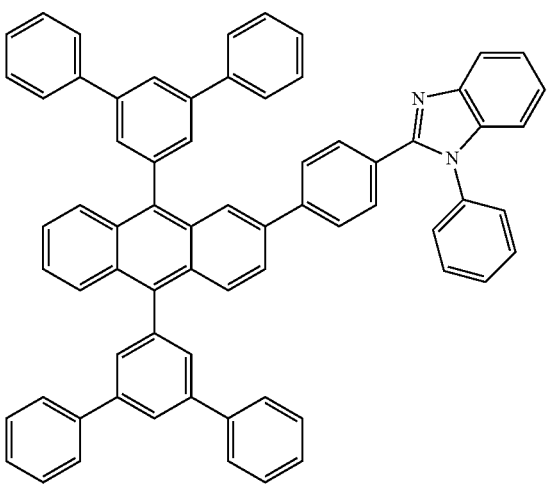
ET5
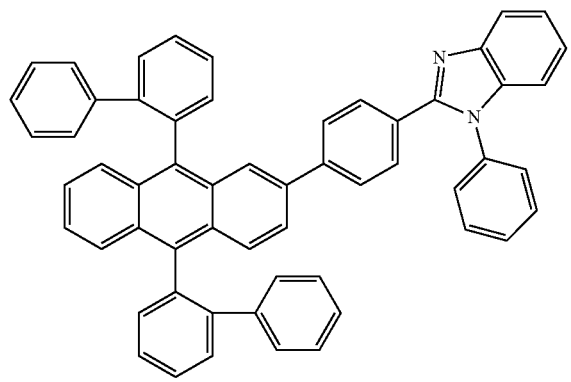
ET8
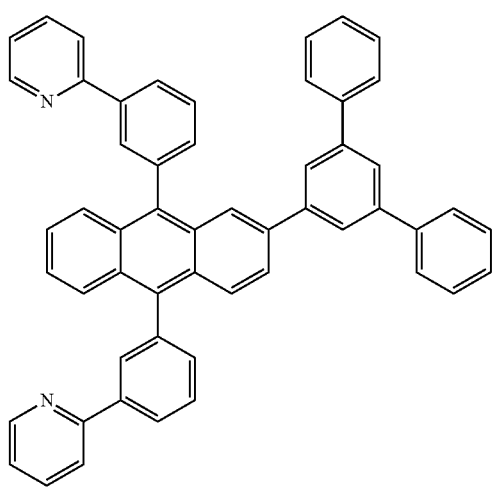

ET9
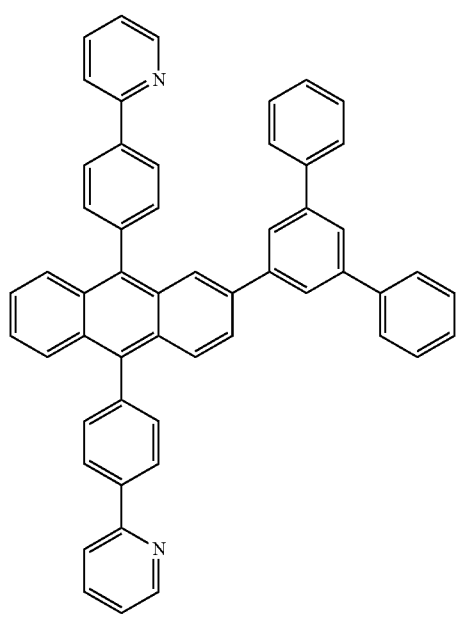
ET11
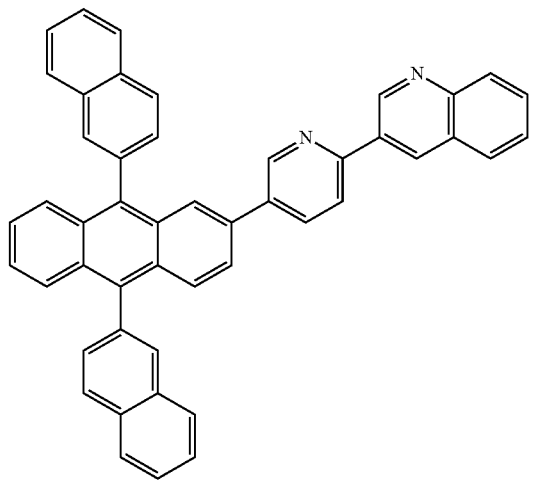
ET12
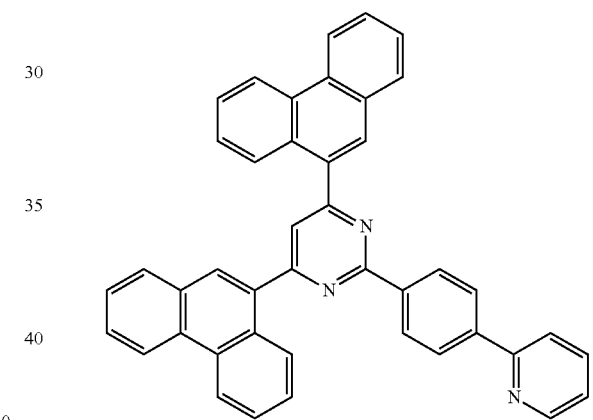
ET10
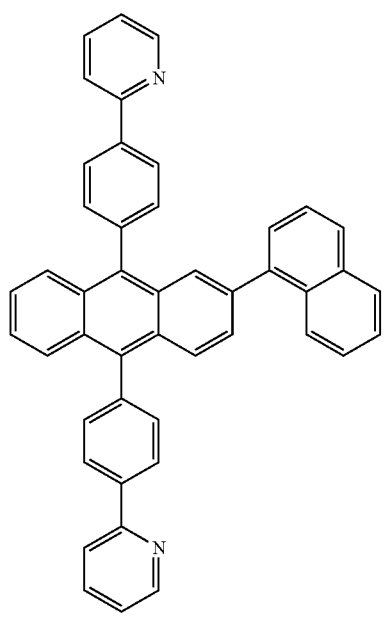
ET13
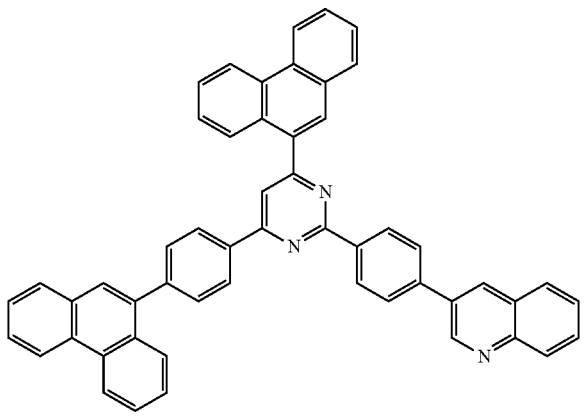

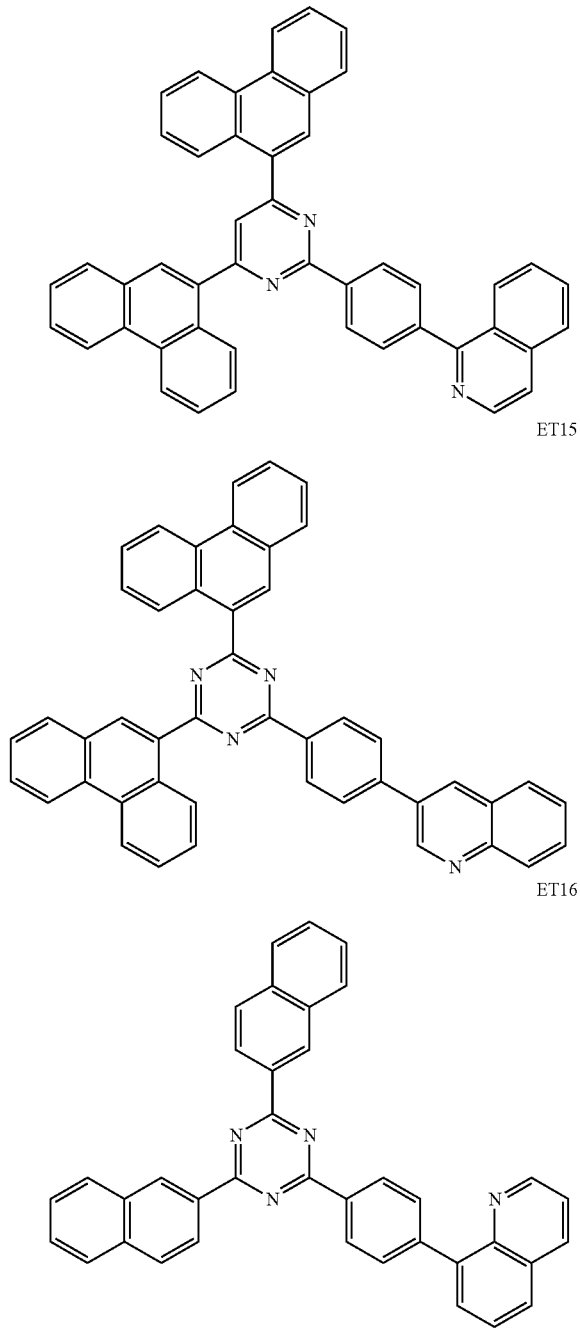

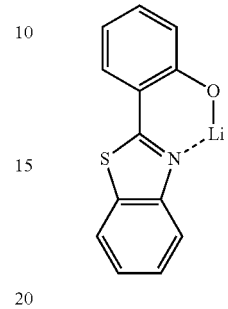

A thickness of the electron transport layer may be in a range of about 100 Å to about 1,000 Å, for example, about 150 Å to about 500 Å. When the thickness of the ETL is within any of the ranges described above, the ETL may have satisfactory (e.g., suitable) electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

The electron transport region may include an electron injection layer that allows electrons to be easily provided from the second electrode 190.

The electron injection layer may be formed on the electron transport layer by using (utilizing) various methods, such as vacuum deposition, spin coating casting, a LB method, ink-jet printing, laser-printing, or laser-induced thermal imaging, but the electron injection layer is not limited thereto. When an electron injection layer is formed by vacuum deposition or spin coating, deposition and coating conditions for the electron injection layer may be determined by referring to the deposition and coating conditions for the hole injection layer.

The electron injection layer may include at least one selected from, LiF, NaCl, CsF, $Li_2O$, BaO, and LiQ.

A thickness of the electron injection layer may be in a range of about 1 Å to about 100 Å, for example, about 3 Å to about 90 Å. When the thickness of the EIL is within any of the ranges described above, the EIL may have satisfactory (e.g., suitable) electron transport characteristics without a substantial increase in driving voltage.

The second electrode is on the organic layer 130 having such a structure. The second electrode 190 may be a cathode which is an electron injection electrode, and in this regard, a material for the second electrode 190 may be metal, an alloy, an electrically conductive compound, and a mixture thereof, which have a relatively low work function. Examples of the second electrode 190 include lithium (Li), magnesium (Mg), aluminum (Al), aluminum-lithium (Al—Li), calcium (Ca), magnesium-indium (Mg—In), and magnesium-silver (Mg—Ag). According to another embodiment of the present disclosure, the material for forming the second electrode 190 may be ITO or IZO. The second electrode 190 may be a reflective electrode, a semi-transmissive electrode, or a transmissive electrode.

Hereinbefore, the organic light-emitting device has been described with reference to the accompanying drawing, but the present disclosure is not limited thereto.

A $C_1$-$C_{60}$ alkyl group used herein refers to a linear or branched aliphatic hydrocarbon monovalent group having 1 to 60 carbon atoms, and examples thereof include a methyl, an ethyl, a propyl, an isobutyl, a sec-butyl, a ter-butyl, a pentyl, an iso-amyl, and a hexyl. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (where $A_{101}$ is the $C_1$-$C_{60}$ alkyl), and examples thereof include a methoxy group, an ethoxy group, and an isopropyloxy group.

A $C_2$-$C_{60}$ alkenyl group used herein refers to a hydrocarbon group formed by substituting at least one carbon double bond in a middle or terminal portion of the $C_2$-$C_{60}$ alkyl group, and examples thereof include an ethenyl group, a prophenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group formed by substituting at least one carbon trip bond in a middle or terminal portion of the $C_2$-$C_{60}$ alkyl group, and examples thereof include an ethynyl group, and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers to a monovalent hydrocarbon monocyclic group having 3 to 10 carbon atoms, and examples thereof include a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_3$-$C_{10}$ heterocycloalkyl group used herein refers to a monovalent monocyclic group having at least one hetero atom selected from N, O, P, and S as a ring-forming atom and 3 to 10 carbon atoms, and examples thereof include a tetrahydrofuranyl group, and a tetrahydrothiophenyl group. A $C_3$-$C_{10}$ heterocycloalkylene group used herein refers to a divalent group having the same structure as the $C_3$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromaticity, and examples thereof include a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_3$-$C_{10}$ heterocycloalkenyl group used herein refers to a monovalent monocyclic group that has at least one hetero atom selected from N, O, P, and S as a ring-forming atom, 3 to 10 carbon atoms, and at least one double bond in its ring. Examples of the $C_3$-$C_{10}$ heterocycloalkenyl group include a 2,3-hydrofuranyl group and a 2,3-hydrothiophenyl group. A $C_3$-$C_{10}$ heterocycloalkenylene group used herein refers to a divalent group having the same structure as the $C_3$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined).

A $C_1$-$C_{60}$ heteroaryl group used herein refers to a monovalent group having a carbocyclic aromatic system that has at least one hetero atom selected from N, O, P, and S as a ring-forming atom, and 1 to 60 carbon atoms. A $C_1$-$C_{60}$ heteroarylene group used herein refers to a divalent group having a carbocyclic aromatic system that has at least one hetero atom selected from N, O, P, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl and the $C_1$-$C_{60}$ heteroarylene each include two or more rings, the rings may be fused to each other (e.g., combined).

A $C_6$-$C_{60}$ aryloxy group used herein indicates —$OA_{102}$ (where $A_{102}$ is the $C_6$-$C_{60}$ aryl group), and a $C_6$-$C_{60}$ arylthio group used herein indicates —$SA_{103}$ (where $A_{103}$ is the $C_6$-$C_{60}$ aryl).

A non-aromatic condensed polycyclic group used herein refers to a monovalent group that has two or more rings condensed to each other (e.g., combined together), and non-aromaticity in the entire molecular structure. The non-aromatic condensed polycyclic group may include as a ring-forming atom i) only C, or a heteroatom selected from N, O, P, and S, other than C. Examples of the non-aromatic condensed polycyclic group include fluorenyl and carbazolyl. A divalent non-aromatic condensed polycyclic group used herein refers to a divalent group having the same structure as the monovalent non-aromatic condensed polycyclic group.

The term "Ph" used herein refers to a phenyl group, the term "Me" used herein refers to methyl, the term "Et" used herein refers to ethyl, and the term "ter-Bu" or "But" used herein refers to tert-butyl.

Hereinafter, an organic light-emitting device according to embodiments of the present disclosure will be described with reference to Synthesis Examples and Examples. The wording "B was used instead of A" used in describing Synthesis Examples indicates that a molar equivalent of A was identical to a molar equivalent of B.

EXAMPLE

Synthesis Example 1

Synthesis of Compound 4

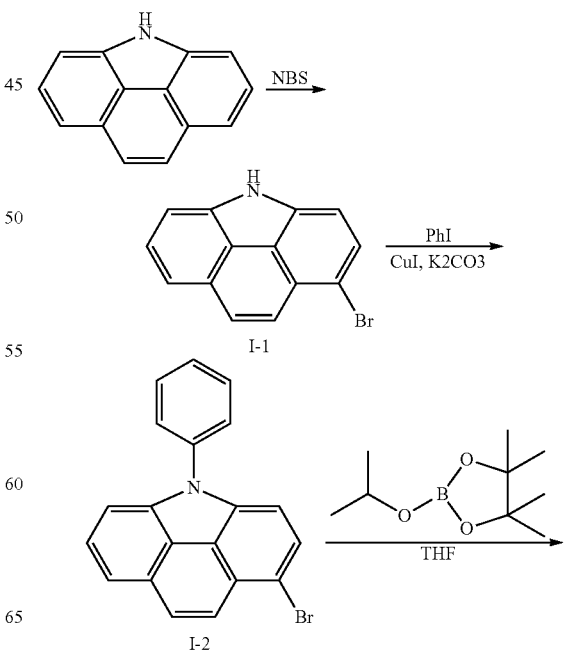

-continued

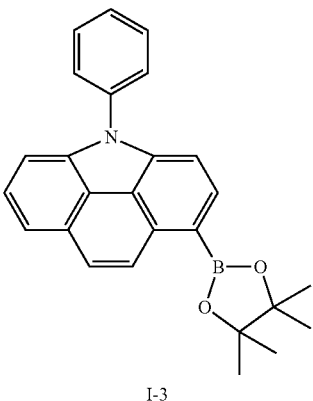

I-3

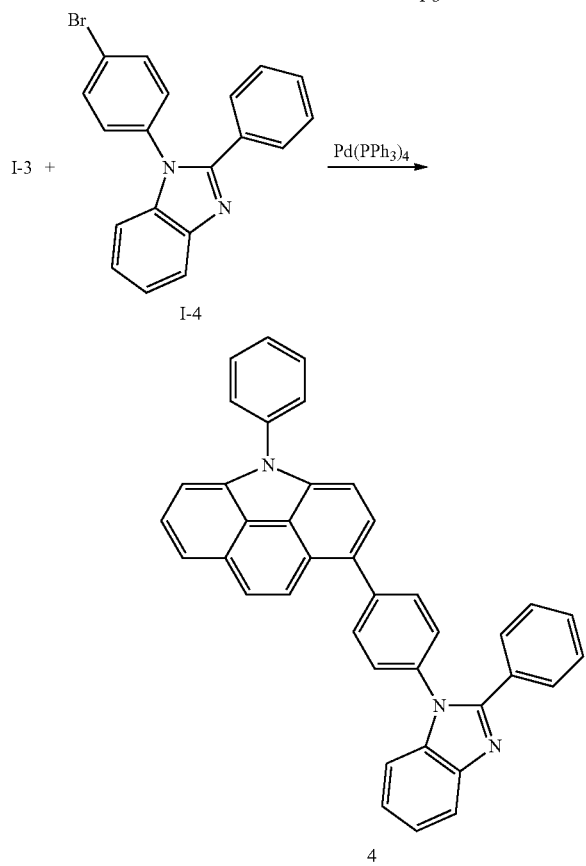

Synthesis of Intermediate I-1

1.91 g (10.0 mmol) of 6H-benzo[def]carbazole was completely dissolved in 60 mL of carbon tetrachloride ($CCl_4$), and 1.78 g (10.0 mmol) of N-bromosuccinimide was added thereto, and the mixture was stirred at a temperature of 80° C. for 30 minutes. The reaction solution was cooled to room temperature, and then, stirred for 30 minutes to precipitate crystals. The crystals were collected by decompression-filtration (e.g., vacuum-filtration) and washed with methanol to obtain 1.1 g (yield of 45%) of Intermediate I-1, which was white crystals. The obtained compound was identified by liquid chromatography-mass spectrometry (LC-MS).

$C_{14}H_8BrN$: $M^+$ 269.0

Synthesis of Intermediate I-2

2.7 g (10.0 mmol) of Intermediate I-1, 2.5 g (12.0 mmol) of iodobenzene, 0.2 g (1.0 mmol) of 1,10-phenanthroline, 0.2 g (2.0 mmol) of CuI, and 4.1 g (30.0 mmol) of $K_2CO_3$ were dissolved in 30 mL of N,N-dimethylformamide (DMF), and then, the mixture was stirred at a temperature of 80° C. for 24 hours. The reaction solution was cooled to room temperature, and then extracted three times with 30 mL of water and 40 mL of diethylether. A collected organic layer was dried by using magnesium sulfate, and then, the residual obtained by evaporating a solvent therefrom was separation-purified by silica gel column chromatography to obtain 3.07 g (yield of 89%) of Intermediate I-2. The obtained compound was identified by LC-MS.

$C_{20}H_{12}BrN$ $M^+$ 345.0

Synthesis of Intermediate I-3

10 g (28.8 mmol) of Intermediate I-2 was dissolved in 30 ml of THF, and then, at a temperature of −78° C., 10 ml (25.0 mmol, 2.5M in hexane) of n-BuLi was slowly dropped (e.g., added dropwise) thereto. At the same temperature, the mixture was stirred for one hour, and then, 9.3 g (50 mmol) of 2-isoproxy-4,4,5,5,-tetramethyl-1,3,2-dioxaborolane was slowly dropped (e.g., added dropwise) thereto, and the reaction solution was stirred at a temperature of −78° C. for 1 hour, and then, additionally stirred for 24 hours at room temperature. After the reaction was stopped, 50 mL of 10% HCl aqueous solution and 50 mL of $H_2O$ were added thereto, and then the resultant solution was extracted three times by using 80 mL of diethylether. A collected organic layer was dried by using magnesium sulfate, and then, the residual obtained by evaporating a solvent therefrom was separation-purified by silica gel column chromatography to obtain 8.49 g (yield of 75%) of Intermediate I-3. The obtained compound was identified by LC-MS.

$C_{26}H_{24}BNO_2$: M+ 393.2

Synthesis of Compound 4

23 g (11.0 mmol) of Intermediate I-3, 3.49 g (10.0 mmol) of Intermediate I-4, 0.06 g (0.5 mmol) of $Pd(PPh_3)_4$, and 4.15 g (30.0 mmol) of $K_2CO_3$ were dissolved 40 mL of in a $THF/H_2O$ (a volumetric ratio of 2/1) mixed solution, and then, at a temperature of 80° C., the resultant solution was stirred for 5 hours. The reaction solution was cooled to room temperature, and then, 40 mL of water was added thereto, and an extraction process was performed thereon three times with 50 mL of diethylether. A collected organic layer was dried by using magnesium sulfate, and then, the residual obtained by evaporating a solvent therefrom was separation-purified by silica gel column chromatography to obtain 4.33 g (yield of 81%) of Compound 4. The generated compound was confirmed by LC-MS and $^1$H NMR.

$C_{39}H_{25}N_3$: $M^+$ 535.2

$^1$H NMR ($CDCl_3$, 400 MHz) δ 8.08-8.04 (m, 2H), 7.81-7.77 (m, 3H), 774 (d, 1H), 7.67-7.64 (m, 2H), 7.59 (d, 1H), 7.56-7.47 (m, 6H), 7.45 (d, 1H), 7.41-7.28 (m, 6H), 7.25-7.19 (m, 3H)

Synthesis Example 2

Synthesis of Compound 35

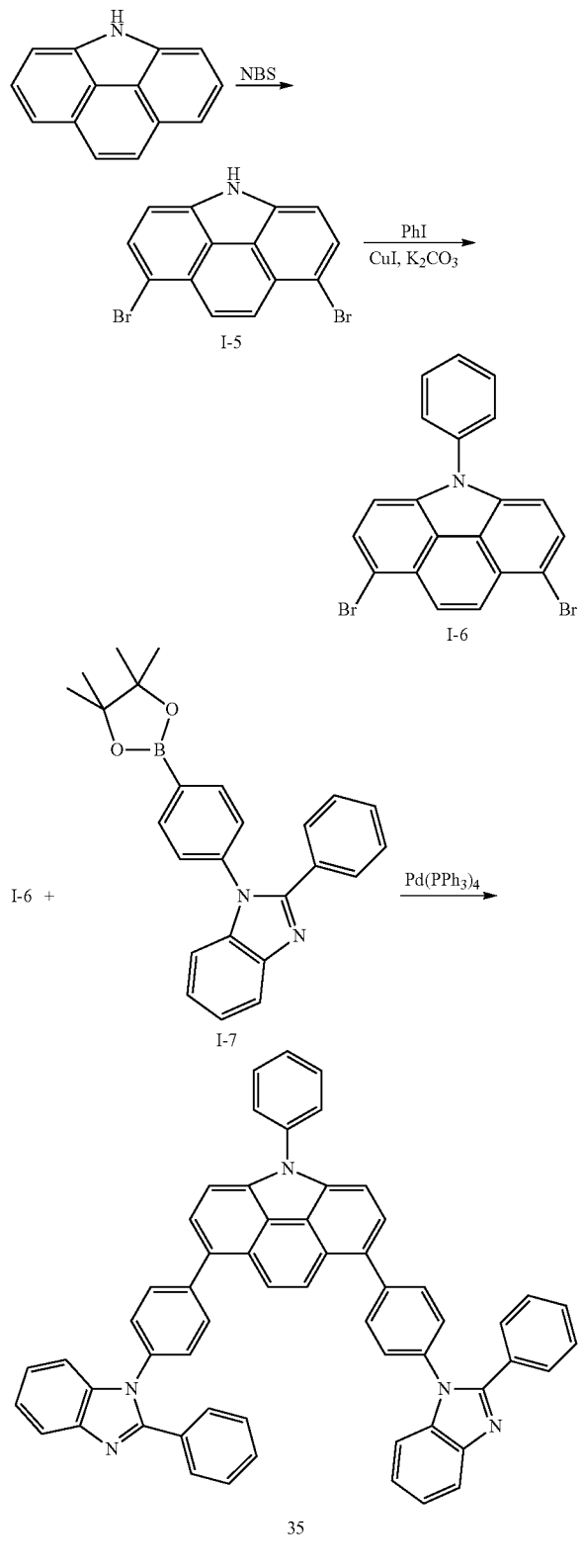

Synthesis of Intermediate I-5

1.91 g (10.0 mmol) of 6H-benzo[def]carbazole was completely dissolved in 60 mL of carbon tetrachloride (CCl$_4$), and 3.56 g (20.0 mmol) of N-bromosuccinimide was added thereto, and the mixture was stirred at a temperature of 80° C. for 30 minutes. The reaction solution was cooled to room temperature, and then, stirred for 30 minutes to precipitate crystals. The crystals were collected by decompression-filtration (e.g., vacuum filtration) and washed with methanol to obtain 2.51 g (yield of 72%) of Intermediate I-5, which was white crystals. The obtained compound was identified by LC-MS.

$C_{14}H_7Br_2N$: M$^+$ 346.9

Synthesis of Intermediate I-6

10.0 g (28.7 mmol) of Intermediate I-4, 7.0 g (34.4 mmol) of iodobenzene, 0.5 g (2.87 mmol) of 1,10-phenanthroline, 1.1 g (5.74 mmol) of CuI, and 11.9 g (86.1 mmol) of K$_2$CO$_3$ were dissolved in 100 mL of dimethylformamide (DMF), and then, the mixture was stirred at a temperature of 80° C. for 24 hours. The reaction solution was cooled to room temperature, and then, extracted by using 100 mL of water. A collected organic layer was dried by using magnesium sulfate, and then, the residual obtained by evaporating a solvent therefrom was separation-purified by silica gel column chromatography to obtain 9.51 g (yield of 78%) of Intermediate I-6. The obtained compound was identified by LC-MS.

$C_{20}H_{11}Br_2N$: M$^+$ 422.9

Synthesis of Compound 35

5.78 g (yield of 72%) of Compound 35 was obtained in the same manner as used to synthesize Compound 4, except that Intermediate I-6 was used instead of Intermediate I-3, and Intermediate I-7 was used instead of Intermediate I-4. The generated compound was confirmed by LC-MS and $^1$H NMR.

$C_{58}H_{37}N_5$: M$^+$ 803.3

$^1$H NMR (CDCl$_3$, 400 MHz) δ 8.07-8.03 (m, 4H), 7.81-7.77 (m, 6H), 7.73 (d, 2H), 7.66 (d, 2H), 7.56-7.48 (m, 4H), 7.43-7.28 (m, 11H), 7.25-7.20 (m, 6H), 7.09 (s, 2H)

Synthesis Example 3

Synthesis of Compound 20

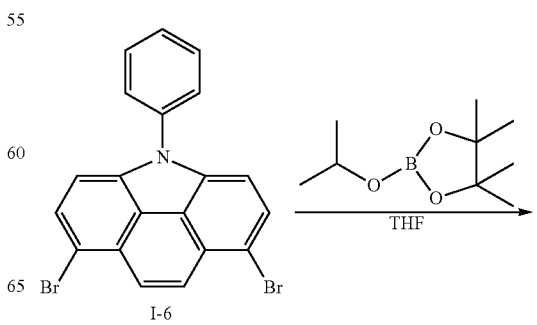

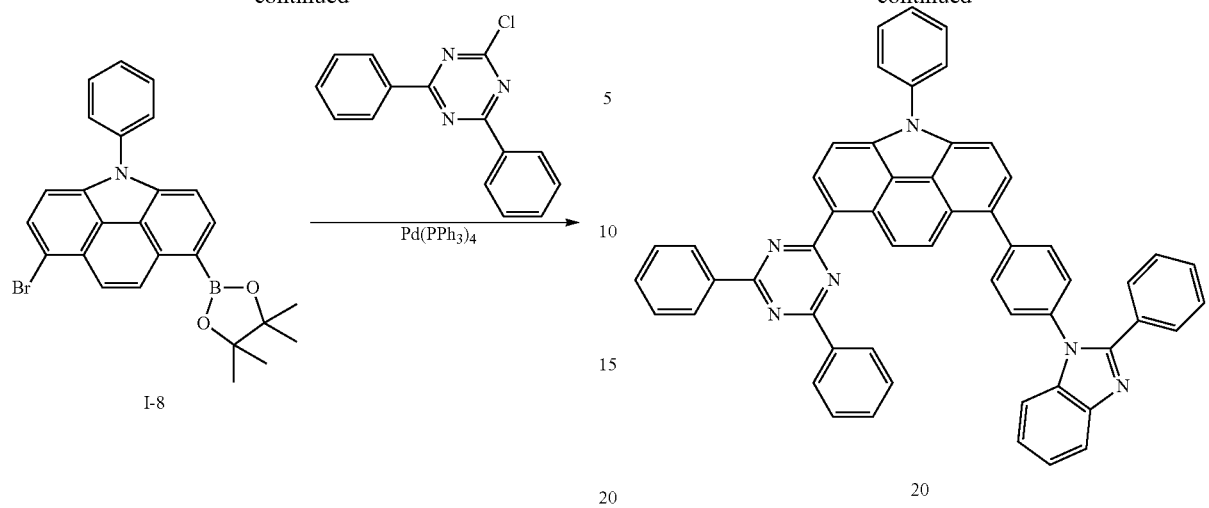

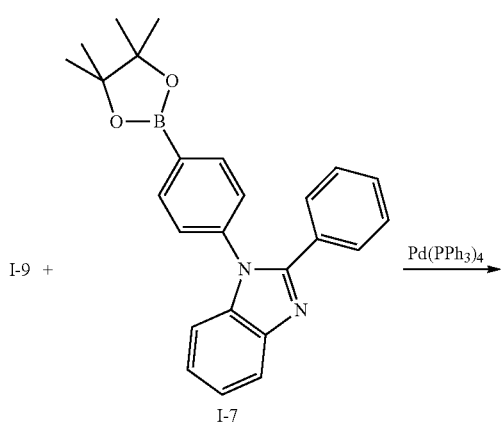

Synthesis of Intermediate I-8

8.50 g (20.0 mmol) of Intermediate I-6 was dissolved in 50 ml of THF, and then, at a temperature of −78° C., 8 ml (20.0 mmol, 2.5M in hexane) of n-BuLi was slowly dropped (e.g., added dropwise) thereto. At the same temperature, the mixture was stirred for one hour, and then, 4.65 g (25 mmol) of 2-isoproxy-4,4,5,5,-tetramethyl-1,3,2-dioxaborolane was slowly dropped (e.g., added dropwise) thereto, and the reaction solution was stirred at a temperature of −78° C. for 1 hour, and then, additionally stirred for 24 hours at room temperature. After the reaction was stopped, 50 mL of 10% HCl aqueous solution and 50 mL of $H_2O$ were added thereto, and then the resultant solution was extracted three times by using 80 mL of diethylether. A collected organic layer was dried by using magnesium sulfate, and then, the residual obtained by evaporating a solvent therefrom was separation-purified by silica gel column chromatography to obtain 5.75 g (yield 61%) of Intermediate I-8. The obtained compound was identified by LC-MS.

$C_{26}H_{23}BBrNO_2$: M+ 471.1

Synthesis of Intermediate I-9

4.71 g (10.0 mmol) of Intermediate I-8, 4.01 g (15.0 mmol) of 2-chloro-4,6-diphenyl-[1,3,5]triazine, 0.06 g (0.5 mmol) of $Pd(PPh_3)_4$, and 4.15 g (30.0 mmol) of $K_2CO_3$ were dissolved 40 mL of in a THF/$H_2O$ (a volumetric ratio of 2/1) mixed solution, and then, at a temperature of 80° C., the resultant solution was stirred for 5 hours. The reaction solution was cooled to room temperature, and then, 40 mL of water was added thereto, and an extraction process was performed thereon three times with 50 mL of diethylether. A collected organic layer was dried by using magnesium sulfate, and then, the residual obtained by evaporating a solvent therefrom was separation-purified by silica gel column chromatography to obtain 4.27 g (yield of 74%) of Intermediate I-9. The obtained compound was identified by LC-MS.

$C_{35}H_{21}BrN_3$: M$^+$ 577.5

Synthesis of Compound 20

5.78 g (yield of 68%) of Compound 20 was obtained in the same manner as used to synthesize Compound 4, except that Intermediate I-9 was used instead of Intermediate I-3, and Intermediate I-7 was used instead of Intermediate I-4. The generated compound was confirmed by LC-MS and $^1$H NMR.

$C_{54}H_{34}N_6$: M$^+$ 766.3

$^1$H NMR (CDCl$_3$, 400 MHz) δ 8.84-8.81 (m, 4H), 8.54 (d, 1H), 8.08-8.04 (m, 2H), 7.93-7.90 (m, 2H), 7.81-7.77 (m, 3H), 7.71 (d, 1H), 7.67-7.48 (m, 10H), 7.42-7.28 (m, 8H), 7.25-7.20 (m, 3H)

Synthesis Example 4

Synthesis of Compound 59

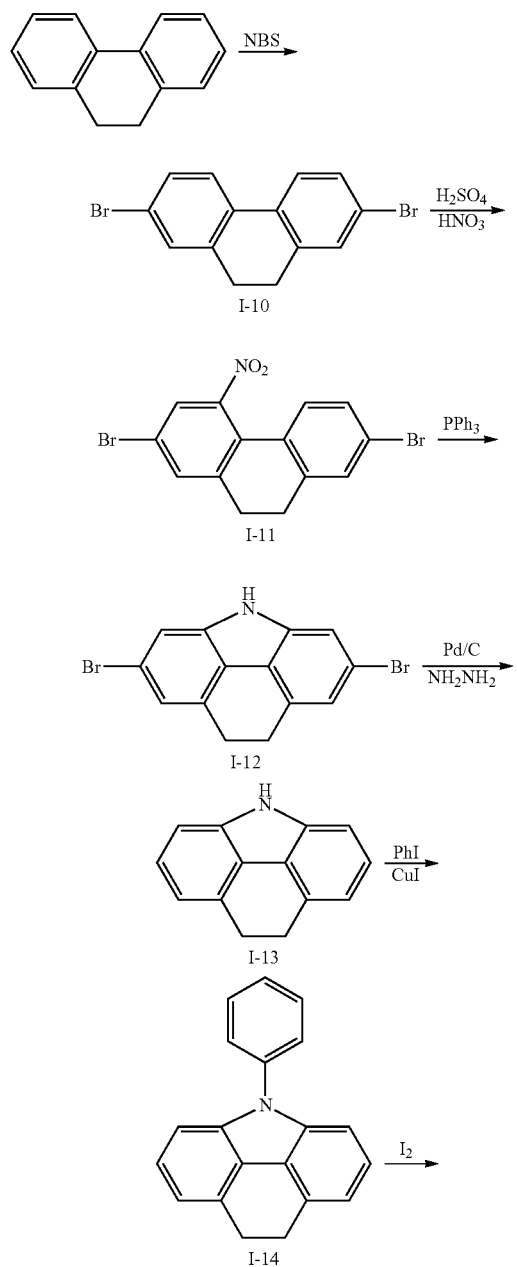

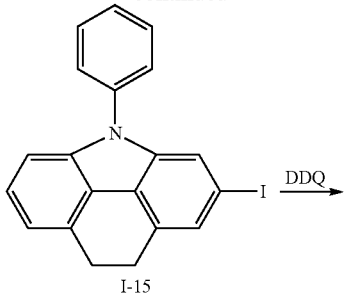

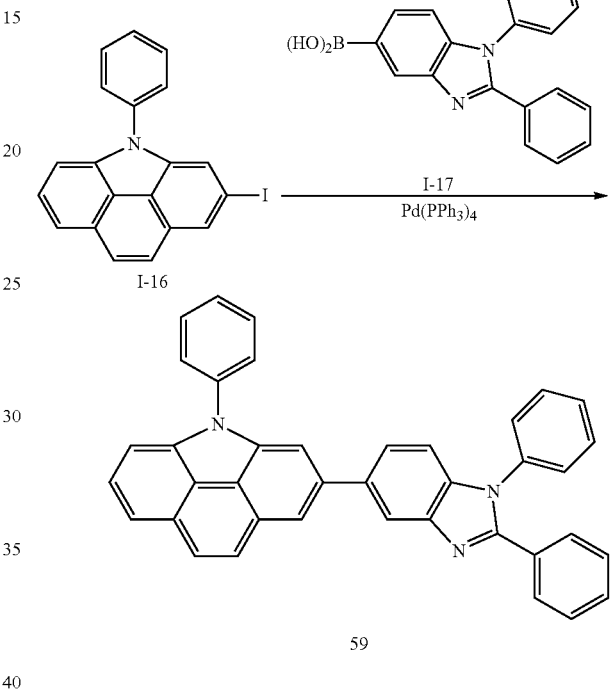

Synthesis of Intermediate I-10

10.0 g (55.4 mmol) of 9,10-dihydrophenanthrene, 21.8 g (121.0 mmol) of N-bromosuccinimide, and 0.5 g (2.7 mmol) of p-TsOH were dissolved in 30 mL of acetonitrile, and then, the mixture was stirred at a temperature of 50° C. for 12 hours. The reaction solution was cooled to room temperature, and then, stirred for 30 to precipitate crystals. The crystals were collected by decompression-filtration (e.g., vacuum filtration) and washed with methanol to obtain 8.4 g (yield 45%) of Intermediate 1-10, which was gray crystals. The obtained compound was identified by LC-MS.

$C_{14}H_{10}Br_2$ M$^+$ 335.9

Synthesis of Intermediate I-11

5.0 g (15.0 mmol) of Intermediate I-10 was completely dissolved in 50 mL of dichloromethane, and at room temperature, 1.7 g (30.0 mmol) of a nitric acid was added thereto, and then, 1.5 g (15.0 mmol) of a sulfuric acid was slowly dropped (e.g., added dropwise) thereto, and at a temperature of 30° C., the resultant mixture was stirred for 6 hours. When the reaction stopped, the reaction solution was cooled to room temperature, and 50 mL of methanol was added thereto, and the resultant solution was stirred for 2 hours to precipitate crystals. The crystals were collected by decompression-filtration (e.g., vacuum filtration) and washed with methanol to obtain 5.2 g (yield 90%) of Intermediate I-11, which was yellow crystals. The obtained compound was identified by LC-MS.

$C_{14}H_9Br_2NO_2$ M+ 380.9

Synthesis of Intermediate I-12

4.6 g (12.0 mmol) of Intermediate I-11 was completely dissolved in 30 mL of o-dichlorobenzene by heating, and then, 4.7 g (18.0 mmol) of triphenylphosphine was added thereto and then, the resultant solution was stirred at a temperature of 180° C. for 3 hours. The reaction solution was cooled to room temperature, and then, the residual obtained by evaporating a solvent therefrom was separation-purified by silica column chromatography, and the obtained product was washed with methanol to obtain 2.9 g (yield 70%) of Intermediate I-12, which was white crystals. The obtained compound was identified by LC-MS.

$C_{14}H_9Br_2N$ M+ 348.9

Synthesis of Intermediate I-13

At room temperature, 10 g (28.5 mmol) of Intermediate I-12 and 0.03 g (0.28 mmol) of Pd/C (10%) were dissolved in 100 mL of ethanol, and then, the mixture was heated to a temperature of 50° C., and then, 5.48 g (171 mmol) of hydrazine was dropped (e.g., added dropwise) thereto and the resultant solution was stirred for 24 hours. The reaction solution was cooled to room temperature, and then, washed with acetone, and 100 mL of ice water was added thereto to obtain 3.63 g (yield of 66%) of Intermediate I-13, which was white crystals. The obtained compound was confirmed by LC-MS.

$C_{14}H_{11}N$ M+ 193.1

Synthesis of Intermediate I-14

1.93 g (10.0 mmol) of Intermediate I-13, 2.5 g (12.0 mmol) of iodobenzene, 0.2 g (1.0 mmol) of 1,10-phenanthroline, 0.2 g (2.0 mmol) of CuI, and 4.1 g (30.0 mmol) of $K_2CO_3$ were dissolved in 30 mL of N,N-dimethylformamide (DMF), and then, the mixture was stirred at a temperature of 80° C. for 24 hours. The reaction solution was cooled to room temperature, and then extracted three times with 30 mL of water and 40 mL of diethylether. A collected organic layer was dried by using magnesium sulfate, and then, the residual obtained by evaporating a solvent therefrom was separation-purified by silica gel column chromatography to obtain 2.39 g (yield 89%) of Intermediate I-14. The obtained compound was identified by LC-MS.

$C_{20}H_{15}N$ M+ 269.1

Synthesis of Intermediate I-15

10 g (37.1 mmol) of Intermediate I-14 was completely dissolved in 100 ml of dichloromethane, and then, 3.58 g (14.1 mmol) of iodine and 2.38 g (11.13 mmol) of $KIO_3$ were mixed and divided into five portions, which were then sequentially added thereto. The mixture was stirred for 6 hours, and then washed with methanol to obtain 8.06 g (yield of 55%) of Intermediate I-15. The obtained compound was identified by LC-MS.

$C_{20}H_{14}IN$ M+ 395.0

Synthesis of Intermediate I-16

In air, 10 g (25.3 mmol) of Intermediate I-15 was dissolved in 100 ml of toluene, and then, at room temperature, 1.57 g (7.6 mmol) of 2,3-dichloro-5,6-dicyano-1,4-benzoquinone and 0.52 g (7.6 mmol) of $NaNO_2$ were added thereto. The mixture was stirred at a temperature of 110° C. for 6 hours. When the reaction stopped, the reaction solution was cooled to room temperature, and the residual obtained by evaporating a solvent therefrom was separation-purified by silica gel column chromatography to obtain 8.94 g (yield of 90%) of Intermediate I-16. The obtained compound was confirmed by LC-MS.

$C_{20}H_{12}IN$ M+ 393.0

Synthesis of Compound 59

4.18 g (yield of 78%) of Compound 59 was obtained in the same manner as used to synthesize Compound 4, except that Intermediate I-15 was used instead of Intermediate I-3, and Intermediate I-17 was used instead of Intermediate I-4. The generated compound was confirmed by LC-MS and $^1H$ NMR.

$C_{39}H_{25}N_3$: M+ 535.2

$^1H$ NMR ($CDCl_3$, 400 MHz) δ 8.32 (s, 1H), 8.11-8.08 (m, 2H), 7.93 (s, 1H), 7.88-7.82 (m, 2H), 7.77 (d, 1H), 7.62-7.53 (m, 5H), 7.49-7.29 (m, 13H)

Synthesis Example 5

Synthesis of Compound 70

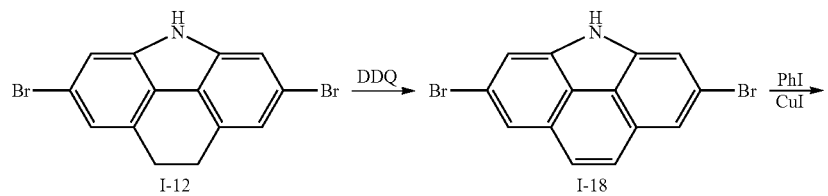

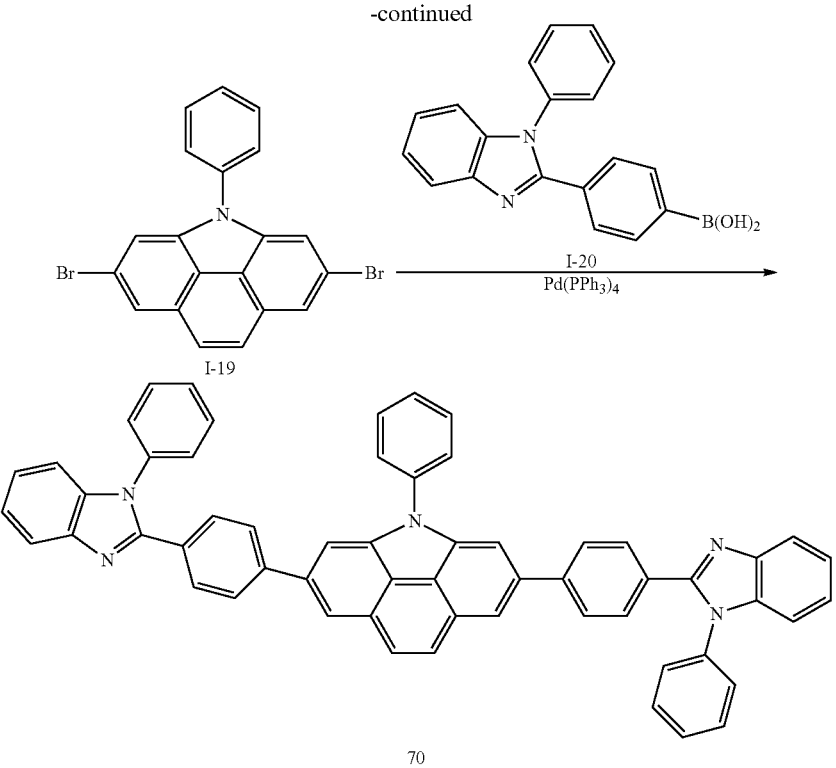

Synthesis of Intermediate I-18

In an oxygen atmosphere, 3.51 g (10.0 mmol) of Intermediate I-12, was dissolved in 100 ml of toluene, and then, at room temperature, 0.6 g (0.3 mmol) of 2,3-dichloro-5,6-dicyano-1,4-benzoquinone and 0.2 g (0.3 mmol) of $NaNO_2$ were added thereto, and the mixture was stirred at a temperature of 110° C. for 6 hours. When the reaction stopped, the reaction solution was cooled to room temperature, the residual obtained by evaporating a solvent therefrom was separation-purified by silica gel column chromatography to obtain 3.00 g (yield 86%) of Intermediate I-18. The obtained compound was identified by LC-MS.

$C_{14}H_7Br_2N$ $M^+$ 346.9

Synthesis of Intermediate I-19

3.49 g (10.0 mmol) of Intermediate I-18, 2.5 g (12.0 mmol) of iodobenzene, 0.2 g (1.0 mmol) of 1,10-phenanthroline, 0.2 g (2.0 mmol) of CuI, and 4.1 g (30.0 mmol) of $K_2CO_3$ were dissolved in 30 mL of N,N-dimethylformamide (DMF), and then, the mixture was stirred at a temperature of 80° C. for 24 hours. The reaction solution was cooled to room temperature, and then extracted three times with 30 mL of water and 40 mL of diethylether. A collected organic layer was dried by using magnesium sulfate, and then, the residual obtained by evaporating a solvent therefrom was separation-purified by silica gel column chromatography to obtain 3.49 g (yield 82%) of Intermediate I-19. The obtained compound was identified by LC-MS.

$C_{20}H_{11}Br_2N$ $M^+$ 422.9

Synthesis of Compound 70

5.06 g (yield of 63%) of Compound 70 was obtained in the same manner as used to synthesize Compound 4, except that Intermediate I-19 was used instead of Intermediate I-3, and Intermediate I-20 was used instead of Intermediate I-4. The generated compound was confirmed by LC-MS and $^1H$ NMR.

$C_{58}H_{37}N_5$: $M^+$ 803.3

$^1H$ NMR (CDCl$_3$, 400 MHz) δ 8.19-8.16 (m, 4H), 8.06 (s, 2H), 7.80 (d, 2H), 7.75-7.72 (m, 4H), 7.66 (d, 2H), 7.63-7.52 (m, 8H), 7.47-7.35 (m, 9H), 7.32-7.28 (m, 4H), 7.25-7.20 (m, 2H)

Synthesis Example 6

Synthesis of Compound 77

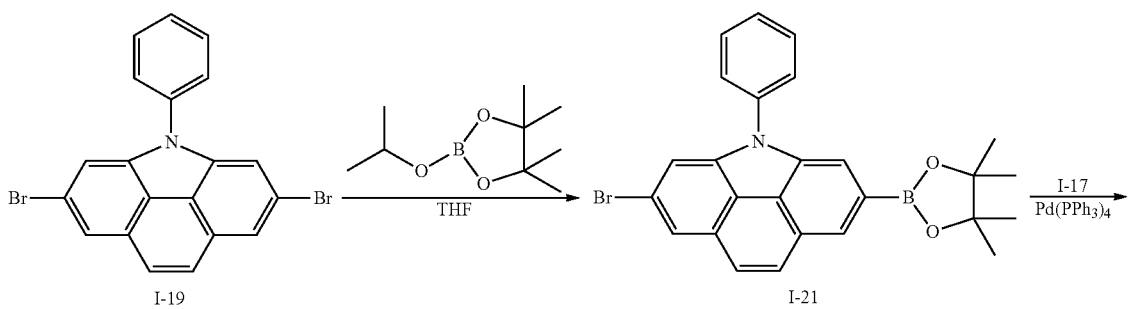

-continued

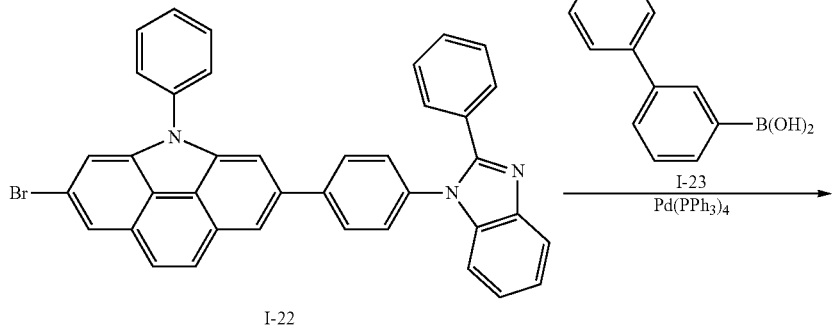

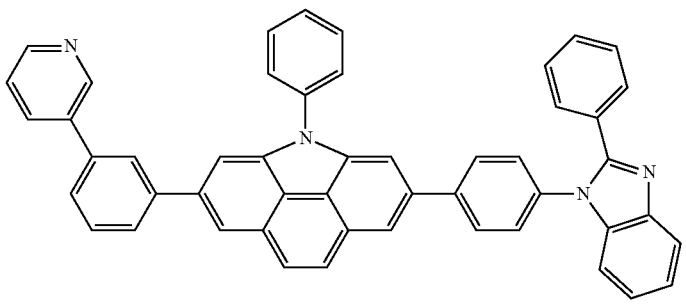

Synthesis of Intermediate I-21

3.02 g (yield of 64%) of Intermediate I-21 was obtained in the same manner as used to synthesize Intermediate I-8, except that Intermediate I-19 was used instead of Intermediate I-6. The obtained compound was identified by LC-MS. $C_{26}H_{23}BBrNO_2$: M⁺ 471.1

Synthesis of Intermediate I-22

4.11 g (yield of 67%) of Intermediate I-22 was obtained in the same manner as used to synthesize Intermediate I-9, except that Intermediate I-21 and Intermediate 1-17 were used. The obtained compound was identified by LC-MS. $C_{39}H_{24}BrN_3$: M⁺ 613.1

Synthesis of Compound 77

4.27 g (yield of 62%) of Compound 77 was obtained in the same manner as used to synthesize Compound 4, except that Intermediate I-22 was used instead of Intermediate I-3, and Intermediate I-23 was used instead of Intermediate I-4. The generated compound was confirmed by LC-MS and ¹H NMR.
$C_{50}H_{32}N_4$: M⁺ 688.3
¹H NMR (CDCl₃, 400 MHz) δ 8.91 (s, 1H), 8.65 (s, 1H), 8.16 (s, 1H), 8.09-8.02 (m, 3H), 7.98-7.93 (m, 2H), 7.80 (d, 1H), 7.72-7.55 (m, 8H), 7.49-7.43 (m, 3H), 7.40-7.19 (m, 12H)

Like in the synthesis examples above, the following compounds were synthesized by using intermediate materials corresponding to target compounds. Other compounds than the following compounds may also be synthesizable by referring to the above-mentioned synthesis pathways and source materials, and synthesis methods therefore should be apparent to one of ordinary skill in the art.

Compound 2: $C_{35}H_{25}N_3$: M⁺ 487.2
¹H NMR (CDCl₃, 400 MHz) δ 8.08-8.04 (m, 2H), 7.81-7.77 (m, 4H), 7.70 (d, 1H), 7.66 (d, 1H), 7.60 (d, 1H), 7.51-7.47 (m, 2H), 7.44-7.28 (m, 6H), 7.25-7.20 (m, 3H), 4.55 (q, 2H), 1.43 (t, 3H)

Compound 6: $C_{40}H_{24}N_4$: M⁺ 560.2
¹H NMR (CDCl₃, 400 MHz) δ 8.07-8.03 (m, 2H), 7.81-7.73 (m, 6H), 7.67-7.64 (m, 2H), 7.59 (d, 1H), 7.51-7.44 (m, 5H), 7.41-7.28 (m, 5H), 7.25-7.20 (m, 3H)

Compound 7: $40H_{24}F_3N_3$: M⁺ 603.2
¹H NMR (CDCl₃, 400 MHz) δ 8.08-8.04 (m, 2H), 7.80-7.64 (m, 8H), 7.60-7.54 (m, 3H), 7.51-7.45 (m, 3H), 7.41-7.28 (m, 5H), 7.25-7.20 (m, 3H)

Compound 8: $C_{45}H_{41}N_3Si_2$: M⁺ 679.3
¹H NMR (CDCl₃, 400 MHz) δ 8.03-8.00 (m, 2H), 7.79-7.72 (m, 4H), 7.67-7.64 (m, 2H), 7.62-7.53 (m, 5H), 7.51-7.45 (m, 3H), 7.41-7.38 (m, 2H), 7.32-7.28 (m, 2H), 7.25-7.20 (m, 3H), 0.35 (s, 9H), 0.26 (s. 9H)

Compound 13: $C_{38}H_{24}N_4$: M⁺ 536.2
¹H NMR (CDCl₃, 400 MHz) δ 8.63 (s, 1H), 8.49 (d, 1H), 8.08-8.04 (m, 2H), 7.87-7.73 (m, 6H), 7.66 (d, 1H), 7.60-7.48 (m, 4H), 7.41-7.28 (m, 6H), 7.24-7.20 (m, 3H)

Compound 18: $C_{44}H_{28}N_4$: M⁺ 612.2
¹H NMR (CDCl₃, 400 MHz) δ 8.99 (s, 1H), 8.59 (d, 1H), 8.06-8.03 (m, 2H), 7.98 (d, 1H), 7.81-7.77 (m, 3H), 7.72-

7.60 (m, 4H), 7.56-7.48 (m, 4H), 7.46 (d, 1H), 7.43-7.28 (m, 8H), 7.25-7.20 (m, 3H)

Compound 22: $C_{54}H_{34}N_6$: $M^+$ 766.3

$^1$H NMR (CDCl$_3$, 400 MHz) δ 8.80 (d, 4H), 8.58-8.55 (m, 2H), 8.08-8.00 (m, 2H), 7.81-7.73 (m, 5H), 7.67-7.57 (m, 6H), 7.52-7.28 (m, 12H), 7.25-7.20 (m, 3H)

Compound 24: $C_{57}H_{36}N_4$: $M^+$ 776.3

$^1$H NMR (CDCl$_3$, 400 MHz) δ 8.10 (d, 2H), 8.07-8.07 (m, 2H), 7.81-7.77 (m, 3H), 7.72-7.64 (m, 5H), 7.56-7.48 (m, 4H), 7.43-7.26 (m, 15H), 7.25-7.20 (m, 3H), 7.09 (s, 2H)

Compound 28: $C_{45}H_{24}D5N_3$: $M^+$ 616.3

$^1$H NMR (CDCl$_3$, 400 MHz) δ 8.14-8.11 (m, 2H), 8.06-8.02 (m, 2H), 7.81-7.77 (m, 3H), 7.71 (d, 1H), 7.67-7.61 (m, 2H), 7.52-7.47 (m, 2H), 7.41-7.28 (m, 7H), 7.25-7.20 (m, 3H), 7.10 (d, 1H), 6.98 (d, 1H)

Compound 32: $C_{48}H_{33}N_3$: $M^+$ 651.3

$^1$H NMR (CDCl$_3$, 400 MHz) δ 8.10-8.07 (m, 2H), 7.97 (s, 1H), 7.92-7.90 (m, 1H), 7.80-7.78 (d, 1H), 7.74 (d, 1H), 7.68 (d, 1H), 7.63-7.60 (m, 2H), 7.56-7.47 (m, 7H), 7.43-7.28 (m, 8H), 7.25-720 (m, 1H), 7.00 (d, 1H), 6.87 (s, 1H), 1.63 (s, 6H)

Compound 36: $C_{42}H_{33}N_3Si$: $M^+$ 607.2

$^1$H NMR (CDCl$_3$, 400 MHz) δ 8.40 (d, 1H), 8.07-8.02 (m, 2H), 7.82-7.77 (m, 3H), 7.71 (d, 1H), 7.67-7.61 (m, 2H), 7.56-7.48 (m, 5H), 7.41-7.20 (10H), 0.51 (s, 9H)

Compound 37: $C_{38}H_{24}N_4$: $M^+$ 536.2

$^1$H NMR (CDCl$_3$, 400 MHz) δ 8.43 (s, 1H), 8.23 (d, 1H), 8.12-8.09 (m, 2H), 7.95 (d, 1H), 7.91 (d, 1H), 7.75-7.68 (m, 3H), 7.60-7.47 (m, 8H), 7.41-7.25 (m, 7H)

Compound 38: $C_{39}H_{25}N_3$: $M^+$ 535.2

$^1$H NMR (CDCl$_3$, 400 MHz) δ 8.20-8.17 (m, 2H), 7.90-7.87 (m, 2H), 7.79 (d, 1H), 7.74 (d, 1H), 7.65 (d, 1H), 7.61-7.35 (m, 15H), 7.32-7.28 (m, 2H), 7.25-7.20 (m, 1H)

Compound 39: $C_{39}H_{25}N_3$: $M^+$ 535.2

$^1$H NMR (CDCl$_3$, 400 MHz) δ 8.30 (s, 1H), 8.15 (d, 1H), 8.00 (d, 1H), 7.83-7.78 (m, 2H), 7.74 (d, 1H), 7.67 (d, 1H), 7.62-7.47 (m, 9H), 7.44-7.34 (m, 5H), 7.32-7.26 (m, 3H), 7.25-7.20 (m, 1H)

Compound 42: $C_{48}H_{30}N_6$: $M^+$ 690.3

$^1$H NMR (CDCl$_3$, 400 MHz) δ 8.78-8.85 (m, 4H), 8.28-8.25 (2H), 8.19-8.15 (m, 1H), 8.00-7.96 (m, 2H), 7.86-7.81 (m, 1H), 7.74 (d, 1H), 7.69-7.64 (m, 4H), 7.61-7.57 (m, 2H), 7.56-7.44 (m, 7H), 7.43-7.35 (m, 5H), 7.31 (d, 1H)

Compound 45: $C_{45}H_{29}N_3$: $M^+$ 611.2

$^1$H NMR (CDCl$_3$, 400 MHz) δ 7.90-7.84 (m, 4H), 7.79 (d, 1H), 7.76-7.73 (m, 4H), 7.61-7.34 (m, 19H), 7.30 (d, 1H)

Compound 46: $C_{43}H_{25}N_4$: $M^+$ 600.2

$^1$H NMR (CDCl$_3$, 400 MHz) δ 9.13 (s, 1H), 8.66-8.63 (m, 1H), 8.17 (d, 1H), 7.94-7.83 (m, 6H), 7.77 (s, 1H), 7.74 (d, 1H), 7.69-7.57 (m, 5H), 7.55-7.40 (m, 8H), 7.32 (d, 1H), 3.69 (s, 3H)

Compound 47: $C_{55}H_{37}N_5$: $M^+$ 803.3

$^1$H NMR (CDCl$_3$, 400 MHz) δ 8.20-8.17 (m, 4H), 7.90-7.87 (m, 4H), 7.79 (d, 2H), 7.67-7.64 (m, 4H), 7.58-7.48 (m, 8H), 7.44-7.35 (m, 7H), 7.34-7.28 (m, 4H), 7.25-7.20 (m, 2H), 7.09 (s, 2H)

Compound 51: $C_{45}H_{29}N_3$: $M^+$ 611.2

$^1$H NMR (CDCl$_3$, 400 MHz) δ 8.11-8.08 (m, 2H), 7.93-7.85 (m, 4H), 7.82 (d, 1H), 7.75-7.73 (m, 2H), 7.62-7.46 (m, 12H), 7.44-7.29 (m, 8H)

Compound 54: $C_{44}H_{25}N_4$: $M^+$ 612.2

$^1$H NMR (CDCl$_3$, 400 MHz) δ 8.56 (d, 1H), 8.47 (s, 1H), 8.15-8.12 (m, 2H), 7.94-7.85 (m, 6H), 7.77-7.72 (m, 2H), 7.61-7.43 (m, 11H), 7.41-7.28 (m, 5H)

Compound 64: $C_{48}H_{30}N_6$: $M^+$ 690.3

$^1$H NMR (CDCl$_3$, 400 MHz) δ 8.78-8.75 (m, 4H), 8.28-8.24 (d, 2H), 8.20-8.15 (m, 1H), 8.08 (s, 1H), 7.86-7.75 (m, 4H), 7.69-7.65 (m, 4H), 7.58-7.45 (m, 6H), 7.43-7.35 (m, 6H), 7.32-7.29 (m, 2H)

Compound 66: $C_{48}H_{30}N_6$: $M^+$ 690.3

$^1$H NMR (CDCl$_3$, 400 MHz) δ 8.76 (d, 4H), 8.20-8.18 (m, 2H), 8.09 (d, 2H), 7.96 (s, 1H), 7.85-7.59 (m, 12H), 7.42-7.20 (m, 8H), 6.94 (d, 1H)

Compound 68: $C_{45}H_{29}N_3$: $M^+$ 611.2

$^1$H NMR (CDCl$_3$, 400 MHz) δ 8.25 (s, 1H), 8.13 (s, 1H), 8.09 (s, 1H), 7.93 (d, 1H), 7.83-7.65 (m, 5H), 7.59-7.35 (m, 15H), 7.32-7.20 (m, 5H)

Compound 69: $C_{45}H_{27}N_3O$: $M^+$ 625.2

$^1$H NMR (CDCl$_3$, 400 MHz) δ 8.18 (d, 2H), 8.10 (s, 1H), 7.91 (d, 1H), 7.83-7.72 (m, 6H), 7.67-7.63 (m, 2H), 7.60-7.53 (m, 5H), 7.50-7.35 (m, 6H), 7.32-7.28 (m, 2H), 7.25-7.20 (m, 1H), 7.09 (t, 1H)

Compound 74: $C_{59}H_{36}N_4$: $M^+$ 800.3

$^1$H NMR (CDCl$_3$, 400 MHz) δ 8.43-8.41 (m, 2H), 8.18 (d, 2H), 8.06 (s, 1H), 7.80-7.72 (m, 3H), 7.67-7.51 (m, 11H), 7.49-7.35 (m, 13H), 7.32-7.28 (m, 3H), 7.25-7.20 (m, 1H)

Compound 76: $C_{55}H_{33}N_3$: $M^+$ 735.3

$^1$H NMR (CDCl$_3$, 400 MHz) δ 8.21 (s, 1H), 8.15-8.11 (m, 4H), 8.09-7.92 (m, 8H), 7.80 (d, 1H), 7.67-7.55 (m, 7H), 7.46-7.73 (m, 2H), 7.41-7.28 (m, 9H), 7.25-7.20 (m, 1H)

Compound 80: $C_{50}H_{37}N_3$: $M^+$ 707.3

$^1$H NMR (CDCl$_3$, 400 MHz) δ □□8.26 (s, 2H), 7.81-7.74 (m, 6H), 7.71-7.65 (m, 4H), 7.63-7.58 (m, 4H), 7.47-7.73 (m, 2H), 7.40-7.31 (m, 9H), 4.38 (q, 4H), 1.44 (t, 6H)

Example 1

An ITO glass substrate (a product of Corning Co., Ltd) having an ITO layer having a thickness of 15 Ω/cm$^2$ (1200 Å) was cut to a size of 50 mm×50 mm×0.7 mm, and then, sonicated using isopropyl alcohol and pure water each for 5 minutes, and cleaned by exposure to ultraviolet rays for 30 minutes, and then exposure to ozone, and the ITO glass substrate was mounted on a vacuum deposition apparatus.

2-TNATA was deposited on the ITO layer acting as an anode to form a hole injection layer having a thickness of 600 Å, and then, NPB was deposited on the hole injection layer to form a hole transport layer having a thickness of 300 Å, and then, ADN (as a host) and DPAVBi (as a dopant) were co-deposited at a weight ratio of 98:2 on the emission layer to form an emission layer having a thickness of 300 Å.

Thereafter, Compound 4 was deposited on the emission layer to form an electron transport layer having a thickness of 300 Å, and LiF was deposited on the electron transport layer to form an electron injection layer having a thickness of 10 Å, and Al was deposited on the electron injection layer to form a cathode having a thickness of 3000 Å, thereby completing the manufacture of an organic light-emitting device.

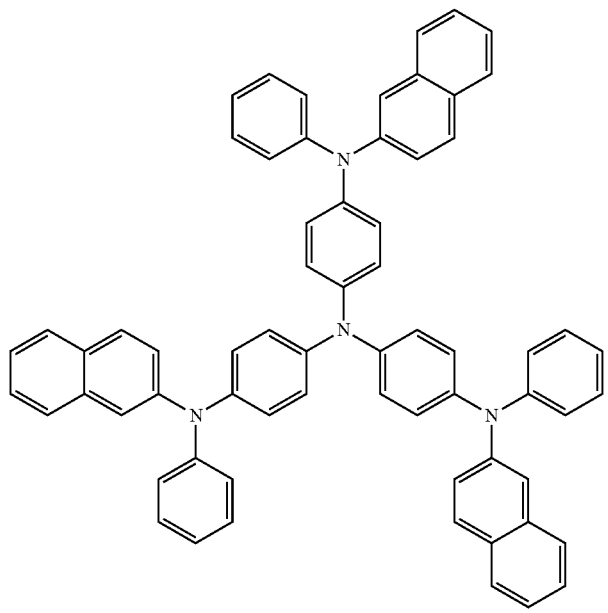

2-TNATA

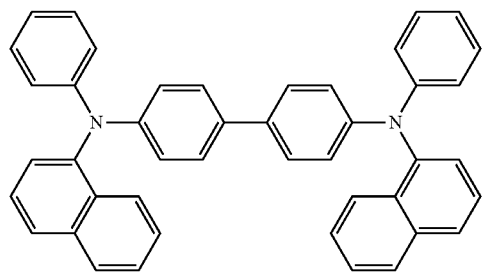

NPB

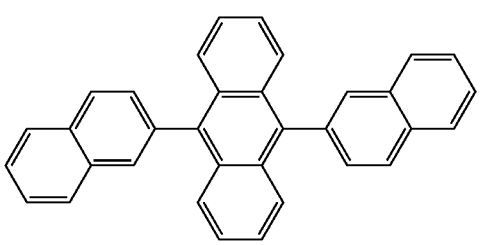

ADN

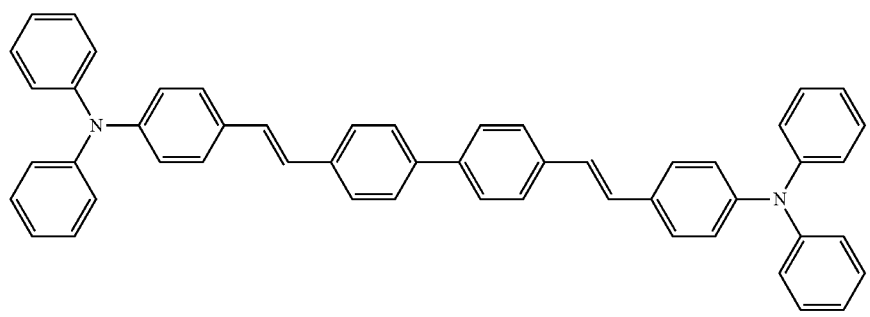

DPAVBi

Example 2

An organic light-emitting device was manufactured as in Example 1, except that in forming an electron transport layer, Compound 6 was used instead of Compound 4.

Example 3

An organic light-emitting device was manufactured as in Example 1, except that in forming an electron transport layer, Compound 13 was used instead of Compound 4.

Example 4

An organic light-emitting device was manufactured as in Example 1, except that in forming an electron transport layer, Compound 20 was used instead of Compound 4.

Example 5

An organic light-emitting device was manufactured as in Example 1, except that in forming an electron transport layer, Compound 32 was used instead of Compound 4.

Example 6

An organic light-emitting device was manufactured as in Example 1, except that in forming an electron transport layer, Compound 35 was used instead of Compound 4.

Example 7

An organic light-emitting device was manufactured as in Example 1, except that in forming an electron transport layer, Compound 38 was used instead of Compound 4.

Example 8

An organic light-emitting device was manufactured as in Example 1, except that in forming an electron transport layer, Compound 42 was used instead of Compound 4.

Example 9

An organic light-emitting device was manufactured as in Example 1, except that in forming an electron transport layer, Compound 47 was used instead of Compound 4.

Example 10

An organic light-emitting device was manufactured as in Example 1, except that in forming an electron transport layer, Compound 51 was used instead of Compound 4.

Example 11

An organic light-emitting device was manufactured as in Example 1, except that in forming an electron transport layer, Compound 59 was used instead of Compound 4.

Example 12

An organic light-emitting device was manufactured as in Example 1, except that in forming an electron transport layer, Compound 64 was used instead of Compound 4.

Example 13

An organic light-emitting device was manufactured as in Example 1, except that in forming an electron transport layer, Compound 66 was used instead of Compound 4.

Example 14

An organic light-emitting device was manufactured as in Example 1, except that in forming an electron transport layer, Compound 70 was used instead of Compound 4.

Example 15

An organic light-emitting device was manufactured as in Example 1, except that in forming an electron transport layer, Compound 77 was used instead of Compound 4.

Example 16

An organic light-emitting device was manufactured as in Example 1, except that in forming an electron transport layer, Compound 80 was used instead of Compound 4.

Comparative Example 1

An organic light-emitting device was manufactured as in Example 1, except that in forming an electron transport layer, $Alq_3$ was used instead of Compound 4.

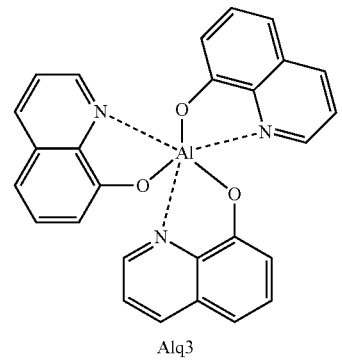

Alq3

Comparative Example 2

An organic light-emitting device was manufactured as in Example 1, except that in forming an electron transport layer, Compound A was used instead of Compound 4.

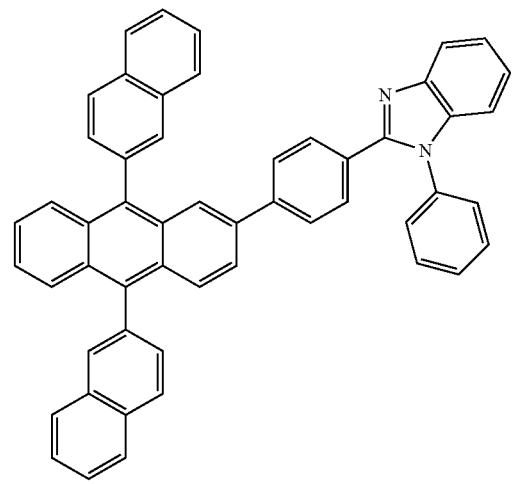

Compound A

Evaluation Example 1

The driving voltage, current density, brightness, efficiency, and half-lifespan of the organic light-emitting devices manufactured according to Examples 1 to 16, and Comparative Examples 1 and 2 were measured by using a Kethley SMU 236 and a brightness photometer PR650. The half-lifespan is a period of time that elapses until the brightness of the organic light-emitting device is 50% of the initial brightness of the organic light-emitting device.

TABLE 1

| | Electron transport layer | Driving voltage (V) | Current Density (mA/cm$^2$) | Brightness (cd/m$^2$) | Efficiency (cd/A) | Emission color | Half lifespan (hr@100 mA/cm$^2$) |
|---|---|---|---|---|---|---|---|
| Example 1 | Compound 4 | 5.31 | 50 | 3455 | 6.91 | Blue | 335 |
| Example 2 | Compound 6 | 5.35 | 50 | 3380 | 6.76 | Blue | 365 |
| Example 3 | Compound 13 | 5.26 | 50 | 3480 | 6.96 | Blue | 294 |
| Example 4 | Compound 20 | 5.21 | 50 | 3465 | 6.93 | Blue | 341 |
| Example 5 | Compound 32 | 5.32 | 50 | 3445 | 6.89 | Blue | 345 |
| Example 6 | Compound 35 | 5.24 | 50 | 3430 | 6.86 | Blue | 316 |
| Example 7 | Compound 38 | 5.30 | 50 | 3475 | 6.95 | Blue | 328 |
| Example 8 | Compound 42 | 5.23 | 50 | 3440 | 6.88 | Blue | 338 |
| Example 9 | Compound 47 | 5.28 | 50 | 3415 | 6.83 | Blue | 321 |
| Example 10 | Compound 51 | 5.32 | 50 | 3470 | 6.94 | Blue | 339 |
| Example 11 | Compound 59 | 5.29 | 50 | 3465 | 6.93 | Blue | 352 |
| Example 12 | Compound 64 | 5.24 | 50 | 3485 | 6.97 | Blue | 327 |
| Example 13 | Compound 66 | 5.27 | 50 | 3460 | 6.92 | Blue | 334 |
| Example 14 | Compound 70 | 5.34 | 50 | 3375 | 6.75 | Blue | 317 |
| Example 15 | Compound 77 | 5.23 | 50 | 3395 | 6.79 | Blue | 308 |
| Example 16 | Compound 80 | 5.29 | 50 | 3425 | 6.85 | Blue | 319 |
| Comparative Example 1 | Alq$_3$ | 7.35 | 50 | 2065 | 4.13 | Blue | 145 |
| Comparative Example 2 | Compound A | 5.76 | 50 | 2970 | 5.94 | Blue | 267 |

From Table 1, it was confirmed that the driving voltage, brightness, efficiency, and half-lifespan of the organic light-emitting devices manufactured according to Examples 1 to 16 are higher than the driving voltage, brightness, efficiency, and half-lifespan of the organic light-emitting devices manufactured according to Comparative Examples 1 and 2.

An organic light-emitting device including the organic compound may have a low driving voltage, high efficiency, and long lifespan.

It should be understood that the exemplary embodiments described herein should be considered in a descriptive sense only and not for purposes of limitation. Descriptions of features or aspects within each embodiment should typically be considered as available for other similar features or aspects in other embodiments.

While certain embodiments of the present disclosure have been described with reference to the drawing, it will be understood by those of ordinary skill in the art that various changes in form and details may be made without departing from the spirit and scope of the present disclosure as defined by the following claims, and equivalents thereof.

What is claimed is:

1. An organic compound represented by Formula 1 below:

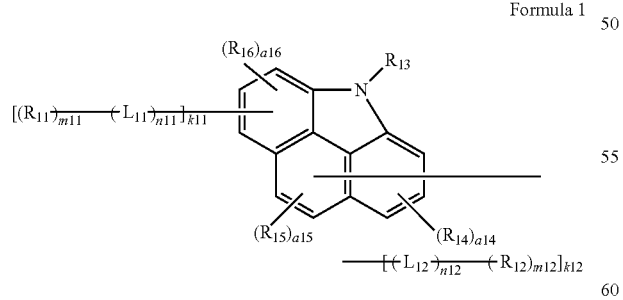

Formula 1 wherein in Formula 1:

$L_{11}$ and $L_{12}$ are each independently selected from:
a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, and a substituted or unsubstituted non-aromatic condensed polycyclic group, wherein:

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, and the substituted non-aromatic condensed polycyclic group is selected from:

a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a C6-C60 arylthio group, a $C_1$-$C_{60}$ heteroaryl group, and a non-aromatic condensed polycyclic group; and a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

n11 and n12 are each independently an integer of 0 to 3;

$R_{11}$ and $R_{12}$ are each independently a substituted or unsubstituted benzimidazole, wherein at least one substituent of the substituted benzimidazole is selected from:
  a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, and —Si($Q_1$)($Q_2$)($Q_3$),
  a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group and a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group,
  a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, and
  a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ heterocycloalkyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, non-aromatic condensed polycyclic group, and —Si($Q_{11}$)($Q_{21}$)($Q_{31}$);

m11 and m12 are each independently an integer of 1 to 3;

k11 and k12 are each independently an integer of 0 to 4, and the sum of k11 and k12 is 1 or more;

$R_{13}$ to $R_{16}$ are each independently selected from:
  a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, and —Si($Q_4$)($Q_5$)($Q_6$);
  a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;
  a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group; and
  a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ haloalkyl group, a $C_2$-$C_{60}$ alkenyl group, a $C_2$-$C_{60}$ alkynyl group, a $C_1$-$C_{60}$ alkoxy group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, and —Si($Q_{41}$)($Q_{51}$)($Q_{61}$),
  wherein $Q_1$ to $Q_6$, $Q_{11}$, $Q_{21}$, $Q_{31}$, $Q_{41}$, $Q_{51}$, and $Q_{61}$ are each independently selected from a $C_1$-$C_{60}$ alkyl group, a $C_6$-$C_{60}$ aryl group, and a $C_1$-$C_{60}$ heteroaryl group;

a14 and a16 are each independently selected from an integer of 0 to 3; and a15 is an integer selected from 0 to 2.

2. The organic compound of claim 1, wherein $L_{11}$ and $L_{12}$ are each independently selected from:
  a phenylene, a pentalenylene, an indenylene, a naphthylene, an azulenylene, a heptalenylene, an indacenylene, an acenaphthylene, a fluorenylene, a spiro-fluorenylene, a benzofluorenylene, a dibenzofluorenylene, phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, a pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzosilolylene; and a phenylene, a pentalenylene, an indenylene, a naphthylene, an azulenylene, a heptalenylene, an indacenylene, an acenaphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, an isobenzothiazolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzoxilolylene, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pycenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a silolyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, a benzosilolyl group, an isobenzothiazolyl group, a benzooxazolyl group, an isobenzooxazolyl group, a triazolyl group, a tetrazole group, an oxadiazolyl group, a triazinyl group, a dibenzofuranyl group, a dibenzothienyl group, a benzocarbazolyl group, a dibenzocarbazolyl group, and a dibenzosilolyl group.

3. The organic compound of claim 1, wherein n11 and n12 are each independently selected from 0 and 1.

4. The organic compound of claim 1, wherein $R_{11}$ and $R_{12}$ are each independently selected from Formulae 2-1 to 2-3 below:

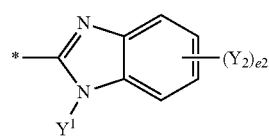

Formula 2-1

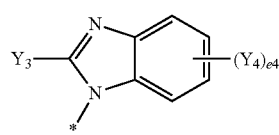

Formula 2-2

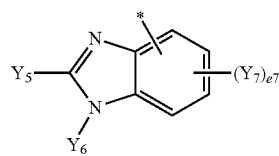

Formula 2-3 wherein in Formulae 2-1 to 2-3, $Y_1$ to $Y_7$ are each independently selected from:

a hydrogen atom, a deuterium atom, a $C_1$-$C_{20}$ alkyl group, a $C_6$-$C_{60}$ aryl group, a $C_1$-$C_{60}$ heteroaryl group, and a non-aromatic condensed polycyclic group, and a $C_6$-$C_{60}$ aryl group, a $C_1$-$C_{60}$ heteroaryl group, and a non-aromatic condensed polycyclic group, each substituted with at least one selected from a deuterium atom, a halogen atom, a cyano group, a nitro group, a $C_6$-$C_{60}$ aryl group, a $C_1$-$C_{60}$ heteroaryl group, a non-aromatic condensed polycyclic group, and —Si($Q_{11}$)($Q_{21}$)($Q_{31}$); and $Q_{11}$, $Q_{21}$, and $Q_{31}$ are each independently a $C_1$-$C_{60}$ alkyl group;

e2 and e4 are each independently an integer of 1 to 4;

e7 is an integer of 1 to 3;

* indicates a binding site to $L_{11}$, $L_{12}$, or benzocarbazole in Formula 1.

5. The organic compound of claim 1, wherein m11 and m12 are each an integer of 1.

6. The organic compound of claim 1, wherein k11 and k12 are each independently an integer selected from 0 and 1, and the sum of k11 and k12 is 1 or more.

7. The organic compound of claim 1, wherein $R_{13}$ is selected from:

a hydrogen atom, a deuterium atom, and a $C_1$-$C_{20}$ alkyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{41}$)($Q_{51}$)($Q_{61}$); and $Q_{41}$, $Q_{51}$, and $Q_{61}$ are each independently a $C_1$-$C_{60}$ alkyl group.

8. The organic compound of claim 1, wherein $R_{14}$ to $R_{16}$ are each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and —Si($Q_4$)($Q_5$)($Q_6$);

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $Q_4$ to $Q_6$ are each independently a $C_1$-$C_{60}$ alkyl group.

9. The organic compound of claim 4, wherein the organic compound is represented by any one of Formulae 1-1 to 1-6 below:

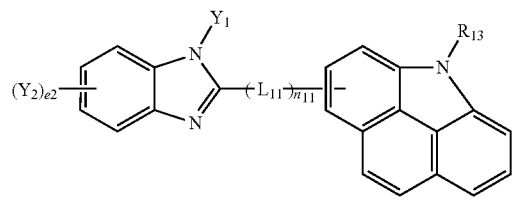

Formula 1-1

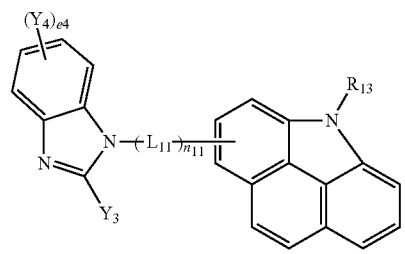

Formula 1-2

Formula 1-3
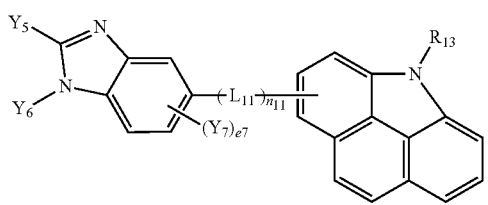
Formula 1-4
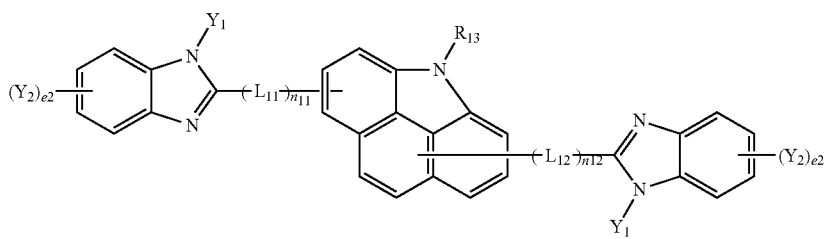
Formula 1-5
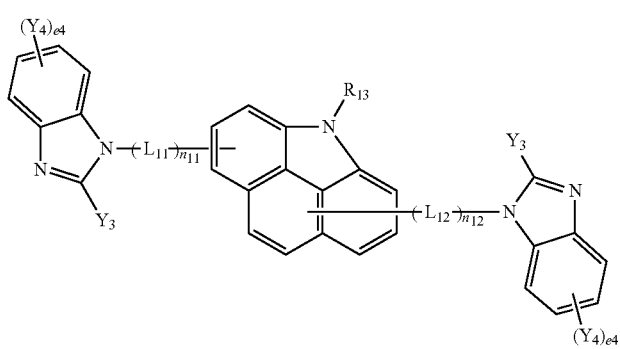
Formula 1-6
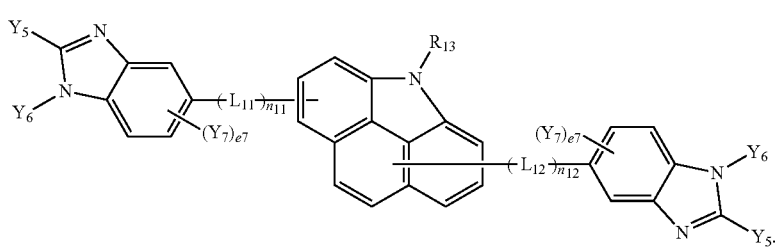
10. The organic compound of claim 9, wherein $L_{11}$ and $L_{12}$ are each independently selected from Formulae 4-1 to 4-25 below:
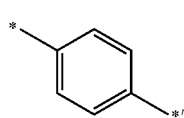
4-1
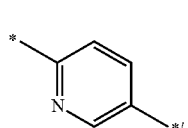
4-2
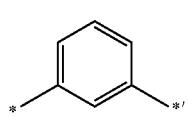
4-3
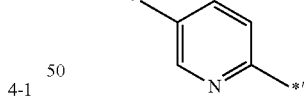
4-4
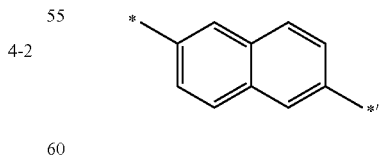
4-5
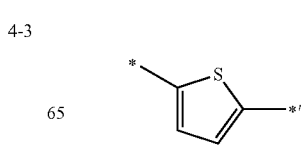
4-6

-continued
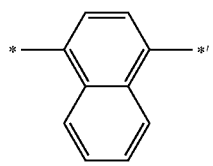
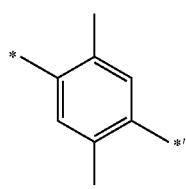
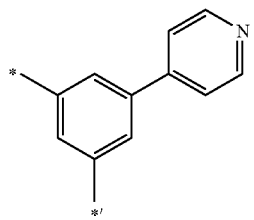
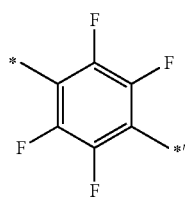
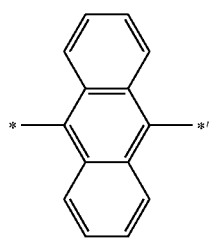
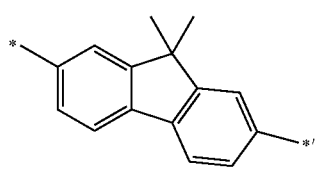
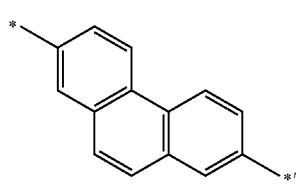
-continued
4-7
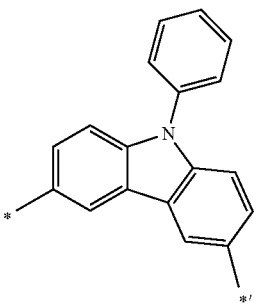
4-8
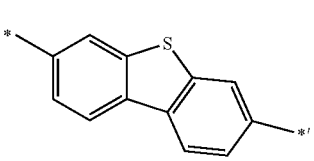
4-9
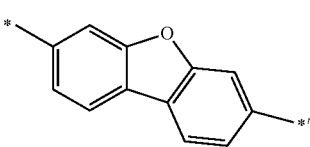
4-10
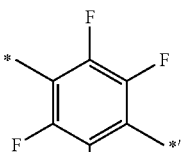
4-11
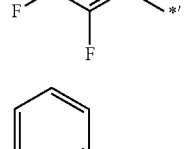
4-12
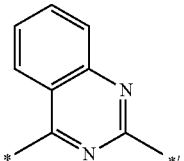
4-13
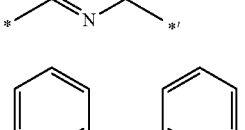
4-14
4-15
4-16
4-17
4-18
4-19
4-20
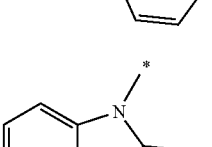
4-21
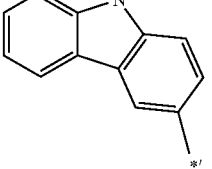

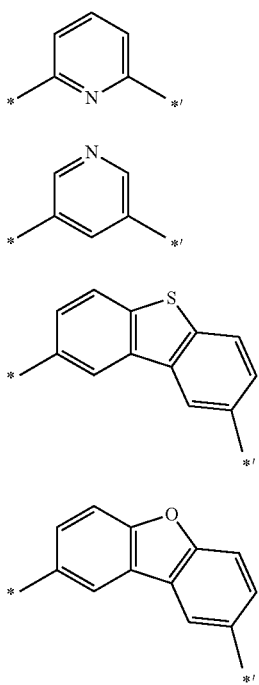

wherein * and *' each indicate a binding site to $R_{11}$, $R_{12}$ or benzocarbazole of Formula 1.

11. The organic compound of claim 9, wherein n11 and n12 are each independently selected from 0 and 1.

12. The organic compound of claim 9, wherein $R_{13}$ is selected from a hydrogen atom, a deuterium atom, a methyl, an ethyl, an n-propyl, an iso-propyl, an n-butyl, a sec-butyl, an iso-butyl, a tert-butyl, and any one of Formulae 5-1 to 5-35 below:

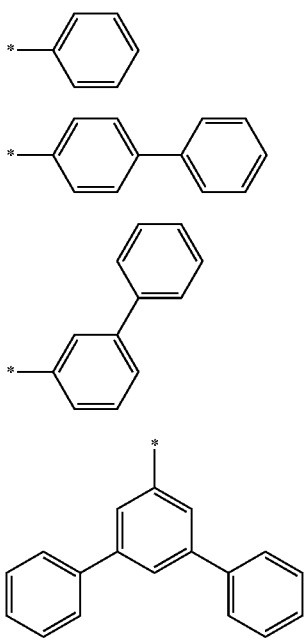

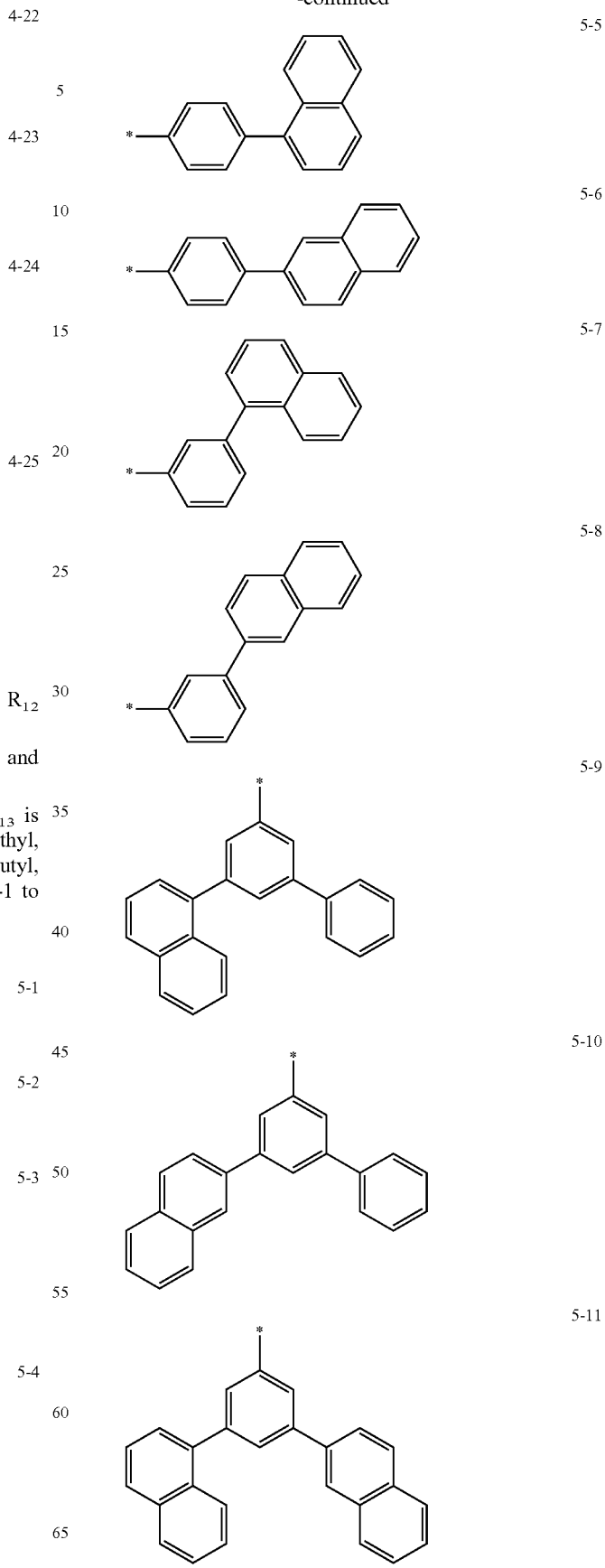

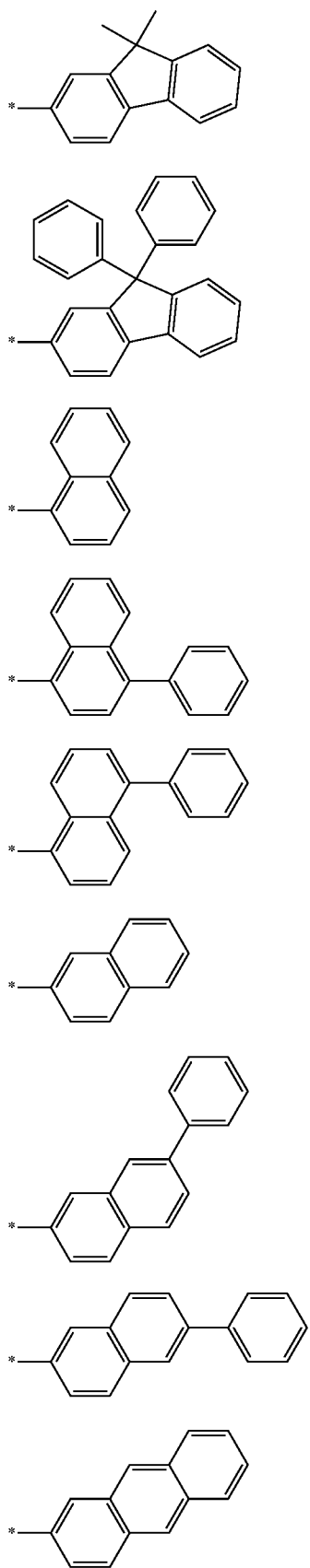

-continued

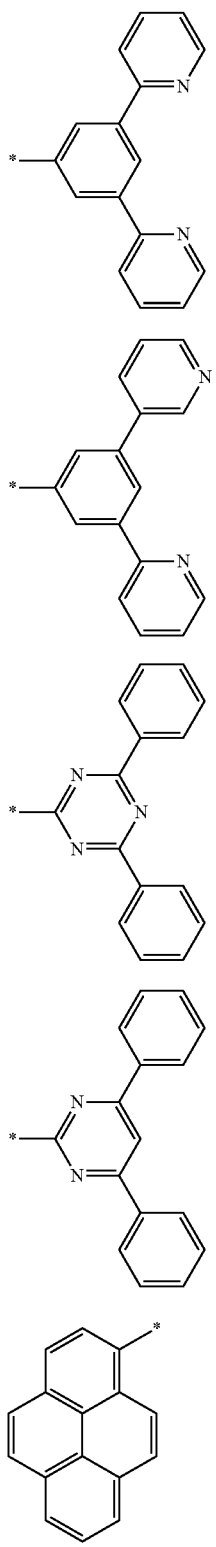

wherein * indicates a binding site to benzocarbazole of Formula 1.

13. The organic compound of claim 1, wherein the organic compound is represented by any one of Formulae 1-7 to 1-10 below:

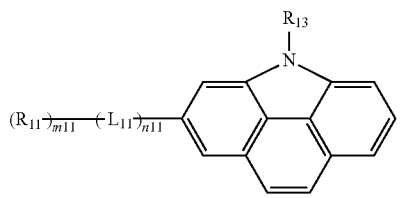

Formula 1-7

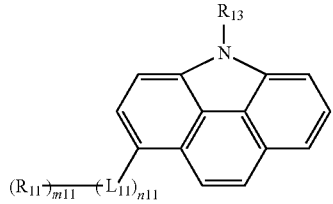

Formula 1-8

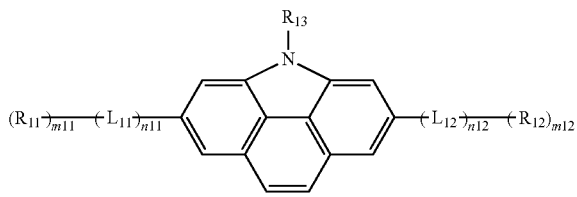

Formula 1-9

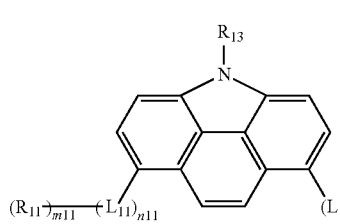

Formula 1-10 wherein in Formulae 1-7 to 1-10,
$L_{11}$, $L_{12}$, n11, n12, $R_{11}$, $R_{12}$, m11, m12, and $R_{13}$ are the same as in claim 1.

14. The organic compound of claim 13, wherein $L_{11}$ and $L_{12}$ are each independently selected from Formulae 4-1 to 4-25 below:

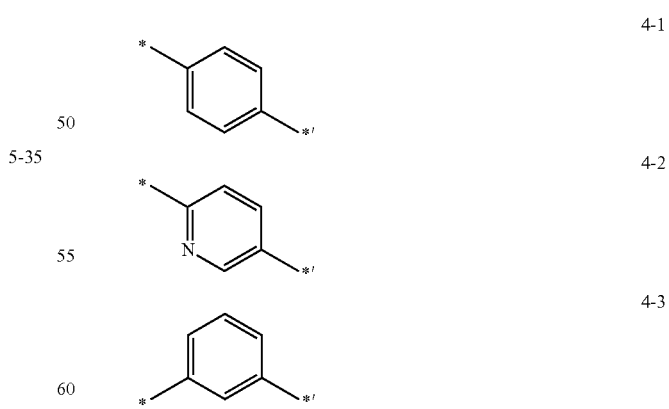

-continued
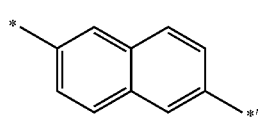
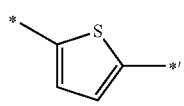
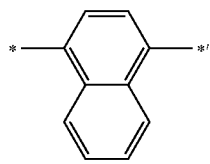
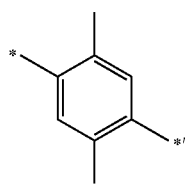
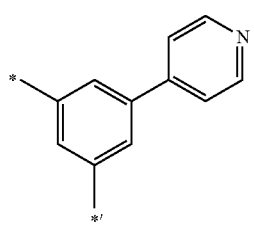
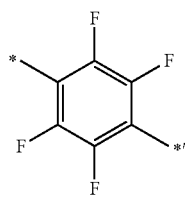
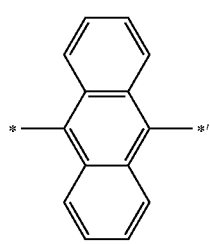
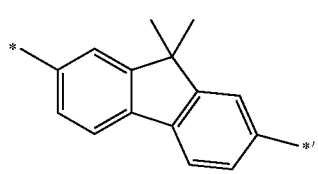
-continued
4-5
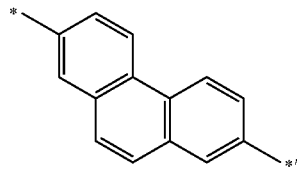
4-6
4-7
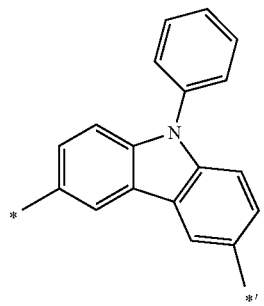
4-8
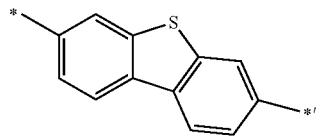
4-9
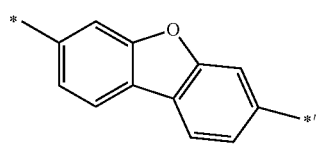
4-10
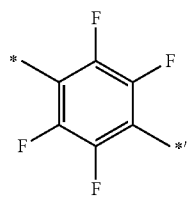
4-11
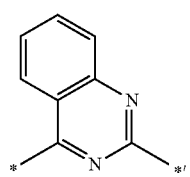
4-12
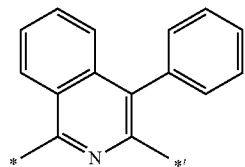
4-13
4-14
4-15
4-16
4-17
4-18
4-19
4-20
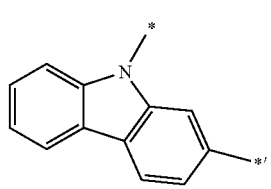

-continued 4-21

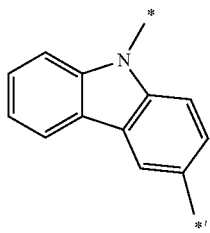

4-22

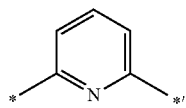

4-23

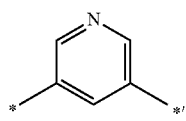

4-24

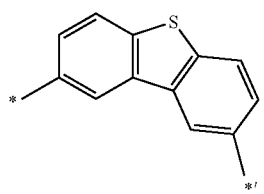

4-25

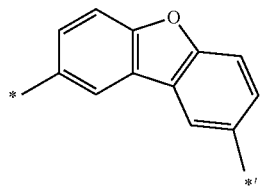

wherein * and *' each indicate a binding site to $R_{11}$, $R_{12}$ or benzocarbazole of Formula 1.

15. The organic compound of claim 13, wherein n11 and n12 are each independently selected from 0 and 1.

16. The organic compound of claim 13, wherein $R_{11}$ and $R_{12}$ are each independently selected from Formulae 2-1 to 2-3 below:

Formula 2-1

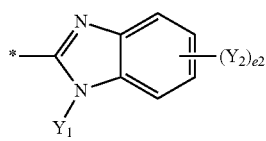

Formula 2-2

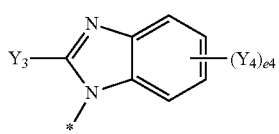

Formula 2-3

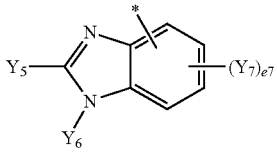

wherein in Formulae 2-1 to 2-3, $Y_1$ to $Y_7$ are each independently selected from:

a hydrogen atom, a deuterium atom, a methyl, an ethyl, an n-propyl, an iso-propyl, an n-butyl, a sec-butyl, an iso-butyl, a tert-butyl, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium atom, a halogen atom, a cyano group, a nitro group, a phenyl group, a naphthyl group, a fluorenyl group, a pyridinyl group, a pyrazinyl group, a pyrimidinyl group, a pyridazinyl group, and $-Si(Q_{11})(Q_{21})(Q_{31})$;

$Q_{11}$, $Q_{21}$, and $Q_{31}$ are each independently selected from a methyl, an ethyl, an n-propyl, an iso-propyl, an n-butyl, a sec-butyl, an iso-butyl, and a tert-butyl;

e2 and e4 are each independently an integer of 1 to 4;

e7 is an integer of 1 to 3;

* indicates a binding site to $L_{11}$, $L_{12}$, or benzocarbazole in Formula 1.

17. The organic compound of claim 13, wherein m11 and m12 are each an integer of 1.

18. The organic compound of claim 13, wherein $R_{13}$ is selected from a hydrogen atom, a deuterium atom, a methyl, a ethyl, an n-propyl, an iso-propyl, an n-butyl, a sec-butyl, an iso-butyl, a tert-butyl, and any one of Formulae 5-1 to 5-35 below:

5-1

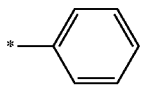

5-2

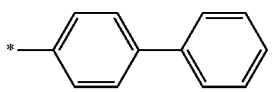

5-3

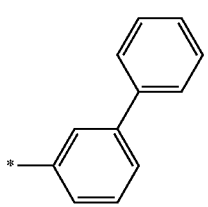

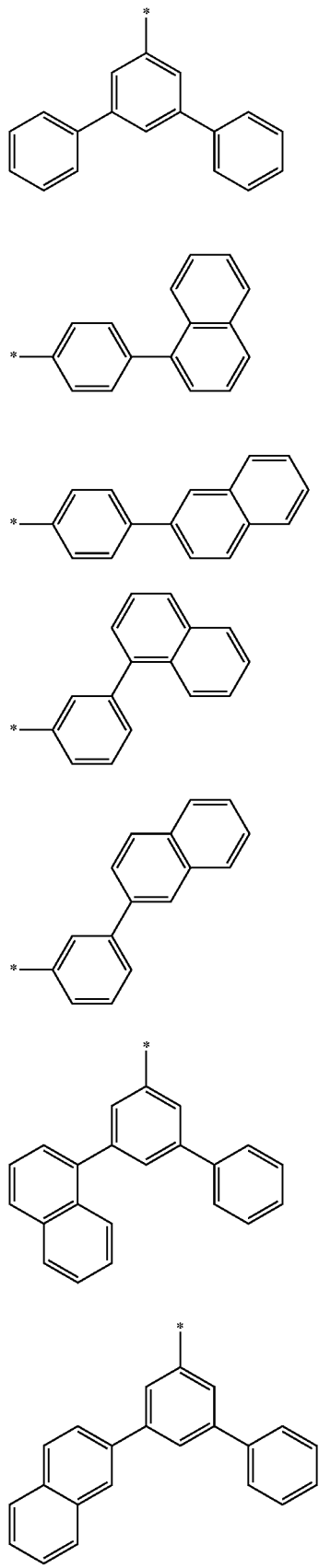
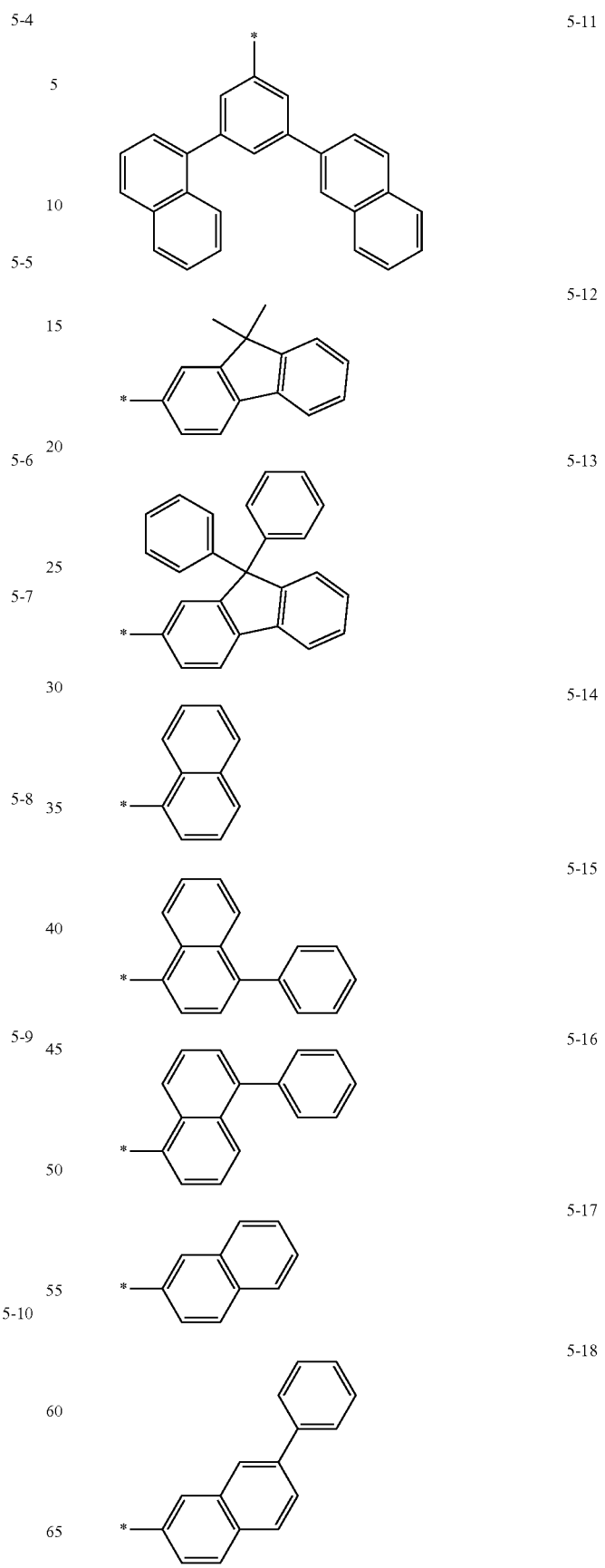

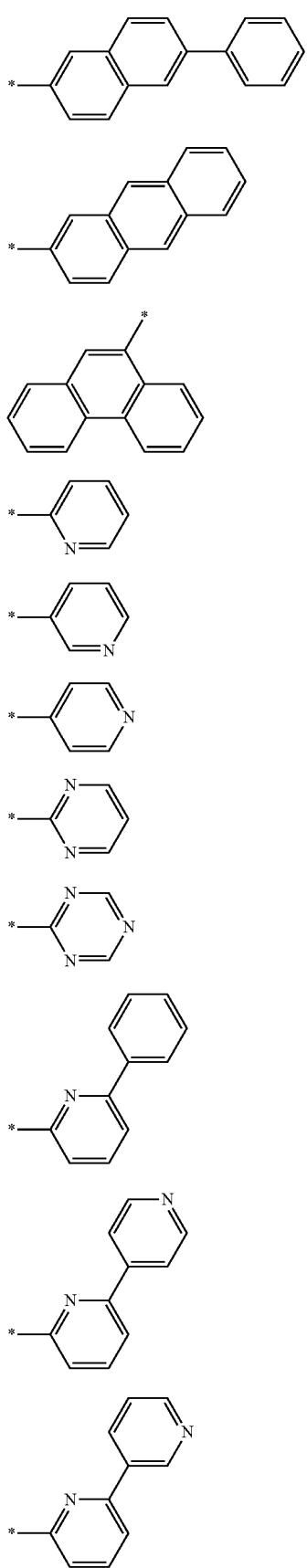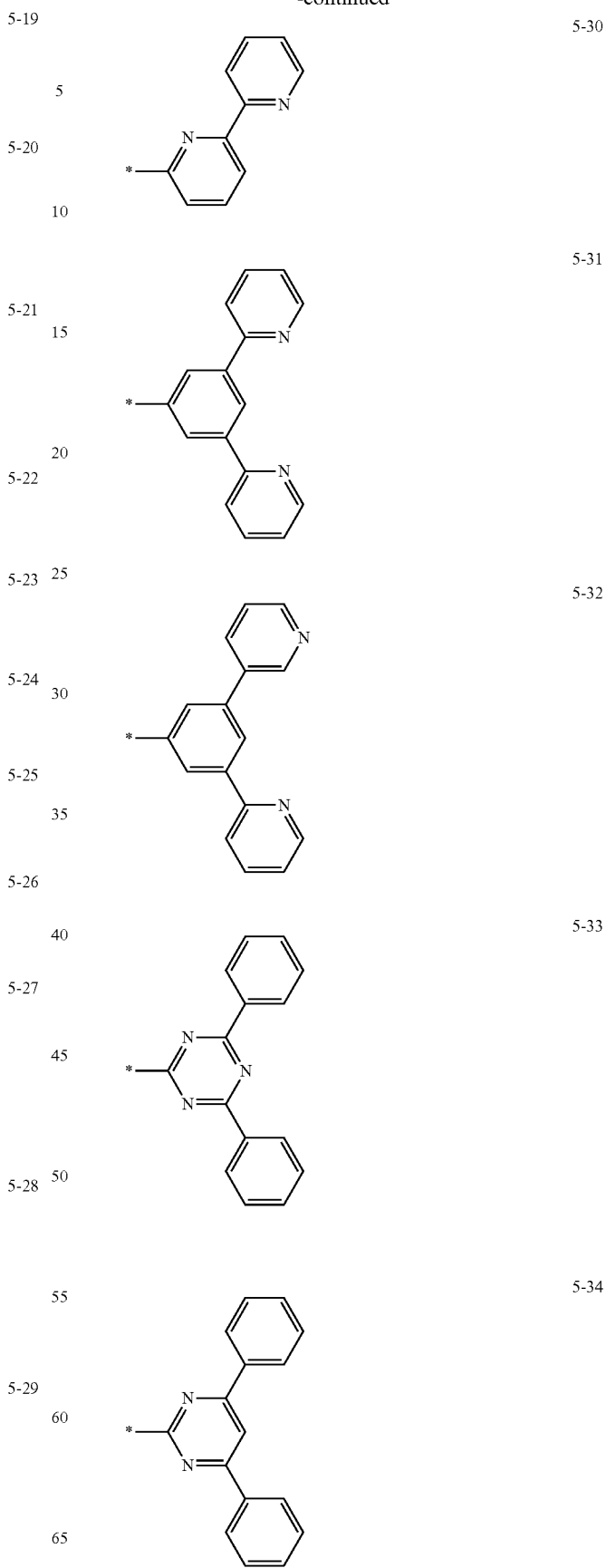

5-35

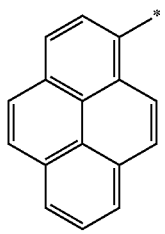

wherein * indicates a binding site to benzocarbazole of Formula 1.

19. An organic light-emitting device comprising: a first electrode; a second electrode facing the first electrode; and an organic layer between the first electrode and the second electrode and comprising an emission layer, wherein the organic layer comprises at least one organic compound of claim 1.

20. The organic light-emitting device of claim 19, wherein the organic layer comprises an electron transport region between the emission layer and the second electrode, and the electron transport region comprises the organic compound.

* * * * *